(12) United States Patent
Vandermeulen

(10) Patent No.: US 10,490,386 B2
(45) Date of Patent: Nov. 26, 2019

(54) METHODS AND SYSTEMS FOR PLASMA DEPOSITION AND TREATMENT

(71) Applicant: Peter F. Vandermeulen, Newburyport, MA (US)

(72) Inventor: Peter F. Vandermeulen, Newburyport, MA (US)

( * ) Notice: Subject to any disclaimer, the term of this patent is extended or adjusted under 35 U.S.C. 154(b) by 0 days.

(21) Appl. No.: 15/969,183

(22) Filed: May 2, 2018

(65) Prior Publication Data

US 2018/0374670 A1    Dec. 27, 2018

Related U.S. Application Data

(60) Provisional application No. 62/525,463, filed on Jun. 27, 2017.

(51) Int. Cl.
| | | |
|---|---|---|
| *H01J 37/14* | (2006.01) | |
| *H05H 1/46* | (2006.01) | |
| *H01J 37/147* | (2006.01) | |
| *H01J 37/05* | (2006.01) | |
| *H01J 37/317* | (2006.01) | |

(Continued)

(52) U.S. Cl.
CPC .............. *H01J 37/14* (2013.01); *H01J 37/05* (2013.01); *H01J 37/147* (2013.01); *H01J 37/3171* (2013.01); *H01L 31/1804* (2013.01); *H01L 31/206* (2013.01); *H01J 2237/057* (2013.01); *H01J 2237/0817* (2013.01);
(Continued)

(58) Field of Classification Search
CPC .......... H01J 37/14; H01J 37/05; H01J 37/147; H01J 37/3171; H01J 2237/057; H01J 2237/0817; H01J 2237/14; H01J 2237/152; H05H 1/46; H05H 2001/4622; H01L 31/206

USPC ......... 250/423 R, 424, 492.1, 492.2, 492.21, 250/492.23, 492.3
See application file for complete search history.

(56) References Cited

U.S. PATENT DOCUMENTS

| | | | |
|---|---|---|---|
| 4,185,213 A | 1/1980 | Scannell | |
| 4,268,801 A | 5/1981 | Stappaerts | |

(Continued)

FOREIGN PATENT DOCUMENTS

| | | |
|---|---|---|
| KR | 2005-0117576 A | 12/2005 |
| KR | 2008-0030100 A | 4/2008 |
| WO | 2008/018159 A1 | 2/2008 |

OTHER PUBLICATIONS

International Search Report and Written Opinion for International Application No. PCT/US2018/030632 dated Aug. 24, 2018.

(Continued)

*Primary Examiner* — Nicole M Ippolito
(74) *Attorney, Agent, or Firm* — Foley Hoag LLP; Rajesh Vallabh

(57) ABSTRACT

An ion beam treatment or implantation system includes an ion source emitting a plurality of parallel ion beams having a given spacing. A first lens magnet having a non-uniform magnetic field receives the plurality of ion beams from the ion source and focuses the plurality of ion beams toward a common point. The system may optionally include a second lens magnet having a non-uniform magnetic field receiving the ion beams focused by the first lens magnet and redirecting the ion beams such that they have a parallel arrangement having a closer spacing than said given spacing in a direction toward a target substrate.

50 Claims, 50 Drawing Sheets

(51) Int. Cl.
*H01L 31/20* (2006.01)
*H01L 31/18* (2006.01)

(52) U.S. Cl.
CPC ..... *H01J 2237/14* (2013.01); *H01J 2237/152* (2013.01); *H05H 1/46* (2013.01); *H05H 2001/4622* (2013.01)

(56) References Cited

U.S. PATENT DOCUMENTS

| | | | |
|---|---|---|---|
| 4,450,031 | A | 5/1984 | Ono et al. |
| 4,512,868 | A | 4/1985 | Fujimura et al. |
| 5,311,103 | A | 5/1994 | Asmussen et al. |
| 5,389,153 | A | 2/1995 | Paranjpe et al. |
| 5,538,699 | A | 7/1996 | Suzuki |
| 5,702,530 | A | 12/1997 | Shan et al. |
| 5,783,102 | A | 7/1998 | Keller |
| 5,843,236 | A | 12/1998 | Yoshiki et al. |
| 5,868,849 | A | 2/1999 | Nakao |
| 5,945,677 | A | 8/1999 | Leung et al. |
| 6,114,811 | A | 9/2000 | Wu |
| 6,204,606 | B1 | 3/2001 | Spence et al. |
| 6,298,806 | B1 | 10/2001 | Moisan et al. |
| 6,444,105 | B1 | 9/2002 | Lai et al. |
| 6,497,783 | B1 | 12/2002 | Suzuki et al. |
| 6,558,504 | B1 | 5/2003 | Markunas et al. |
| 6,796,268 | B2 | 9/2004 | Ishii |
| 7,305,935 | B1 | 12/2007 | Foster |
| 7,311,796 | B2 | 12/2007 | Goto et al. |
| 7,723,637 | B2 | 5/2010 | Ohmi et al. |
| 8,800,483 | B2 | 8/2014 | Vandermeulen |
| 2003/0066487 | A1 | 4/2003 | Suzuki |
| 2004/0071613 | A1 | 4/2004 | Goto et al. |
| 2005/0257891 | A1 | 11/2005 | Goto et al. |
| 2005/0258380 | A1 | 11/2005 | White et al. |
| 2007/0054064 | A1 | 3/2007 | Ohmi et al. |
| 2007/0193517 | A1 | 8/2007 | Matsuuchi et al. |
| 2008/0017616 | A1 | 1/2008 | Lee et al. |
| 2008/0078954 | A1* | 4/2008 | Vanderberg ............ H01J 37/04 250/492.21 |
| 2008/0149826 | A1* | 6/2008 | Renau ................... H01J 27/026 250/288 |
| 2008/0220558 | A1 | 9/2008 | Zehavi et al. |
| 2009/0029503 | A1 | 1/2009 | Arai et al. |
| 2009/0108198 | A1 | 4/2009 | Satoh et al. |
| 2010/0243879 | A1* | 9/2010 | Huang .................... H01J 37/05 250/281 |
| 2012/0243879 | A1* | 9/2012 | Nashimoto ........ H04B 10/0799 398/140 |
| 2013/0001414 | A1 | 1/2013 | Benveniste et al. |
| 2013/0032574 | A1 | 2/2013 | Liu et al. |
| 2013/0043121 | A1 | 2/2013 | Anders |

OTHER PUBLICATIONS

Geller, "Electron Cyclotron Resonance Ion Sources and ECR Plasmas," ISBN 0-7503-0107-4, 1996.
Heimann, "Plasma Spray Coating," ISBN: 978-3-527-32050-9, 2008.
Markvart, et al., "Solar Cells, Materials, Manufacture and Operation," ISBN 1856174573, 2005.
Nakase, Kiyotaka et al. "Sheet-shaped ECR plasma generation using permanent 1-37 magnets for material processing," Thin Solid Films, Aug. 1, 1996, vol. 281-282, pp. 152-154.
"Photovoltaics Design and Installation Manual," ISBN: 978-0-86571-520-2, 2004.
"Photovoltaic Systems," ISBN 978-0-8269-1287-9, 2007.
Popov, "High Density Plasma Sources, Design, Physics and Performance," ISBN 0-8155-1377-1, 1995.
Wenham, et al., "Applied Photovoltaics," ISBN-10: 1-84407-401-3, 2007.
Kaim, et al., "The Extrion 220 Parallel Scan Magnet," Report No. 195 Semiconductor Equipment, Presented at the 8th International Conference on Ion Implant Technology, Jul. 30-Aug. 3, 1980, Surrey, U.K., pp. 1-5.
Kakoschke, et al., "Trench Sidewall Implantation with a Parallel Scanned Ion Beam," Report No. 195 Semiconductor Equipment Group, Published in IEEE trans. Elec. Dev., Nov. 1989, pp. 1-6.
Vandermeulen, et al., "Energy contamination of P2+ ion beams on the Varian, Extrion 220 medium current implanter," Nuclear Instruments and Methods in Physics Research B55 (1991) pp. 45-48 North Holland.
Vandermeulen, "A System and Applications Overview of Extrion 220 Medium Current Ion Implanter," Apr. 1990, 9 pgs.
Vandermeulen, "Energy Contamination Control in a Medium Current Ion Implanter: First Results of an Experiment to match Electrical and SIMS Measurements on an E500 Medium Current Ion Implanter," Report No. 211 Semiconductor Equipment, Published in Semiconductor World Magazine, Nov. 1991, pp. 1-4.
Vandermeulen, "Energy Contamination Control in Multiple Charged Ion Implantations," Jun. 1992, 4 pgs.
Vandermeulen, "EEN Campargue-Expansi Van Een Seeded Beam Van 90% Helium En 10% Stikstoff," Stageverslag VDF/NO 85-12 (Dec. 1985), 80 pgs.

* cited by examiner

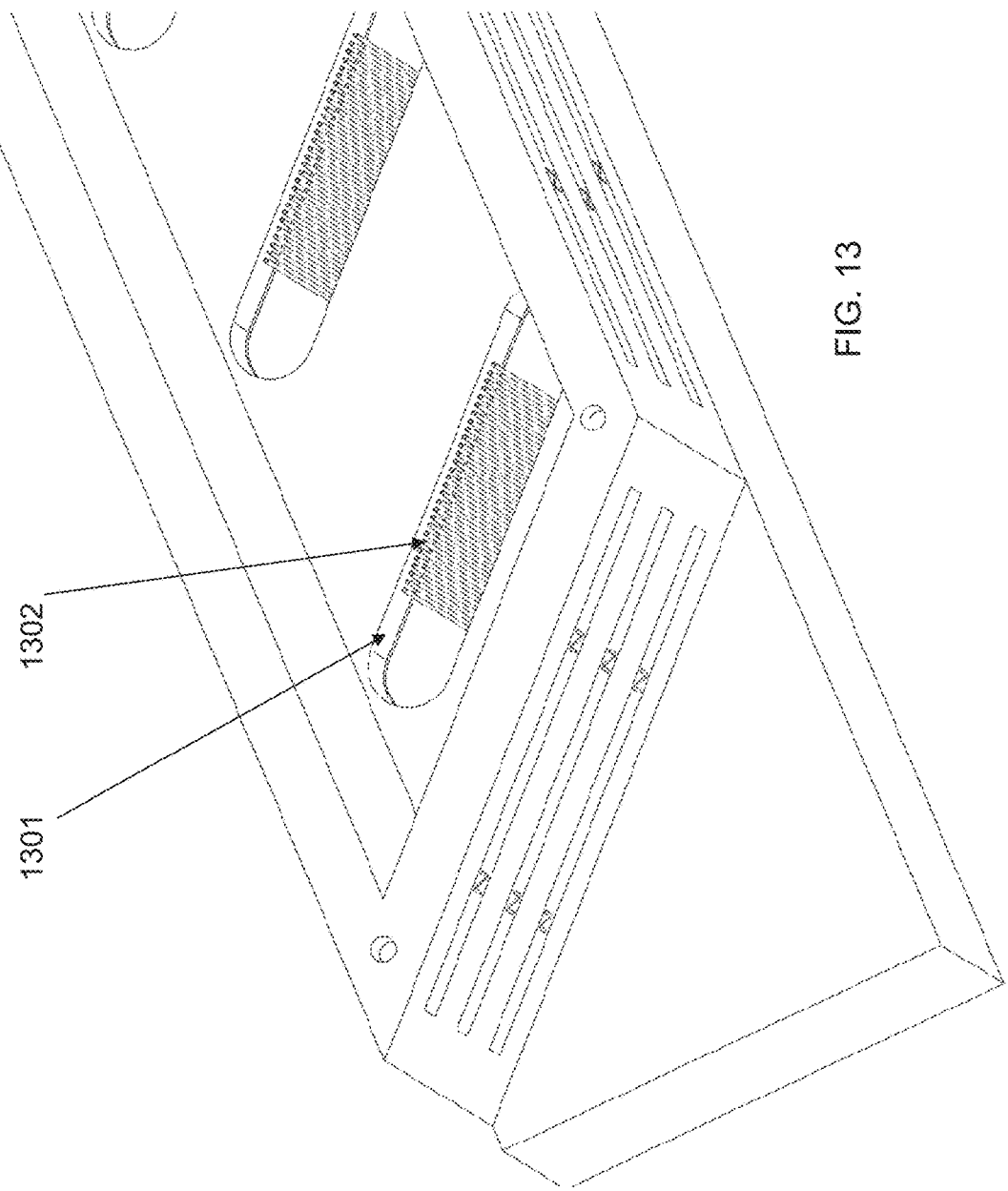

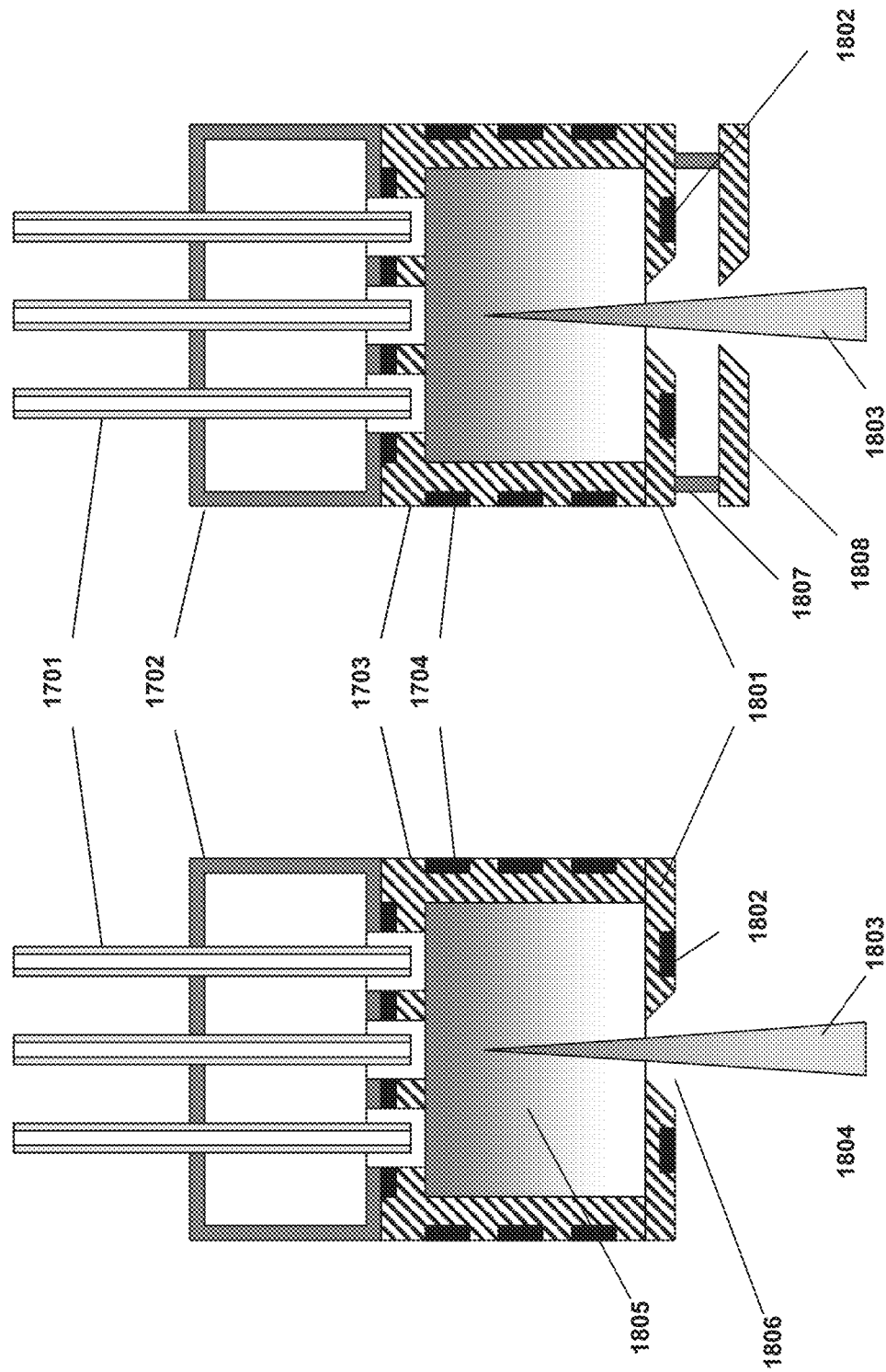

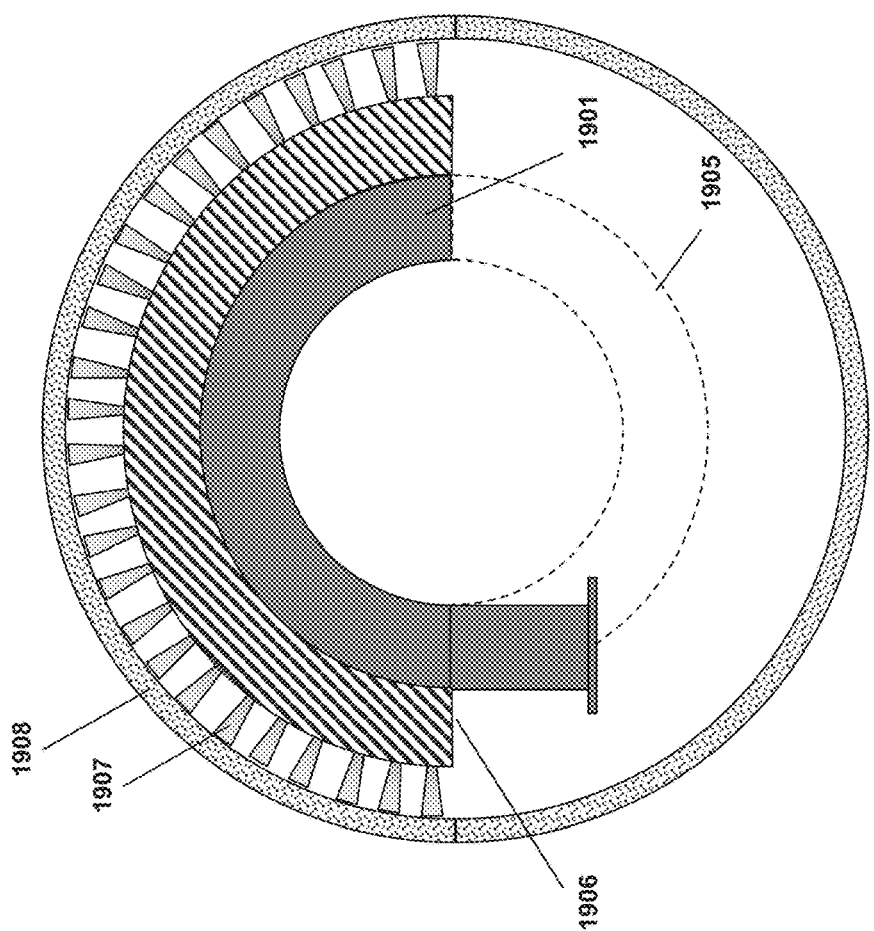
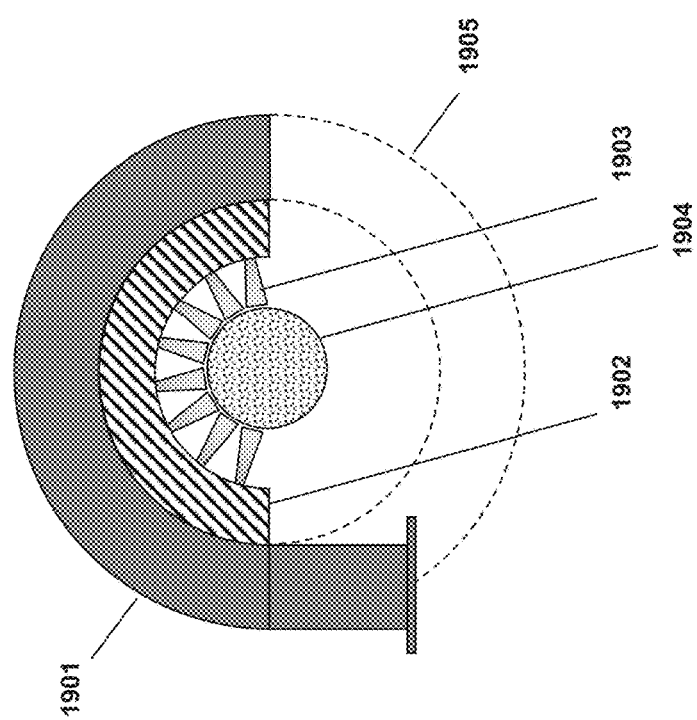
FIG. 19B
FIG. 19A

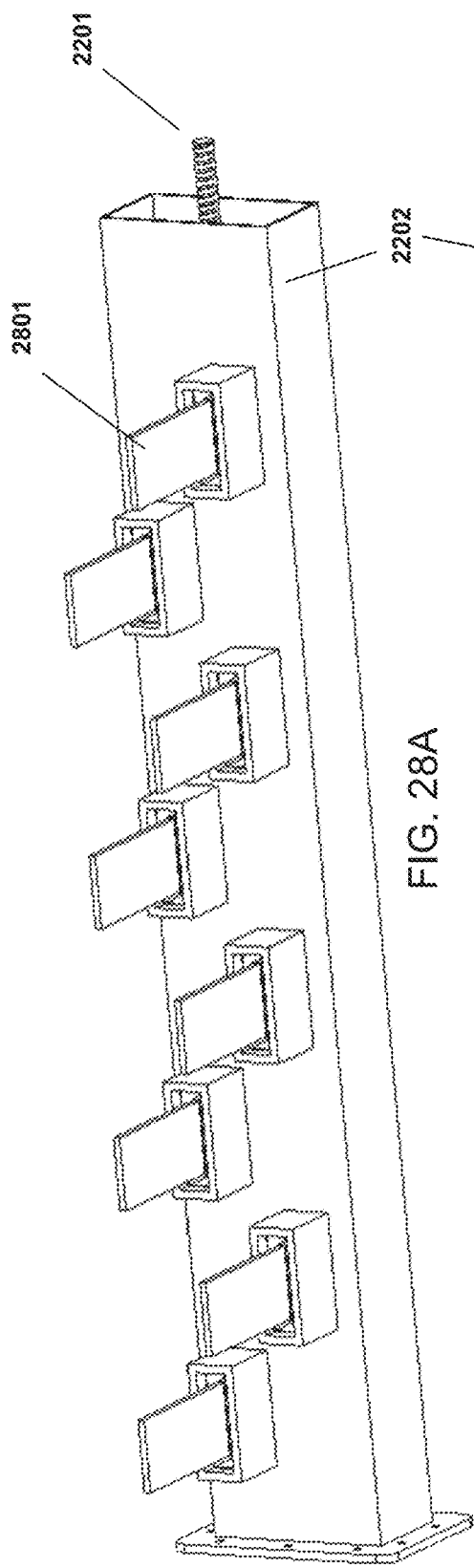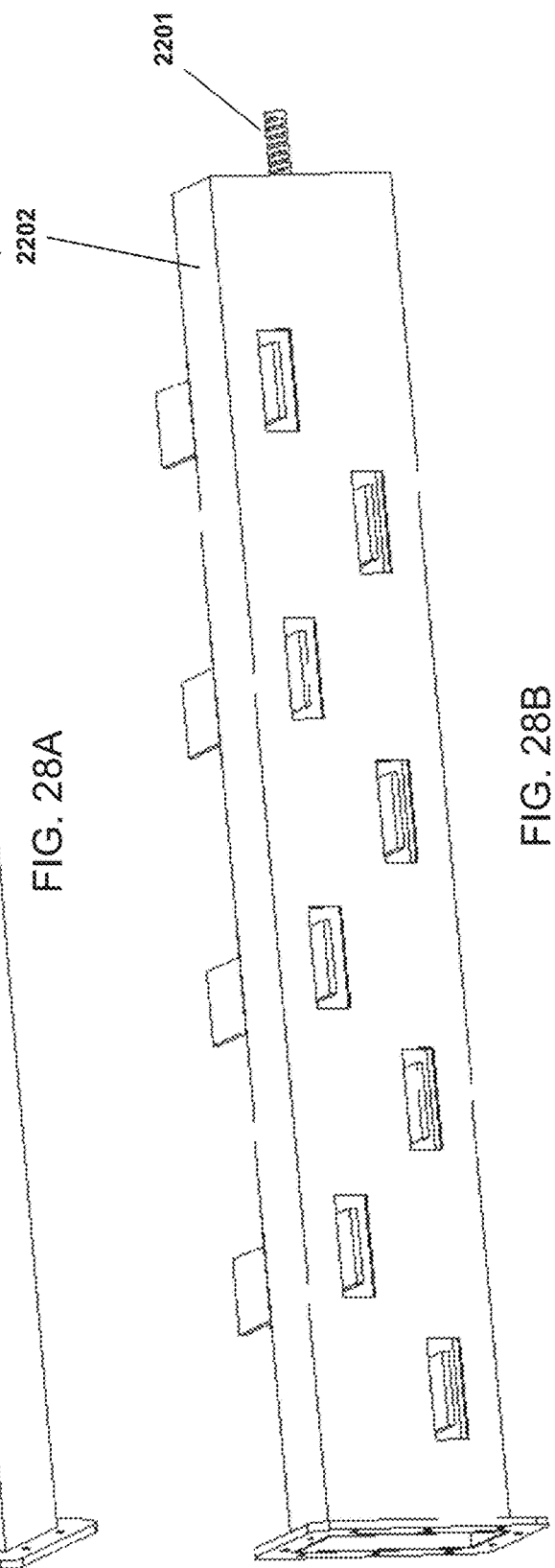

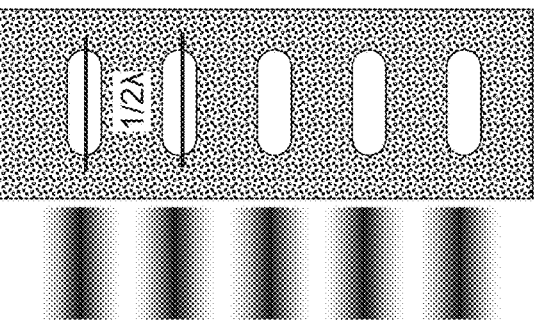
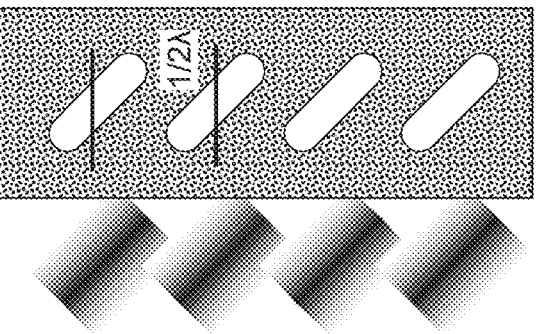
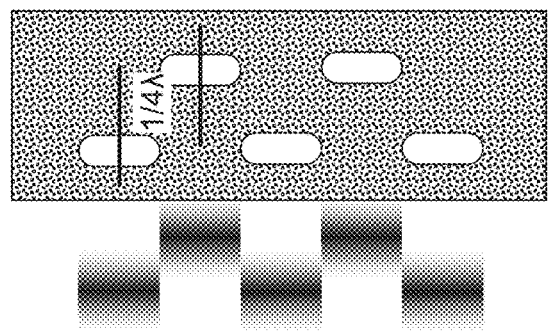
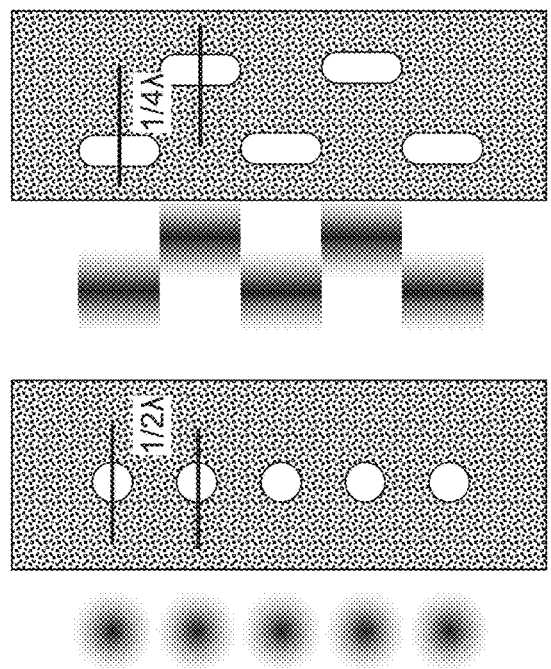
FIG. 42A  FIG. 42B  FIG. 42C  FIG. 42D
BEAM SHAPES AT ION SOURCE
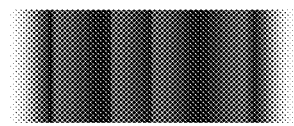
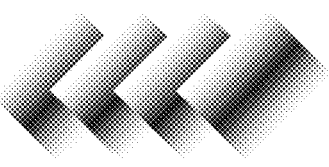
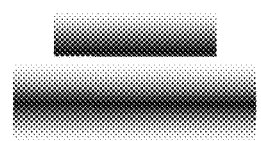
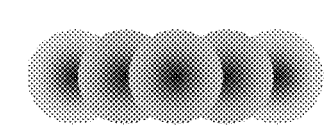
BEAM SHAPES AT SUBSTRATE

METHODS AND SYSTEMS FOR PLASMA DEPOSITION AND TREATMENT

CROSS REFERENCE TO RELATED APPLICATION

This application claims priority from U.S. Provisional Patent Application Ser. No. 62/525,463 filed on Jun. 27, 2017 and entitled Methods And Systems For Plasma Deposition And Treatment, which is hereby incorporated by reference.

BACKGROUND

The present application generally relates to methods and systems for deposition of materials on substrates using plasmas and the treatment of objects using microwave radiation and plasma.

Deposition technologies include physical vapor deposition (PVD), chemical vapor deposition (CVD) (either at atmospheric pressure (APCVD) or reduced pressure (LP-CVD)), electroplating, evaporation, thermal flame spray, and thermal plasma spray. Many of these deposition technologies are used for the manufacture of materials layers such as semiconductors, carbon-nanotubes, industrial coatings, biomedical coatings, and the like. Oftentimes a balance has to be struck between technical concerns such as layer adhesion, contamination from undesirable elements, deposition rates, and uniformity (both on a global and on a microscopic scale), and commercial concerns such as the cost of performing such a deposition (materials costs and the effective use of the materials) as well as the cost of the manufacturing equipment deployed.

Generally, processes that employ a vacuum or reduced pressure environment are subject to higher capital equipment costs and demonstrate lower deposition rates. However, the benefit of operating in a reduced pressure environment is often a reduction of contamination and an increase in uniformity and adhesion effectiveness. Furthermore, some processes may not work at all at higher pressures and therefore require a lower pressure or vacuum level operating regime.

Plasma deposition technologies such as PVD and CVD are commonly deployed in areas such as the manufacturing of semiconductor devices. Several methods for generating plasmas are known in the art. Arc plasmas create a plasma by applying a DC voltage between two elements such as an anode and a cathode. The resulting stream of electrons (arc) is responsible for creating very high temperatures in their path through collisions with other molecules and atoms in the arc discharge region. A common problem with arc discharge plasmas is that they consume their electrodes over time. In other words, the arc sputters material from the electrodes, which is subsequently co-deposited or entered into the plasma area. In several processes such as in the deposition of materials that are required to remain very pure, such co-deposition can be detrimental, even at very low contamination levels. As an example, even small amounts of co-deposited metals can be detrimental to the functioning of semiconductors and solar photovoltaic materials.

Inductively Coupled Plasma (ICP) sources typically employ an electrical coil powered by radio frequency signal (around 1-13 MHz is common range of frequencies). The RF signal generates a rapidly changing electromagnetic field. This field can be coupled into a chamber to produce a plasma.

Electron Cyclotron Resonance (ECR) plasma sources are commonly used to support deposition chemistries for various materials. ECR sources combine a microwave source (typically operated between 1 and 10 GHz) and a permanent- or electro-magnetic field, in which the microwave source supplies power to the plasma discharge region and where the magnetic field is responsible for the creation of helical paths for charged particles such as electrons and ions. Thus, because of the helical paths, the collision probability between charged particles and neutral particles is significantly increased, resulting in much longer residence times for the charged particles in the plasma region and an enhanced interaction time between the charged particles and other particles in the plasma. This enhanced residence time allows the charged particles (particularly the electrons) to create additional ionized particles in the plasma, resulting in much higher charge concentrations in the plasma region. These higher charge concentrations result in higher extraction rates of the desired particles. This is particularly useful in processes such as ion assisted deposition or in ion doping processes. Furthermore, the longer residence time of the electrons allows for an overall increase of the plasma temperature.

ECR plasmas are very common in the manufacturing of semiconductor devices. Most ECR plasma systems require vacuum levels well below atmosphere to be able to operate, and thus require expensive equipment. However, ECR phenomena have been observed at elevated pressures as well.

In general, plasmas exhibit some unique characteristics such as the formation of (meta) stable surface waves in which plasma waves can be emitted over long distances away from their source of origin. Plasma sources that deliberately enhance the formation of waves are Surface Wave Plasma sources (SWPs). They are also referred to as "Surfatrons." Surfatrons are plasma sources that are deliberately designed to create enhanced plasma wave operations.

Flame Spray Plasmas (FSPs) create a plasma flame, which is created by the chemical reaction of one or more gasses (usually the combination of a carrier gas such as methane and a reaction gas such as air or pure oxygen) while coming out of an instrument such as a torch. The material that is to be deposited is introduced into the flame, typically in powder or sometimes in solid form, whereby rapid melting of the material occurs. The molten material/plasma stream is then aimed at the substrate or surface to be coated. The plasma temperature of a FSP system is typically in the range of 2,000-5,000° C.

Thermal Spray Plasmas (TSPs) do not rely on a chemical reaction, but rather rely on physical processes to create a plasma and a molten particle stream. A typical TSP will use either a DC plasma arc (also called a DC Plasmatron) or a radio-frequency induced plasma (also called an inductively coupled Plasmatron). In either case, a plasma is created and the to-be-coated material is introduced into the plasma stream, where it is rapidly melted. The plasma/material stream is then aimed at a substrate where the material deposits and re-solidifies. The plasma temperature of a TSP system is typically in the range of 5,000-12,000° C.

The above mentioned processes for plasma generation such Inductively Coupled Plasmas, ECR plasmas, Flame Spray Plasmas, and Thermal Spray Plasmas are all commonly known in the art and have all been used or attempted to be used for the deposition of materials used in semiconductor manufacturing as well as for the deposition of photovoltaic active layers and other areas where deposition of materials is desired.

Common problems with the application of these plasmas to materials and substrates involve the co-deposition of undesirable materials that are introduced through either the erosion of the chamber that contains the plasma, or by the use of starting materials that already contain such contamination. The very high temperature of plasmas essentially evaporates some material of the chamber and electrodes surrounding it. Strategies such as the use of shielding or liners, or the use of chamber materials that are not contaminating when co-deposited are a common practice. One disadvantage of shielding and liners is that they too eventually get coated with the to-be-deposited materials or with other residual process effluents. Such depositions ultimately may result in the materials flaking off and falling on the substrate that is in process. These unintended particles or flakes are generally very destructive to the semiconductor devices in process, and great care is typically taking to minimize any risk of particles falling on the substrate. Oftentimes monitoring and periodic cleaning processes are employed to ensure that the flaking of materials is very limited or prevented as much as possible.

Low pressure plasmas have a tendency to also have low deposition rates. Low deposition rates can mean long process times, which means low equipment throughput. The cost of vacuum equipment is typically very high and the combination of long deposition times and high equipment cost is usually not desirable. However, vacuum based processes typically exhibit good adhesion to the substrate because of the absence or lowering of surface contamination (water molecules are a primary culprit in poor adhesion). Furthermore, vacuum chambers typically allow for the creation of stable, large area plasmas which allow for good uniformity across a substrate. Uniformity of the deposited layer is important because the performance of the layer is oftentimes critically dependent on the layer thickness. Uniformities where the layer thickness varies less than a few percent of the overall layer thickness across the substrate are often the goal. Various strategies have been employed to ensure layer uniformity, oftentimes involving moving either the deposition source or the substrate in a pattern across a target area. Other strategies involve the design of the source and gas injection system in such a way that diffusion of the deposition occurs over a large, uniform area.

BRIEF SUMMARY

In accordance with one or more embodiments of the invention, methods and systems are provided for material deposition using a plasma for the creation of multilayer structures for various applications, including photovoltaic applications and the manufacturing and implementation of such layers into photovoltaic panels and integrated into building energy management systems. While the methods and systems can be used for the deposition of semiconductor materials such as used in semiconductor manufacturing or in the manufacturing of photovoltaic panels, it should be clearly understood that these methods and systems can be used in all manner of deposition technologies, including but not limited to the deposition of materials for catalytic converters, thin film batteries, film based capacitors, proton-exchange membranes, films using bone material for the preparation of implants into the human body, coatings for increasing the hardness or wear resistance of components such as turbine blades or drill bits, and films for the coating of the interior or exterior of pipes and the like. Furthermore, the methods and systems described herein can be used for the coating and curing of layers such as the curing of plastics and inks onto paper or the adhesion of metal to plastics as well as for the creation of multilayer structures used for the manufacturing of quantum well devices, superconducting layers and light emitting diodes. In addition, many applications exist for the methods and system described herein for the sterilization and/or heating of surfaces such as needed for many biomedical applications. Also described herein are methods and systems used for the creation of microwave patterns such as used in the detection of objects (RAdio Detection And Ranging or RADAR). Furthermore, the methods and systems described herein can be applied to plasma propulsion systems such as used in space vehicles.

In no way is the description of the applications of the present invention intended to limit the invention to these applications. In general, substantially any process that uses microwaves for the deposition of materials can benefit from the present invention.

In accordance with one or more embodiments, methods and systems are provided wherein a waveguide receives microwaves from a source and transmits these microwaves through slots in the side of the waveguide that are sufficiently large to allow for the passage of the microwaves in a plane primarily perpendicular to the primary axis of the waveguide into a plasma chamber. In some embodiments, the waveguide has slots on one or more of its sides. In some embodiments, these slots are cut at an angle to the primary axis of the waveguide. In some embodiments, the angle between the primary axis of the waveguide and the main axis of the slots can range between 0 and 90 degrees. In some embodiments, the angle is cut at 45 degrees.

In accordance with one or more embodiments, methods and systems are provided wherein the waveguide is penetrated on a side opposite the slots by one or more pipes or tubes. In some embodiments, such tubes are constructed from metals or ceramics suitable for operation at elevated temperatures. In some embodiments, such pipes are used to transport materials across the microwave tube into the slots that lead to a plasma chamber. In other embodiments, each of the pipes contains different materials or combinations of materials.

In accordance with one or more embodiments, methods and systems are provided wherein the plasma chamber is equipped with permanent or electromagnets in order to allow for the creation of an Electron Cyclotron Resonance (ECR) effect. In some embodiments, the magnets have orientations suitable for the creation of high magnetic fields along the wall of the chamber and a substantially low magnetic field along the primary axis of the plasma chamber. In some embodiments, the magnets are permanent magnets. In some embodiments, the magnets are arranged in a logical pattern in between the microwave slots. In some embodiments, the magnets are arranged along an axis primarily parallel to the main axis of the plasma chamber. In some embodiments, the magnets are arranged at an angle to the main axis of the plasma chamber. In some embodiments, the magnets are arranged at an angle of 45 degrees to the main axis of the microwave chamber. In some embodiments, the magnets are mounted in cavities in the walls of the ECR chamber to keep them from being exposed to the plasma in the chamber. In some embodiments, the short walls of the ECR chamber are created to be primarily parallel to the microwave slots.

In accordance with one or more embodiments, methods and systems are provided wherein a waveguide receives microwave radiation from a source and wherein the waveguide has slots cut into one or more of its sides to allow the microwave radiation to enter an ECR plasma chamber and wherein there are pipes or tubes on the opposite side of the microwave slots to allow for the introduction of materials such as gasses, powders, liquids, solids or any combination of these. In some embodiments, the materials are mixes of materials. In some embodiments, the materials are powders that are coated with other materials so that the core of the powder has a lower melting temperature than the coating and so that the internal material melts away while in the plasma discharge region and thereby leaves a hollow shell that can be deposited on the substrate. In some embodiments, such pipes can be individually controlled as to how much material to introduce into such a plasma chamber and as to at what time. In some embodiments, the material is provided through the pipes in a pulsed fashion. In some embodiments, such material pulses allow for the very rapid deposition of alternating materials similar to a process known as "Atomic Layer Deposition" or ALD. In some embodiments, the pipes contain physical features such as tapered openings or bends that allow for directional flows of the materials into the plasma chamber. In some embodiments, the materials directed into the plasma chamber are heated by the ECR plasma and partially or fully melted or even evaporated. In some embodiments, such melted or evaporated materials are directed to a surface where they are deposited to form a layer. In yet another embodiment, the pipes are very small and emit very narrow streams of materials which are used to create individual lines of the material onto the substrate being treated. In some embodiments, individual pipes are independently controlled such as is common in inkjet printer technology.

In accordance with one or more embodiments, methods and systems are provided wherein a waveguide receives microwave radiation from a source and wherein the waveguide has slots cut into one or more of its sides to allow the microwave radiation to enter an ECR plasma chamber and wherein there are pipes or tubes on the opposite side of the microwave slots to allow for the introduction of materials such as gasses, powders, liquids, solids or any combination of these and wherein the plasma chamber is outfitted by a set up magnets to create an ECR effect. Furthermore, methods and systems are provided wherein the ECR chamber is enclosed by a cover that allows for a more complete containment of the ECR plasma such that the plasma can be operated at a pressure that is different from the environment around the chamber. In some embodiments, the cover contains slots predominantly parallel and coincident to the microwave slots. In some embodiments, the space between the slots contains additional magnets. In some embodiments, a secondary slot or multiple sets of slots are provided that can be held at an electrical voltage that is substantially different from the plasma chamber's voltage. In some embodiments, such secondary slots are used to extract ions or electrons or other charged particles from the ECR plasma chamber. In further embodiments, such charged particles are used to implant into or treat surfaces of a substrate.

In accordance with one or more embodiments, methods and systems are provided wherein a waveguide receives microwave radiation from a source and wherein the waveguide has slots cut into one or more of its side to allow the microwave radiation to enter an ECR plasma chamber and wherein there are pipes or tubes on the opposite side of the microwave slots to allow for the introduction of materials such as gasses, powders, liquids, solids or any combination of these and wherein the plasma chamber is outfitted by a set up magnets to create an ECR effect. In some embodiments, the waveguide and plasma chamber are shaped in a bend to conform to the surface of the object to be coated such as a cylinder or such as a pipe. The waveguides and/or plasma chambers can be constructed to assume many different shapes and configurations so as to effectively coat a non-planar surface. In some embodiments, the waveguide is circular in shape. In yet another embodiment, the waveguide is helical in shape. In a further embodiment, the waveguide is shaped to direct microwaves to a part of a human anatomy, wherein one advantage is that the microwave guide may provide a focal point inside the human body where as a result, the concentration of microwaves is much higher than at any point on the surface of the body. In another embodiment, the microwave guide is shaped to concentrate microwave radiation in a single point or along a single line so that the local microwave power is substantially higher than the power emitted from the individual slots.

In accordance with one or more embodiments, methods and systems are provided wherein a waveguide receives microwave radiation from a source and wherein the waveguide has slots cut into one or more of its sides to allow the microwave radiation to exit the waveguide through appropriately sized slots. In some embodiments, the exit slots are generally evenly spaced along one or more sides of the waveguide, whereby the spacing of the slots is designed to be approximately ¼ of the wavelength of the microwaves in the waveguide. In some embodiments, the waveguide is terminated by a plunger that is moveably mounted at the end of the waveguide. Such a plunger effectively allows the end of the waveguide to be tuned so that the power of the microwave radiation exiting the slots can be optimized. In some embodiments, such a waveguide is used for to emit radiation for the purpose of range finding (RADAR).

In accordance with one or more embodiments, methods and systems are provided wherein a waveguide receives microwave radiation from a source and wherein the waveguide has primary slots cut into one of its sides to allow the microwave radiation to exit the waveguide through appropriately sized slots and wherein the waveguide is terminated by a moveable first plunger, and wherein furthermore additional secondary slots are cut approximately equal in size to the first set of slots but located in the opposite wall of the waveguide. In some embodiments, such secondary slots are fitted with a secondary set of plungers called "ejectors." In some embodiments, such secondary sets of ejectors are used to create an amplification of the emitted radiation through the primary slots, resulting in a significant increase of emitted microwave power and an increase in the narrowness of the emitted microwaves beams. In some embodiments, such secondary plungers are used to optimally tune the emittance of each individual slot. In further embodiments, such secondary plungers are used to create a second standing microwave exiting the waveguide's primary openings. In some embodiments, the primary slots and the secondary plungers are used to emit radiation into a plasma chamber. In a further embodiment, such emitted radiation is used to create a surface wave plasma in the plasma chamber. In further embodiments, the emittance of surface wave plasma is used to impart momentum on a space vehicle. In yet another embodiment, the surface wave plasma is combined with a magnetic field to create both a surface wave plasma as well as an ECR plasma in the plasma chamber region.

In accordance with one or more embodiments, methods and systems are provided wherein a waveguide receives microwave radiation from a source and wherein the waveguide has primary slots cut into one of its sides to allow the microwave radiation to exit the waveguide through appropriately sized slots. In some embodiments, multiple waveguides and sources are arranged in a pattern. In some embodiments, a pattern is designed in such a way that each microwave guide's exit slots face a common area. In some embodiments, such a pattern is a target object.

In accordance with one or more embodiments, methods and systems are provided wherein a waveguide receives microwave radiation from a source and wherein the waveguide has primary slots cut into one of its sides to allow the microwave radiation to exit the waveguide through appropriately sized slots and wherein the waveguide is terminated by a moveable first plunger, and wherein furthermore additional secondary slots are cut approximately equal in size to the first set of slots but located in the opposite wall of the waveguide and wherein such secondary plungers are made hollow to allow for the passage of materials through the body of the plunger into the primary exit slots of the waveguide. In some embodiments, such hollow secondary plungers are used to deliver materials to a plasma chamber approximately connected to the primary exit slots of the wave guide. In some embodiments, such materials are delivered to an ECR plasma chamber which uses magnetic fields to create plasma conditions. In yet another embodiment the plasma chamber contains additional covers and extraction slots to extract specific charged particles from the plasma in the plasma chamber. In another embodiment, such a secondary plunger and the primary slots in the waveguide cooperate together to create a surface wave plasma and the materials moving through the secondary plunger is directly fed into the surface wave plasma. In some embodiments, the covers and extraction slots are circular and arranged in a single line. In some embodiments, the extraction cover and slots are oblong and oriented in a direction parallel to the main axis of the microwave chamber. In some embodiments, the oblong slots are arranged on alternating sides of the main axis of the microwave chamber. In some embodiments, the oblong extraction slots are oriented in a direction perpendicular to the main axis of the microwave chamber. In some embodiments, the oblong extraction slots are oriented at an angle to the main axis of the microwave chamber. In some embodiments, such extracted charged particles are directed towards a deflector that allows one to select which charged particles are transmitted. In some embodiments, such a deflector is an electrostatic deflector using a voltage difference between two plates to create a different path for different charged particles. In some embodiments, the deflector is a magnetic deflector using a magnetic field between two poles to create a different path for different charged particles. In some embodiments, such extracted charged particles are directed towards a magnetic lens magnet wherein the multiple beams from the multiple secondary plungers are directed towards a single point resulting in the multiple beams getting closer together in space. In some embodiments, the lens magnet has a non-uniform pole gap. In some embodiments, the lens magnet has a non-uniform pole length. In some embodiments, the first lens magnet is subsequently followed by a second lens magnet that re-bends the multiple charged particle beams towards a target substrate. In some embodiments, the second lens magnet bends the charged particle beams in the opposite direction of the first lens magnet. In some embodiments, the second lens magnet functions as a mass analyzing magnet thereby separating charged particles with different energy to mass ratios.

In accordance with one or more embodiments, methods and systems are provided wherein multiple waveguides receive microwave radiation from one or more microwave sources and wherein such waveguides contain primary slots for the passage of microwave radiation into plasma chambers and wherein the plasma chambers are equipped with magnets to create ECR plasma conditions. In some embodiments, multiple configurations are setup in serial fashion where some configurations are used for powders or solids, others for gasses, others for the extraction of ions and or electrons and yet others for combinations of the all of the above. In some embodiments, such configurations are used for the deposition of multilayered structures such as those used for the creation of films for the manufacturing of photovoltaic modules. In some embodiments, such arrangement of multiple microwave sources is used for the formation of multilayer structures such as those used in thin film batteries, medical devices, electronic devices, coatings on components and other applications as previously discussed.

In accordance with one or more embodiments, methods and systems are provided wherein a waveguide receives microwave radiation from a source and wherein the waveguide has primary slots cut into one of its sides to allow the microwave radiation to exit the waveguide through appropriately sized slots. In some embodiments, the primary slots in the waveguide are closed off by a vacuum tight surface that is permeable by microwave radiation but not for the atmospheric environment. In some embodiments, the vacuum tight surface allows for the passage of pipes into the region beyond the waveguide. In some embodiments, the waveguide is proximately mounted to a vacuum chamber where the plasma connectably located at the primary slots. In some embodiments, such a plasma chamber is an ECR chamber. In further embodiments such a plasma chamber is equipped with extraction slots to extract charged particles from the plasma. In some embodiments, such extracted particles are used for ion implantation or ion treatment of surfaces.

In accordance with one or more embodiments, methods and systems are provided wherein a waveguide receives microwave radiation from a source and wherein the waveguide has primary slots cut into one of its sides to allow the microwave radiation to exit the waveguide through appropriately sized slots. In some embodiments, the waveguide has small pipes on the side opposite the primary slots which penetrate through the waveguide into the primary slots. In some embodiments, such primary pipes are physically shaped to provide directionality to the stream of material going through the pipes. In yet another embodiment, the shape of the pipes conforms to the surface being treated such as the surface of a glass substrate with a corrugated or wavy shape. In further embodiments, the wavy glass substrate is coated with photovoltaic materials.

Various embodiments of the invention are provided in the following detailed description. As will be realized, the invention is capable of other and different embodiments, and its several details may be capable of modifications in various respects, all without departing from the invention. Accordingly, the drawings and description are to be regarded as illustrative in nature and not in a restrictive or limiting sense, with the scope of the application being indicated in the claims.

BRIEF DESCRIPTION OF THE DRAWINGS

FIG. 13 illustrates an alternate embodiment of the present invention where small, individual feed pipes allow for precise deposition patterns through the plasma chamber.

FIGS. 18A and 18B show cross sectional views of the material feed system and the plasma chamber/charge particle extraction system in accordance with one or more embodiments.

FIGS. 19A and 19B illustrate variations in which the wave guide and plasma chamber are shaped in a fashion to complement the shape of an object to be treated in accordance with one or more embodiments.

FIGS. 28A and 28B illustrate a dual plunger microwave emission system, where the primary objective of the secondary plunger is to amplify and improve the directionality of the microwave emission from the slots in the microwave guide in accordance with one or more embodiments.

FIG. 42A shows an exemplary extraction plate and the resulting beam profiles at the source and at the substrate for a linear set of point sources in accordance with one or more embodiments.

FIG. 42B shows an exemplary extraction plate and the resulting beam profiles at the source and at the substrate for a linear set of line sources oriented with the main axis parallel to the main axis of the ion source.

FIG. 42C shows an exemplary extraction plate and the resulting beam profiles at the source and at the substrate for a linear set of line sources with the main axis angular to the main axis of the ion source.

FIG. 42D shows an exemplary extraction plate and the resulting beam profiles at the source and at the substrate for a linear set of line sources with the main axis perpendicular to the main axis of the ion source.

DETAILED DESCRIPTION

Figure 1:
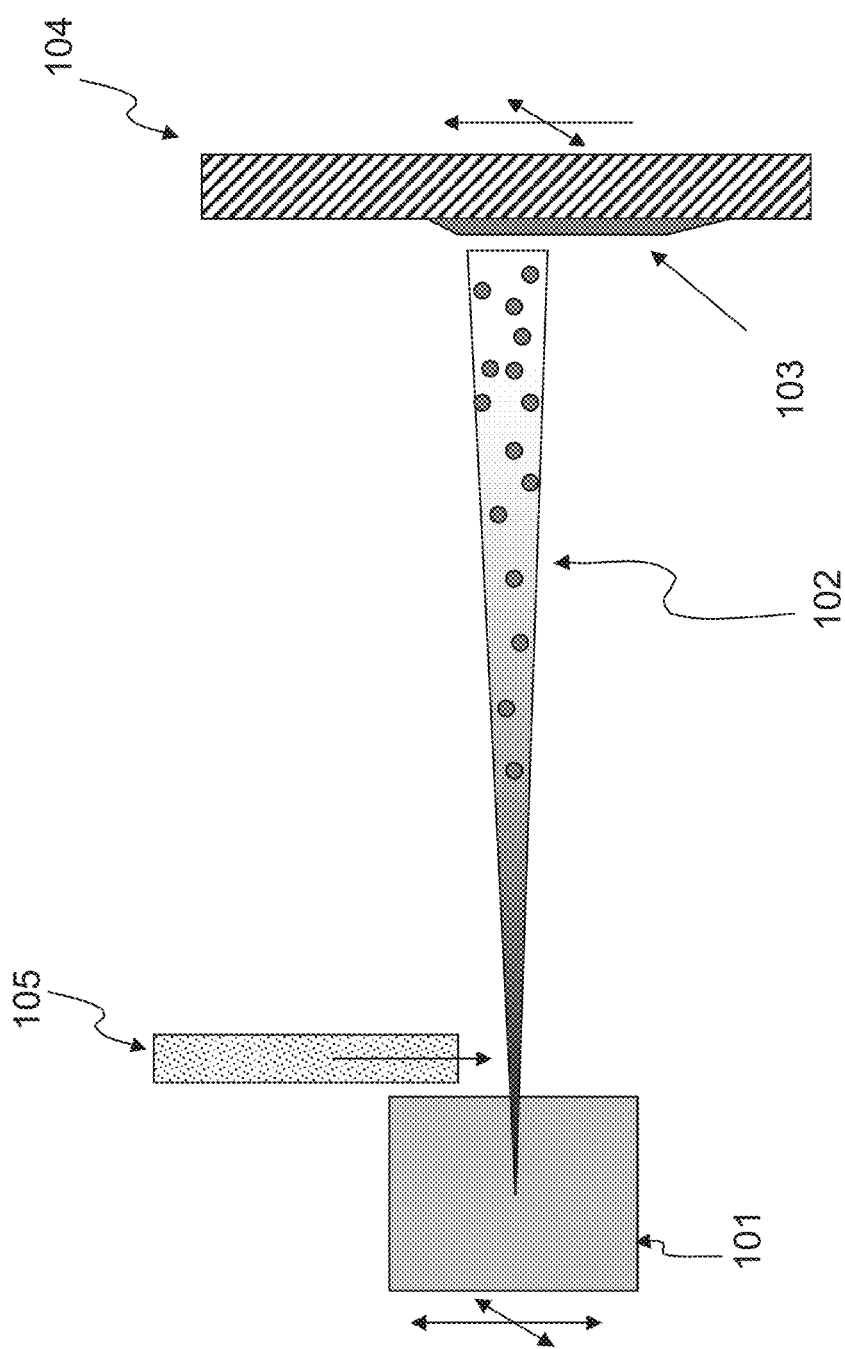
FIG. 1 illustrates a Thermal or Flame Spray Plasma coating system in accordance with the prior art.

FIG. 1 is a simplified diagram of components of a Thermal Spray Plasma (TSP) system as is commonly known in the art. A plasma source 101 generates a high temperature plasma environment, typically with temperatures ranging from 5,000 to 12,000° C. The temperature of the plasma is determined by a number of operating parameters, such as the power supplied to the plasma source, the powder or solid material feed rates that are supplied to the source region, the amount of gas that is introduced, the environmental pressure, etc. The introduction of gasses into the plasma chamber results in a plasma jet 102 being emitted from the plasma source. An injector 105 can inject additional materials into the plasma chamber 101 or into a convenient location in the plasma jet 102 that is emitted from the chamber. The materials that are injected into the plasma stream can be in almost any form, whether they are gaseous, liquid, solids, powders and combinations thereof. Common materials that are used in the art include ceramics, silicon, metals, plastics, bone etc. The temperature of the plasma jet and the velocity in which materials are fed into the jet, will determine the detailed behavior of the materials while they are being melted in the plasma jet. The plasma beam 102 is directed towards a substrate 104 where the injected material results in a deposition layer 103 on the substrate. Oftentimes the plasma source 101 and injector 105 are movably mounted with respect to the substrate. In some embodiments, the substrate 104 is movably mounted in respect to the plasma source 101 and injector 105. In other embodiments, both the substrate and the plasma source are movably mounted.

Figure 2:
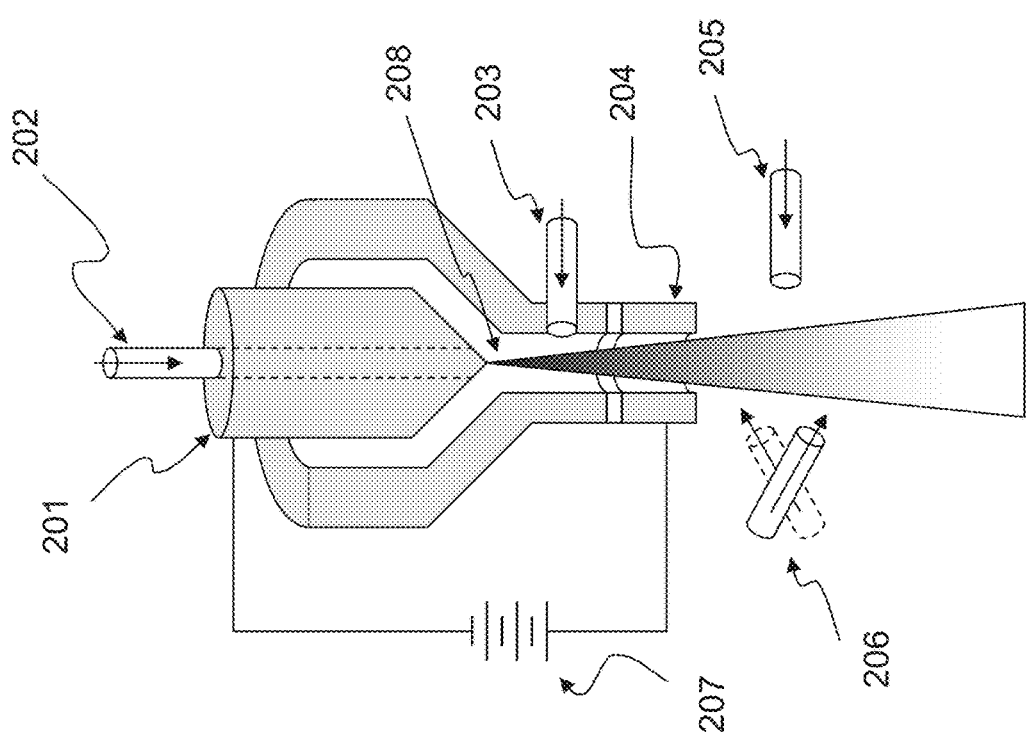
FIG. 2 illustrates a DC arc Thermal Spray Plasma system in accordance with the prior art.

FIG. 2 depicts a schematic diagram commonly known in the art as a DC-Arc Thermal Spray Plasma system. A cylindrical cathode 201 commonly has a small pipe 202 fitted through its center. The pipe 202 is used to introduce materials such as gasses, solid, liquids, powders and the like into the plasma generation area 208. In addition to, or instead of use the pipe 202, materials can also be introduced into the plasma through entry ports on the side of the plasma chamber 203 and into the stream of the plasma coming out of the plasma chamber 205. Moveable material injection systems 206 have also been used to introduce materials into the plasma area. A DC power supply 207 is used to create a DC arc discharge between the anode 204 and the cathode 201. This DC arc creates a large current between the anode and the cathode which in turn allows for the creation of plasma in the discharge region 208. It is commonly known that DC arc plasmas also introduce some materials that are removed from the anode and cathode by the high electron flux and the exposure to the high plasma temperatures. Since the anode and cathode are commonly constructed using copper or other suitable metals, these metals are as a result introduced into the plasma stream and co-deposited onto the substrate being treated. In many applications this small amount of co-deposited material is not in problem, however in semiconductor applications such a co-deposition can be detrimental the semiconducting function of the material, significantly altering the materials' desirable properties, even at very low contamination levels.

Figure 3:
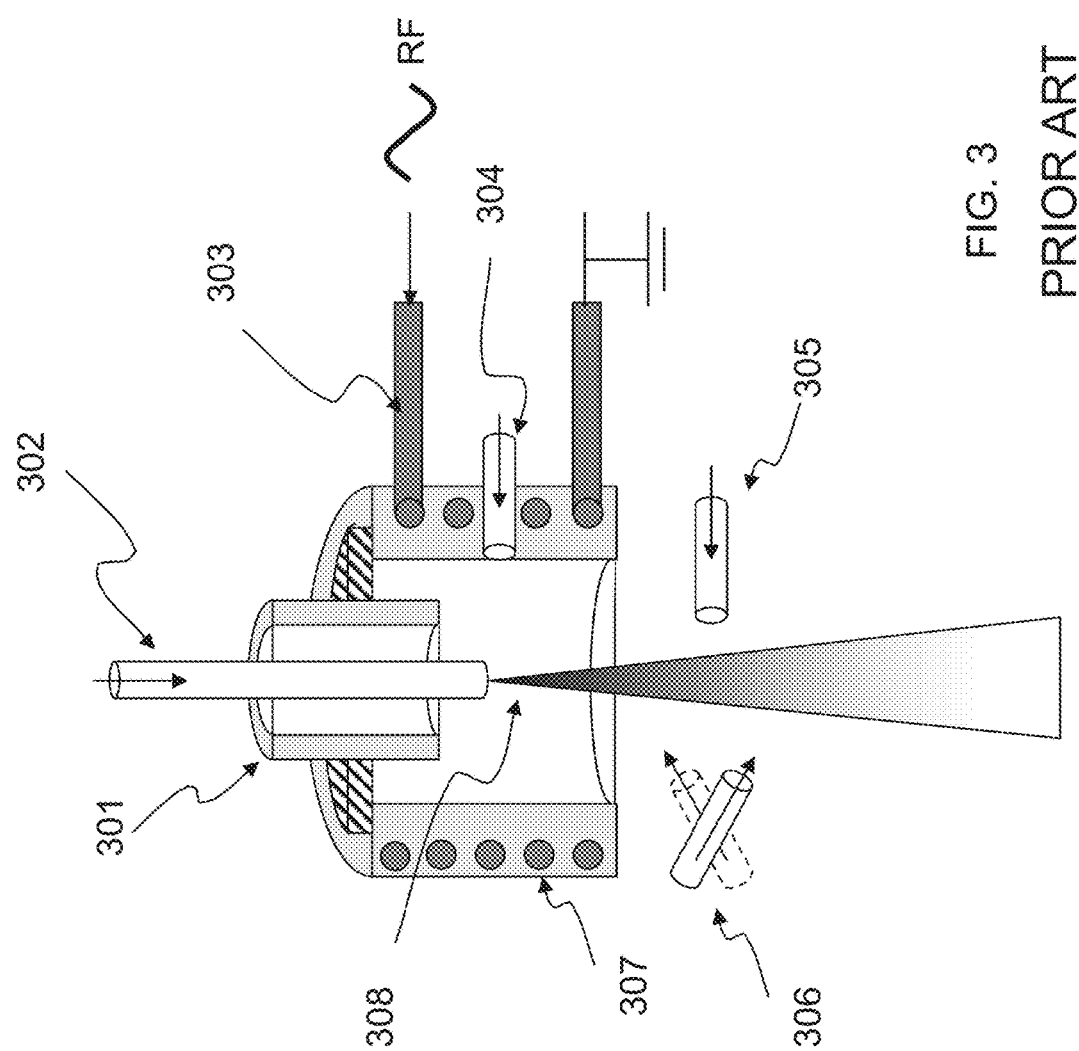
FIG. 3 illustrates an inductively coupled, radio frequency Thermal Spray Plasma system in accordance with the prior art.

FIG. 3 shows an alternate approach for the creation of a thermal spray plasma system using a Radio Frequency (RF) coil for the generation of power. In the figure, a cathode 301 contains a small pipe 302 that allows for the introduction of materials into the plasma region 308. The coil 303 receives a RF signal and creates a rapidly alternating magnetic field in the discharge region, which leads to the creating of plasma in the center of the structure. The RF signal is coupled to the plasma by emitting radio waves from the coil into the plasma region 308. The coil 303 is typically enclosed in a housing 307 that is made from a suitable material able to withstand the exposure to the plasma and the high temperatures that are created. In some cases, in addition to or instead of materials being introduced through the pipe 302, materials can also be introduced into the plasma region 308 through pipes 304, 305 or through movable pipes 306 or in any convenient combination of the above.

Figure 4:
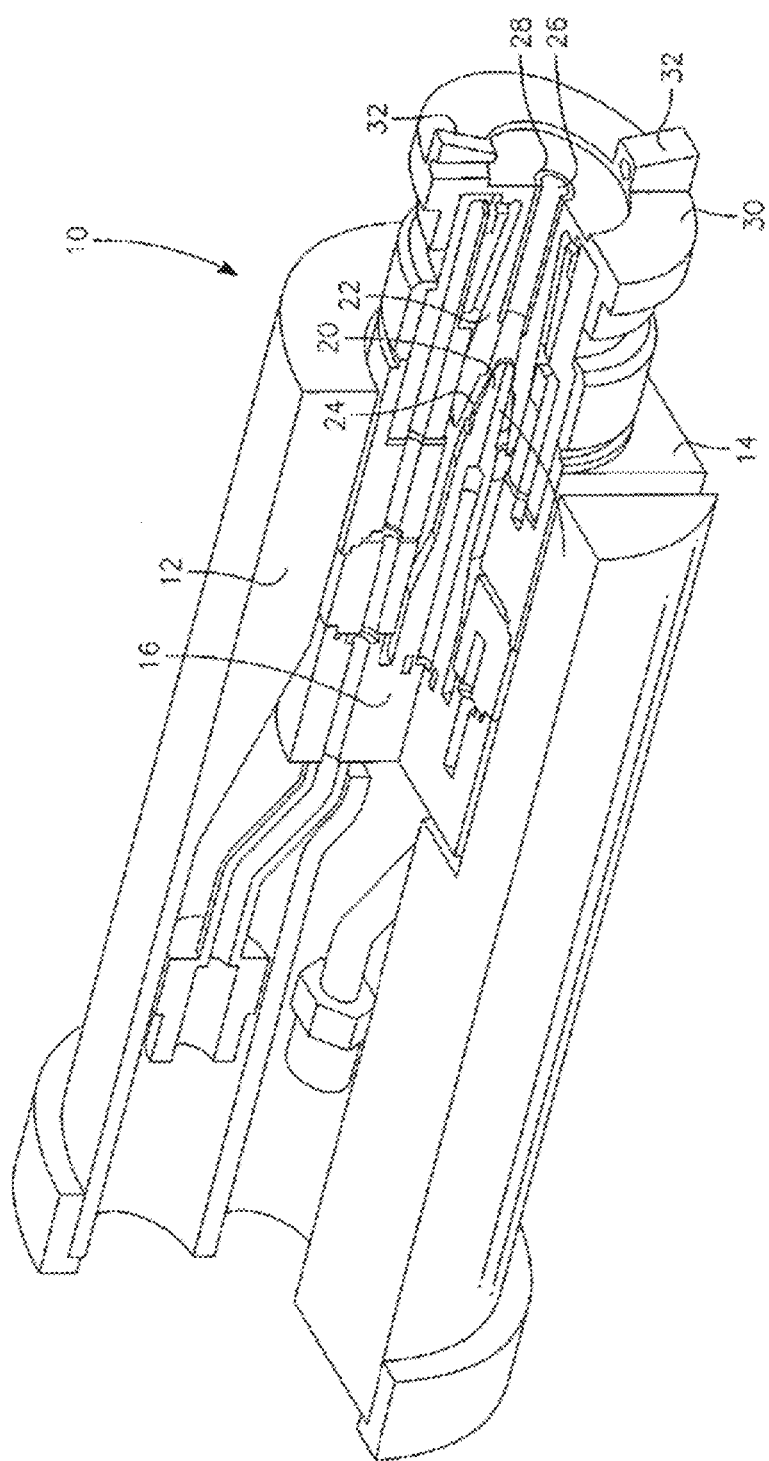
FIG. 4 illustrates a prior art DC arc Thermal Spray Plasma system disclosed in U.S. Patent Application Publication No. US20080220558, in which certain elements have been replaced with silicon or silicon coated components.

FIG. 4 shows a view of the main assembly from of a DC arc Thermal Spray Plasma system from U.S. Patent Application Publication No. 20080220558, wherein the components that are exposed to the plasma area of the discharge chamber have been replaced by parts made from silicon, doped silicon, or from materials that are coated with silicon layers or doped silicon layers. The concept of replacing components that are normally made with metals such as copper, stainless steel, or brass with materials that have been clad with silicon or that are made out of silicon is intended to reduce the contamination from those metals surrounding the discharge chamber. Thus, where normally brass, copper, or stainless steel is exposed to the plasma in the chamber, now instead the plasma only sees silicon and hence it will only be silicon that is introduced into the plasma. In this way, the discharge plasma is still contaminated, but the contamination is now silicon, which is essentially not a contaminant for a silicon deposition. Other materials that are essentially not contaminants could also have been chosen, such as graphite, quartz or other suitable materials.

Figure 5A:
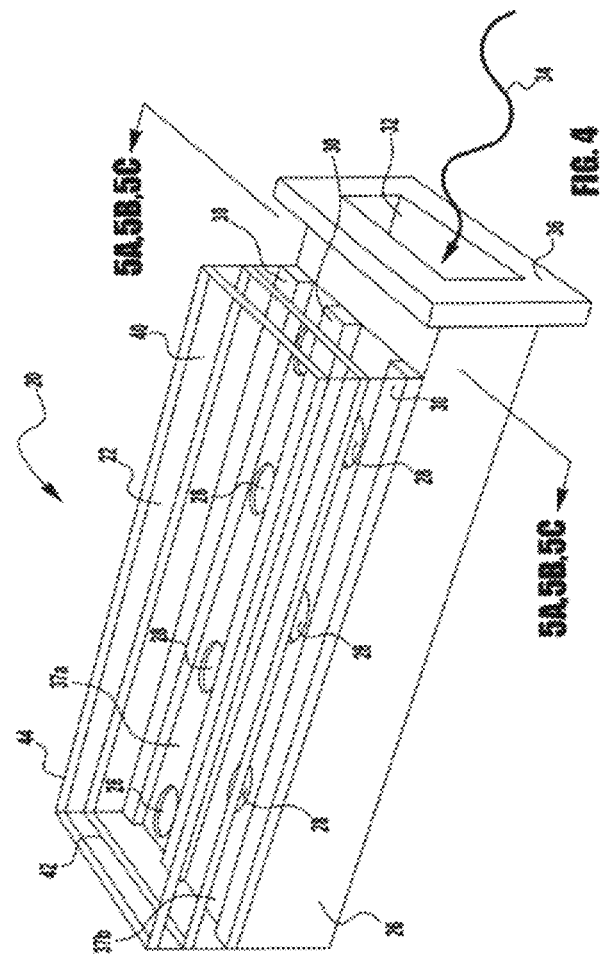
FIGS. 5A and 5B illustrates a prior art Electron Cyclotron Resonant plasma chamber as disclosed in U.S. Pat. No. 7,305,935, in which longitudinal magnets placed along the axis of a microwave guide where microwave radiation is transmitted through longitudinal slots in the microwave guide to generate an Electron Cyclotron Resonant plasma.
Figure 5B:
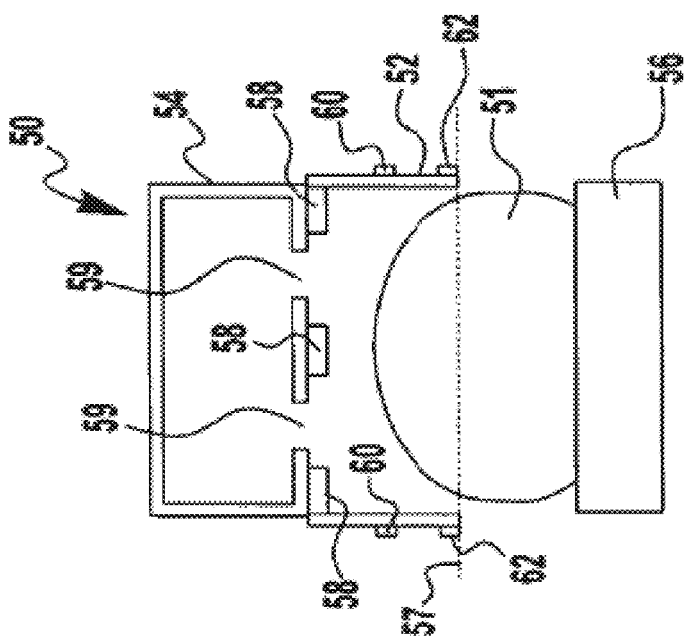

FIG. 5 shows a drawing from U.S. Pat. No. 7,305,935 in which an ECR plasma chamber 50 is connectably mounted against a microwave tube 52. The ECR chamber contains magnets 58, 60 and 62 that are placed parallel to the major axis of the chamber to create a high magnetic field near the walls of the chamber and a substantially reduced magnetic field near the center of the chamber. Furthermore, longitudinal openings 59 are placed in two rows along the microwave guide to allow for the passage of microwave from the guide into the ECR chamber region 51. These openings have been spaced and sized such that the microwave energy is able to exit into the plasma chamber.

Figure 6B:
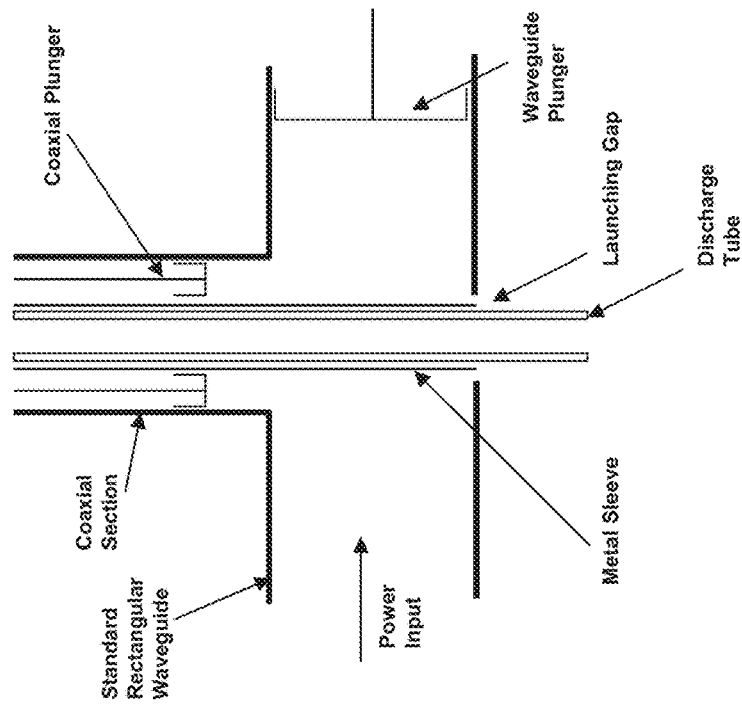
FIGS. 6A and 6B illustrate a system for generating of a surface wave plasma known in accordance with the prior art.
Figure 6A:
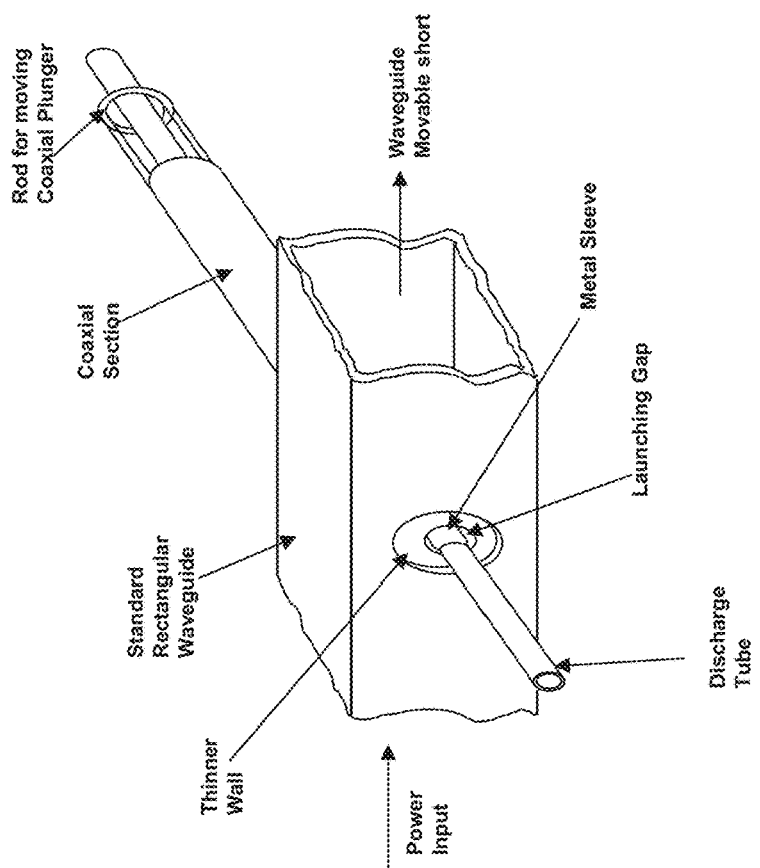

FIG. 6 shows a rectangular microwave guide at the end of which a plunger has been inserted "waveguide plunger" and through which a coaxial section has been cut with a secondary plunger "coaxial plunger" as is known in the prior art. The coaxial section contains a secondary plunger which faces an opening on the opposite wall of the waveguide. This opening functions as a launching gap through which a Surface Wave Plasma (SWP) is emitted. A discharge tube is inserted through the coaxial section in order to bring gasses into the discharge area. Plasma is created on the inside of the discharge tube and is sustained by the microwaves emitted from the launcher gap. FIG. 6A shows a perspective view of the SWP Surfatron, whereas FIG. 6B shows a cross-sectional view of the Surfatron.

Figure 7:
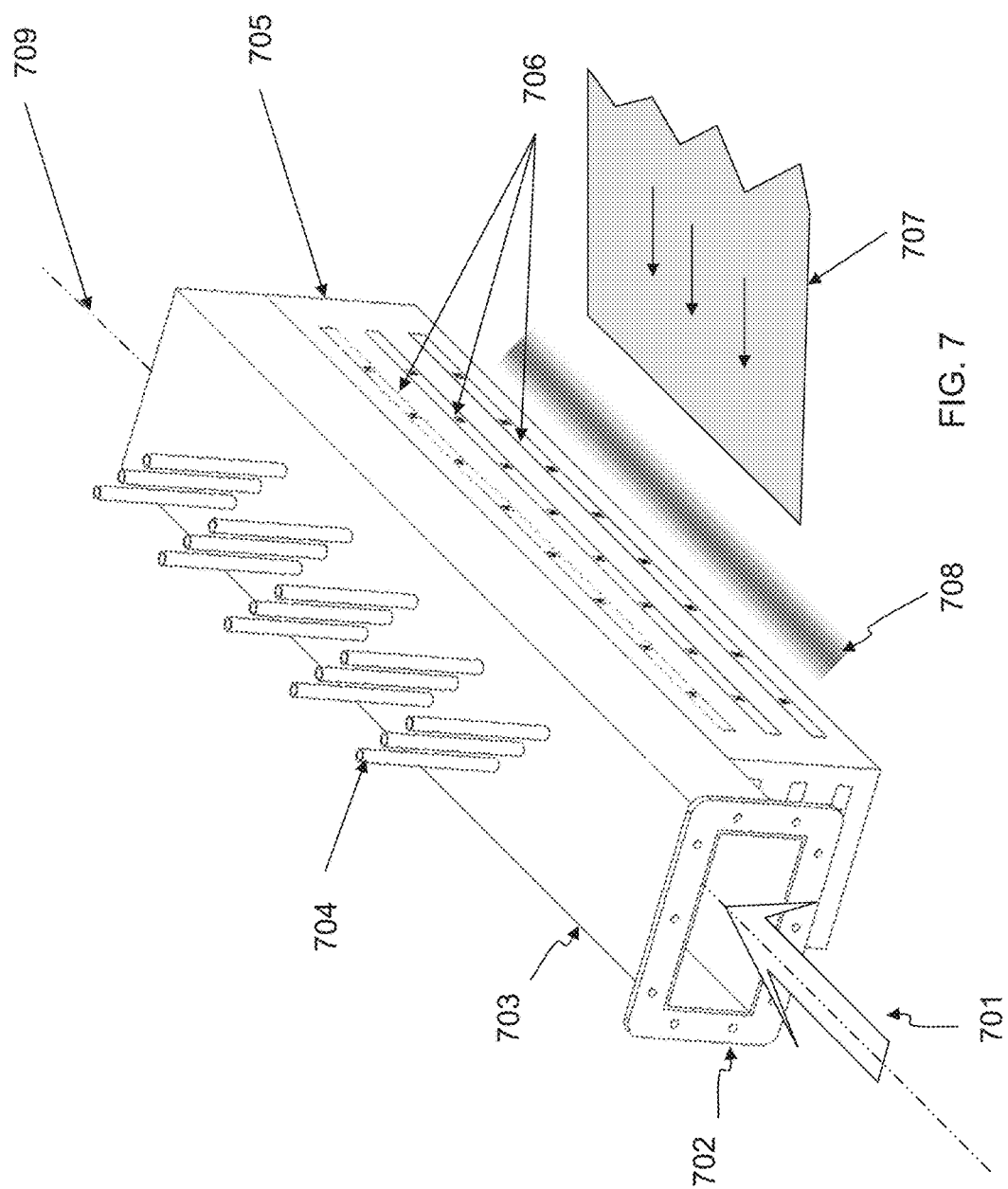
FIG. 7 illustrates a system including a microwave guide and plasma chamber in accordance with one or more embodiments of the present invention in which material feed pipes are arranged along the top of a microwave guide in a diagonal pattern to feed material into a plasma chamber.

FIG. 7 illustrates a microwave waveguide body 703 in accordance with one or more embodiments where microwave radiation 701 is introduced from a microwave source (not shown). A flange 702 is used to connect the present section of the microwave guide to the source or through additional sections of microwave guide. The microwave guide body 703 is penetrated by one or more pipes 704 through which materials can pass into a plasma chamber 705. The plasma chamber 705 can be covered with a number of magnets 706. The resulting ECR plasma 708 is used to melt or evaporate materials that are coming through the pipes 704 into the plasma chamber 705. The materials are directed from the plasma region 708 onto a substrate 707, which can be moved with respect to the plasma source. Multiple arrangements of pipes, magnets and ECR chamber shapes are possible in accordance with various embodiments. Furthermore, the ECR/Waveguide assembly can be moveably mounted to coat a substrate or the substrate can be moved along a stationary ECR/Waveguide assembly, or that both of the assemblies are movable in a suitable pattern with respect to each other. It can also be seen from the figure that a pattern of pipes 704 can be created that is primarily at an angle with respect to the main axis 709 of the waveguide 703. The advantage of such a pattern is that there can be an overlap of the exiting plasma jets in the plasma region 708 such that a much more uniform plasma discharge can be created.

Figure 8:
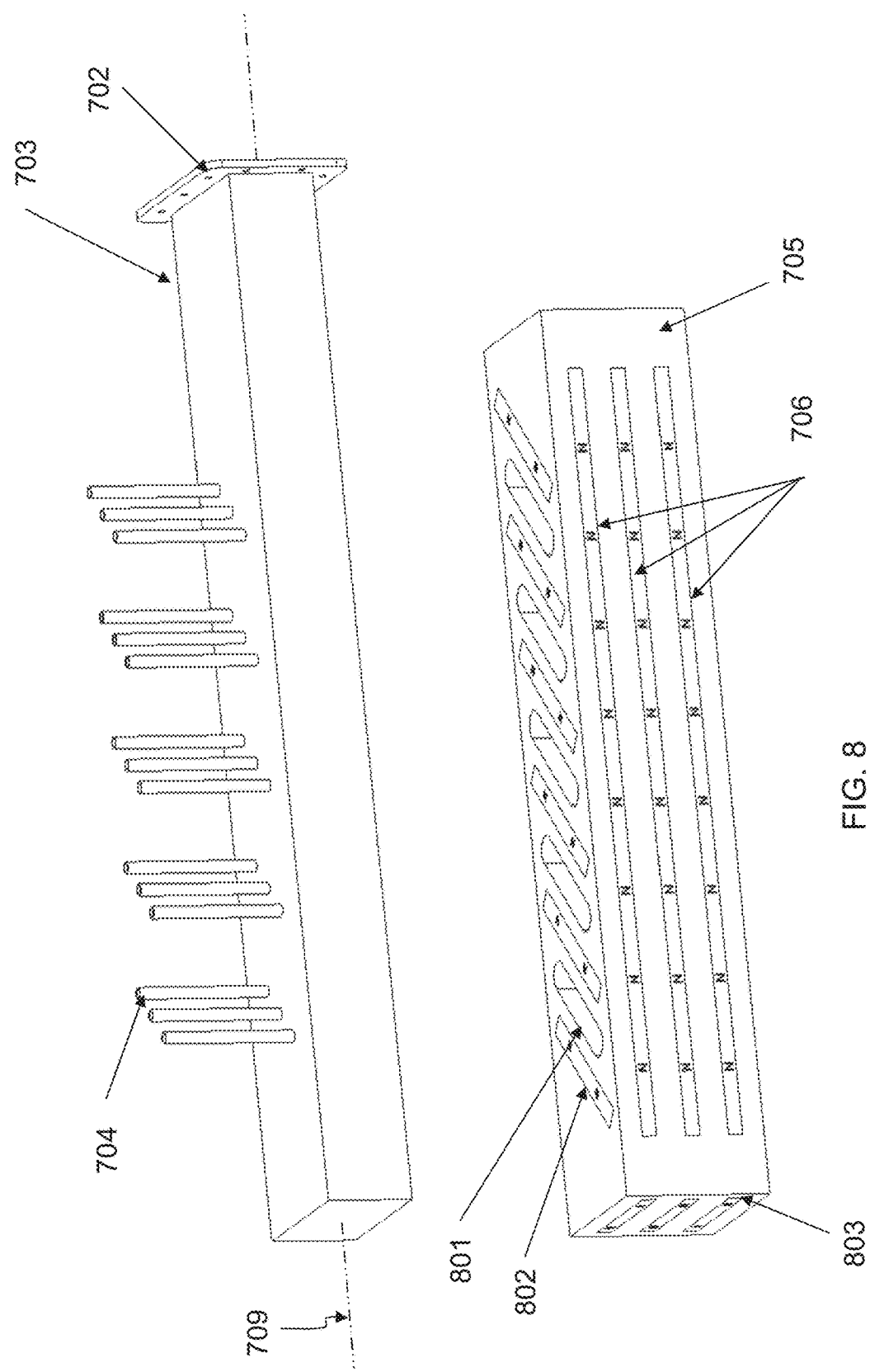
FIG. 8 illustrates the assembly of FIG. 7, wherein the plasma chamber and the microwave guide have been separated, and where the diagonal slots and the interspaced magnets placed along the surface of the plasma chamber are visible.

FIG. 8 shows another aspect of the elements of FIG. 7 in which the plasma chamber 705 has been separated from the microwave guide 703 so that the orientation and pattern of magnets 802, 803 and slots 801 can be more readily seen. As can be seen from the figure, the pipes 704 follow the same pattern as the slots 801 in the body of the ECR chamber 705. Furthermore, it can be seen from the figure that the magnets on the top of the chamber are at an angle to the primary axis 709 of the waveguide. In fact, the magnets 802 in the top of the chamber are aligned with the slots 801 in the chamber. As can also be seen from the figure, the magnets 706 that are mounted to the ECR chamber are mounted in small cavities on the exterior of the chamber. The reason for this is that the magnets should not be exposed to the plasma in the chamber directly because they are typically unable to withstand the high temperatures associated with plasmas and neither should they be exposed to the plasma in the chamber for fear that they might contaminate the deposition process when small particles are removed from the magnets by the plasma. The arrangement shown in FIG. 8 shows that the magnets can be shielded from the plasma by the ECR chamber itself. The ECR chamber could be made out of materials that if removed into the plasma would not matter to the contamination of the plasma. For depositions involving semiconductor materials one could think of using, without limitation, materials for the ECR chamber such as silicon, graphite, quartz, alumina or silicon coated materials.

Figure 9:
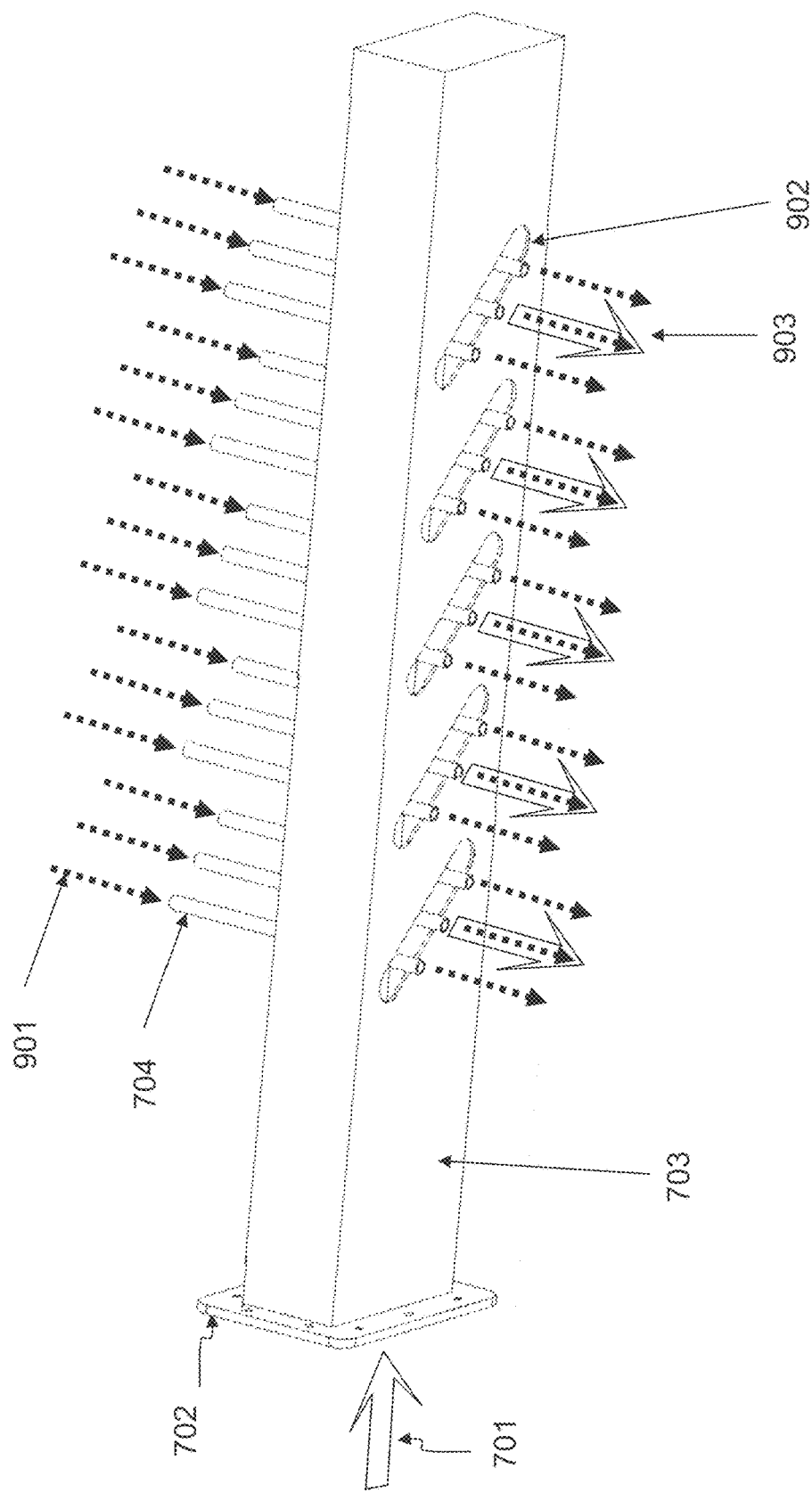
FIG. 9 illustrates penetration of the material feed tubes through the microwave guide so that material and microwaves enter into the plasma chamber through the same openings in accordance with one or more embodiments.

FIG. 9 shows the underside waveguide from FIGS. 7 and 8 with the ECR chamber completely removed from the figure. As illustrated, the pipes 704 penetrate the waveguide 703 and are arranged such that they end near the slots that allow for passage of the microwaves into the plasma chamber. It can be seen from the figure that this arrangement allows for materials 901 and microwaves 701 to be introduced at the same approximate location 903 into the ECR plasma chamber through the slots 902. The pipes and slots may be arranged in many different patterns and that each pipe may contain different materials.

Figure 10:
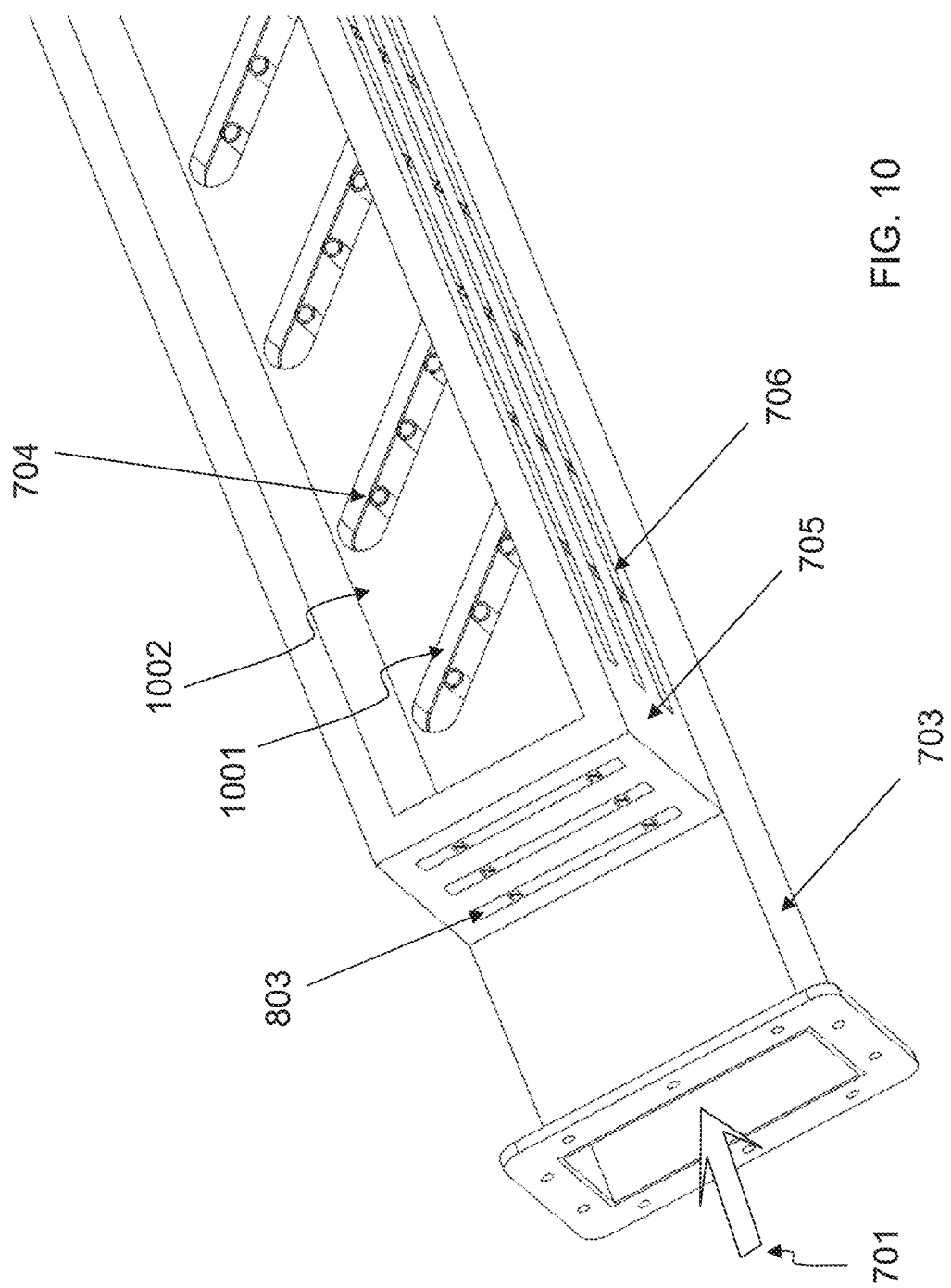
FIG. 10 illustrates the assembly of the microwave tube and plasma chamber in accordance with one or more embodiments.

FIG. 10 depicts the combined microwave guide 703 and ECR plasma chamber 705 from FIGS. 7, 8 and 9. In the present view, the material pipes 704 can be seen exiting the slots for the microwaves 1001. The internal side of the ECR plasma chamber 1002 does not expose any undesirable materials to the plasma itself, except for the material that the ECR chamber is constructed out of. The magnets 706 and 803 are kept separate and away from the plasma area, however, the magnetic field lines can easily penetrate the plasma area if the ECR chamber is constructed from non-magnetic materials such as for example graphite.

Figure 11:
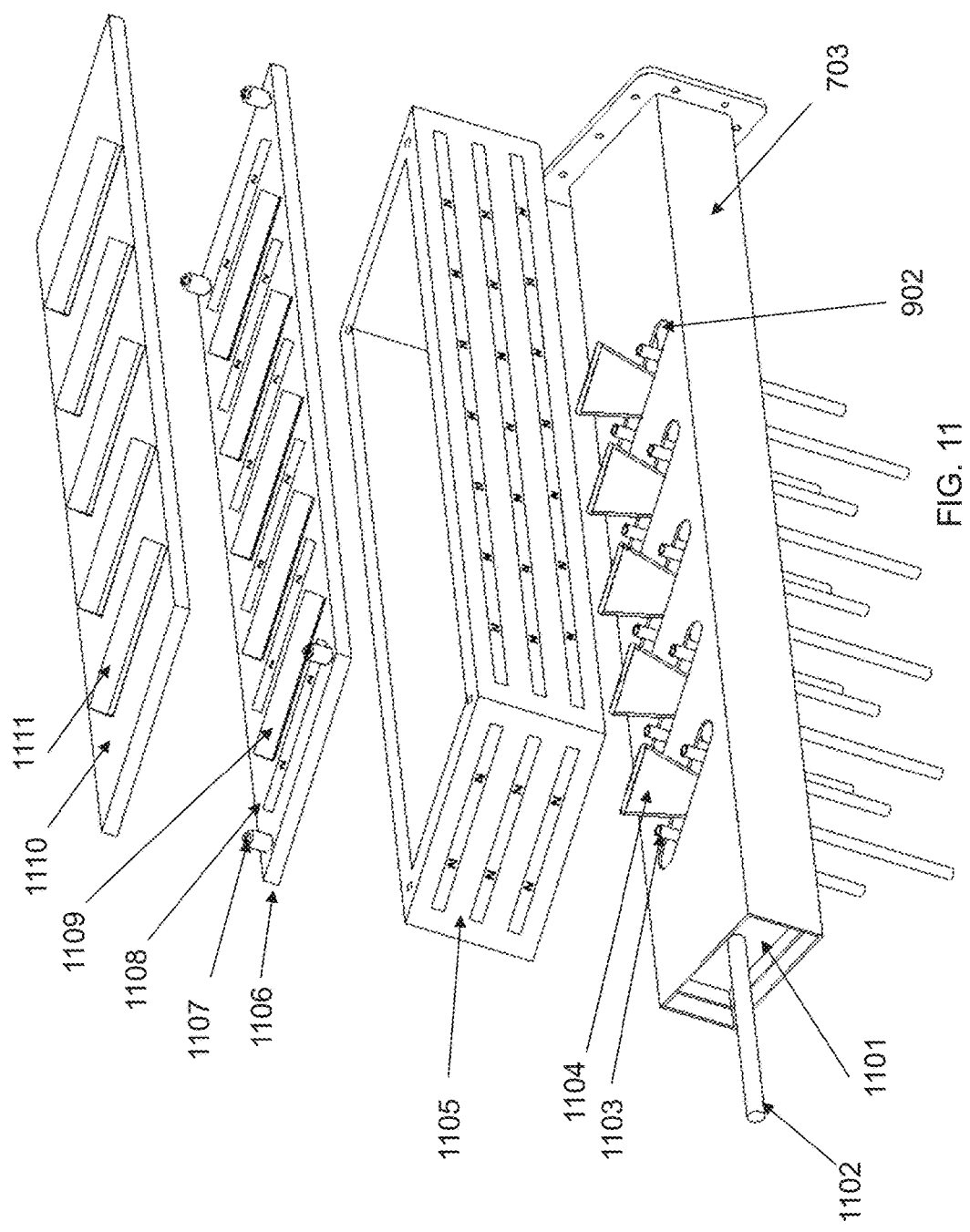
FIG. 11 illustrates a waveguide plunger and an extraction system for ions or electrons mounted to the plasma chamber in accordance with one or more embodiments. Several components have been moved to allow an easier view at the assembly.

FIG. 11 illustrates an alternative embodiment of the present invention. The microwave guide 703 is terminated at one end by a moveable wave guide plunger 1101. An adjustment screw 1102 or similar convenient mechanism can be used to move the plunger 1101 into a position where the maximum of microwave power exits through the slots 902. Different operating conditions may require different positions of the plunger to optimize power output through the slots. A combination of shorter straight pipes 1103 supports a pipe 1104 with a tapered exit opening. In some embodiments, the straight pipes 1103 carry gasses to the plasma chamber, and the tapered pipes carry powders into the plasma chamber. The ECR chamber 1105 has short angled walls with respect to the major axis of the system rather than the rectangular wall as seen in FIG. 7 through 9. Such an arrangement keeps the walls of the ECR chamber 1105 approximately at equal distance from the slots 902 whereas a rectangular chamber such as was shown the earlier figures has one end of the slot closer to the short walls of the ECR chamber, thereby potentially creating a non-uniformity in the corner furthest away from the slot. Referring again to the figure, the ECR chamber 1105 is covered by a plate 1106. The cover plate 1106 is outfitted with slots 1109 that allow for passage of plasma or particles from the ECR plasma region into the exterior environment of the source. It will be understood that commonly such slots are located opposite the slots 902 that allow for passage of microwaves into the ECR chamber; however other arrangements can easily be envisioned. Additional magnets 1108 can be located in the cover plate, again arranged in various ways. Such magnets 1108 are arranged to prevent plasma from getting in close proximity to the internal side of the cover 1106 which is closest to the plasma region.

Furthermore, as can be seen in the figure it is possible to add a second cover 1110, also equipped with slots 1111. The second cover 1110 can be mounted on insulators 1107 so that the cover 1110 can be electrostatically charged to a different potential than the source itself. Such a positive potential or negative potential can be used to extract electrons or ions or other charged particles from the plasma region. It should be understood that covers with different slot arrangements as well as additional covers with slots and other electrostatic or magnetic field components can be arranged to shape the extracted beams of particles or to select certain particles over other particles such as is commonly done in mass separators in ion implanters, whether done electrostatically or magnetically.

Figure 12:
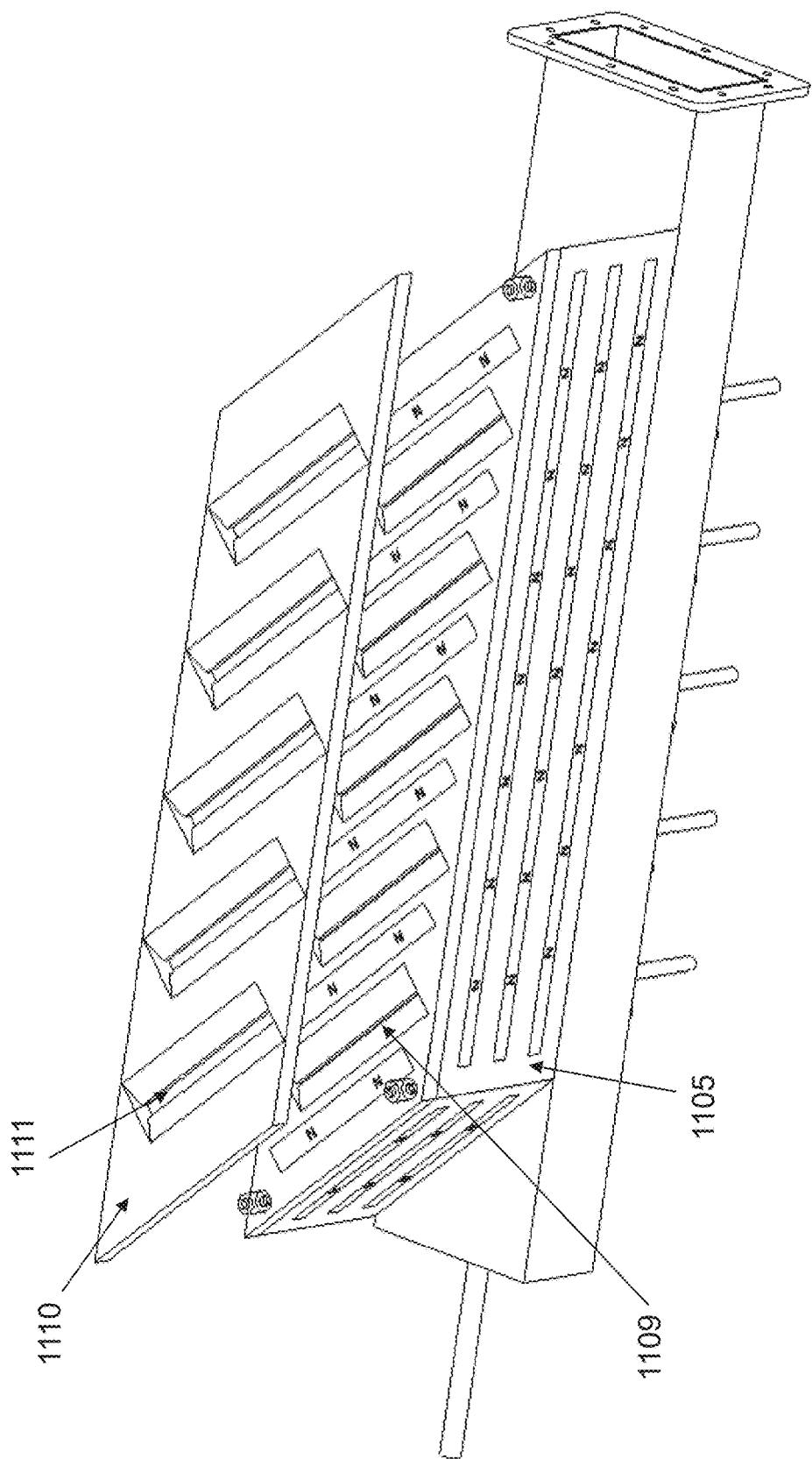
FIG. 12 illustrates a different view of FIG. 11 where the extraction slot set has been separated from the main plasma chamber to allow a better view of the assembly.

FIG. 12 shows the same elements from FIG. 11 with the components now mostly assembled in the configuration in which it would be commonly used. The secondary cover 1110 is still shown somewhat removed from the normal position to allow the reader a better view of the primary slots 1109. It should be clear from the figure that the internal area of the ECR chamber 1105 is almost completely isolated from the exterior environment, safe for the openings in the slots 1109.

FIG. 13 shows the ECR chamber from the earlier figures with very small pipes 1302 projected in an opening 1301 in the ECR chamber. By way of non-limiting example, the pipes 1302 can each have a diameter ranging from about 1 micron to about 1 mm. Such an arrangement of very small pipes can be useful for the deposition of patterns such as used for deposition of lines of metals on substrates. Furthermore, it will be understood that materials may be injected simultaneously to create mixtures inside the plasma region for co-deposition of materials that are otherwise difficult to mix. It will also be understood that the material flow through the pipes may be deposited in a pulsed fashion so that thin, alternating layers can be deposited onto a substrate. These arrangements could be convenient when depositing thin alternating layers of materials such as commonly done during Atomic Layer Deposition or for patterned deposition of materials.

Figure 14D:
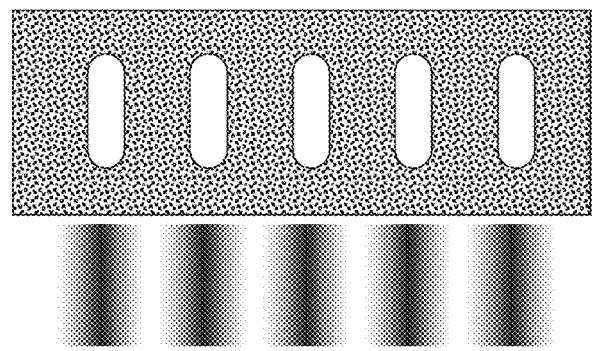
FIGS. 14A-14D illustrate several patterns emitted by several plasma systems in accordance with one or more embodiments.
Figure 14C:
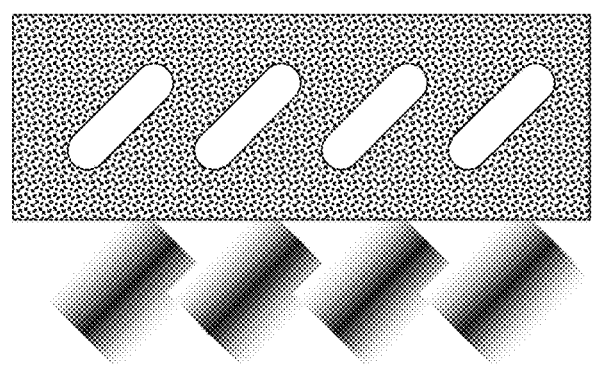
Figure 14B:
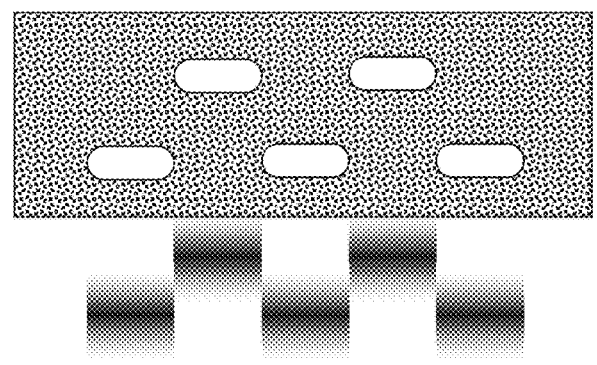
Figure 14A:
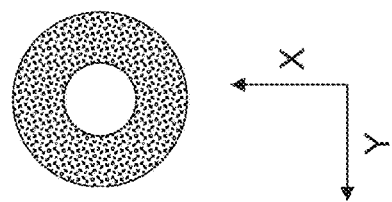

FIGS. 14A-14D show patterns of the deposition of various slot arrangements of various plasma deposition sources. In FIG. 14A, the exit opening of a common DC Arc plasma is depicted on the right side and a matching deposition pattern is shown on the left, which shows a deposition pattern primarily in a circular pattern similar to a pattern created by a spray paint can. In order to attain very uniform layers over large areas the plasma source is typically moved over a pattern using a scanning motion. Oftentimes the pattern is repeated multiple times so that several layers are deposited on top of each other to create a thicker layer with better uniformity, since non-uniformities can be averaged out in this way. In FIG. 14B the slot pattern of an ECR chamber is shown on the right side and the corresponding deposition pattern is shown on the left side of the figure. Depending on the length of slots, the deposition patterns may, or may not overlap with each other. In FIG. 14C the slot pattern of an ECR chamber with diagonal slots is shown on the right and the corresponding deposition pattern is depicted on the left. In the right side of FIG. 14D a slot pattern is shown with slots perpendicular to the primary axis of the system and the corresponding deposition pattern is shown on the left. It should be evident from the figures that the length and angles of the slots can be carefully chosen so that a substrate that is coated receives a uniform overall coating pattern. It should also be clear that the plasma source as well as the substrate can be moved to create multiple layers with better uniformity properties.

Figure 15B:
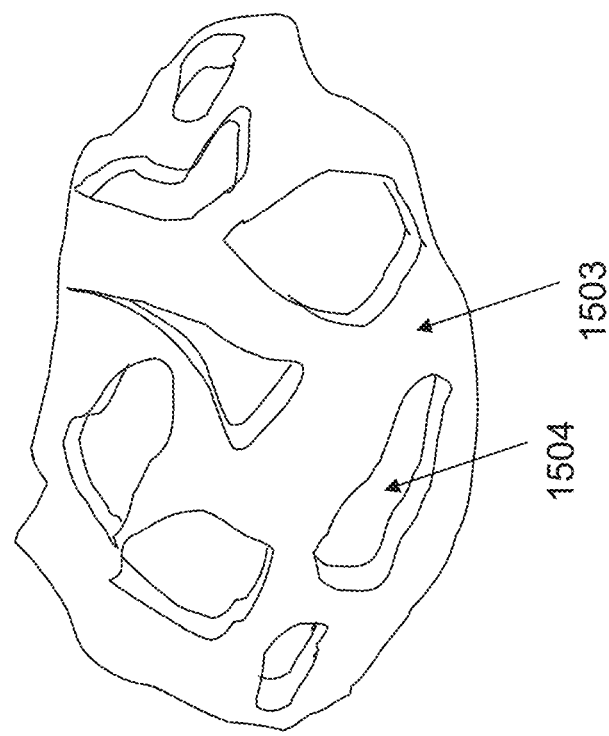
FIGS. 15A and 15B illustrate a small composite particle comprising two or more layers before and after it passing through the plasma chamber.
Figure 15A:
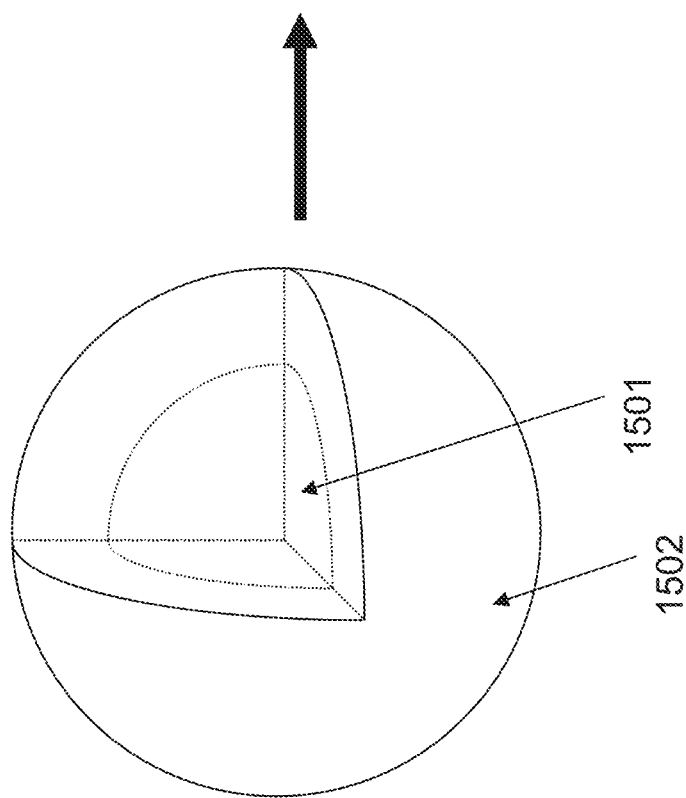

FIG. 15A shows a small particle comprising a core 1501 made out of a first material covered by a shell 1502 made out of a second material. During the heating of the particle in a plasma such as described in accordance with various embodiments of the present invention, the core 1501 which can have a lower melting temperature as the shell 1502, can evaporate or evolve, thereby creating a hollow structure 1503 and openings 1504 in such as structure. In FIG. 15B the resulting structure of such a process is sketched. It would be possible to create very complex structure with very large surface areas in this fashion, which can be of significant advantage for example for the making of catalytic converters or membranes.

Figure 16E:
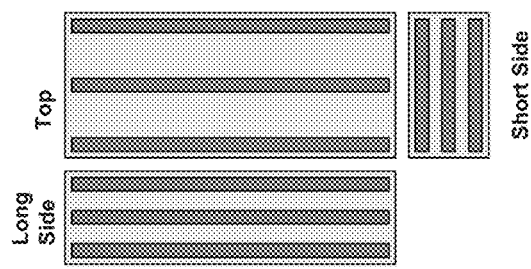
FIGS. 16A-16E illustrate variations of magnet placements along the surfaces of the various embodiments of the present invention.
Figure 16D:
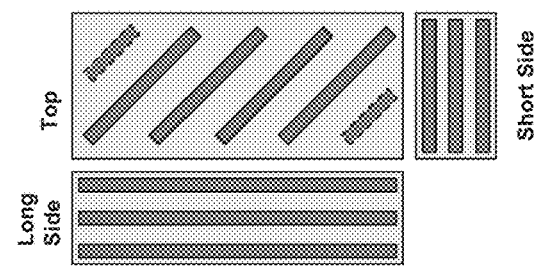
Figure 16C:
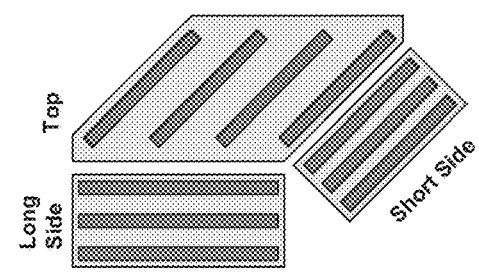
Figure 16B:
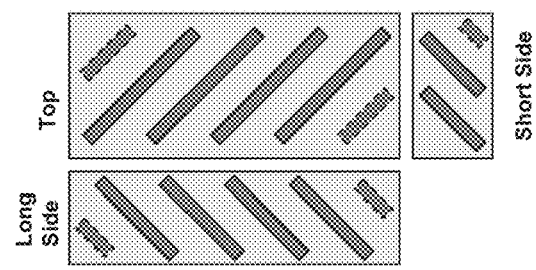
Figure 16A:
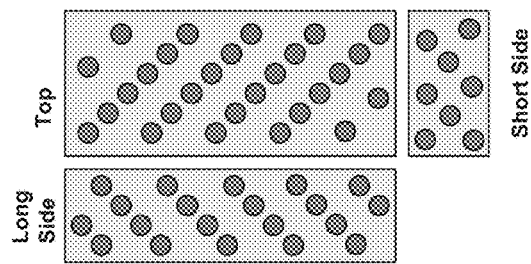

FIGS. 16A-16E show a number of embodiments for the placement of magnets on the side of the ECR chamber. FIG. 16A shows the magnet placement such as substantially disclosed in U.S. Pat. No. 7,305,935. FIG. 16B shows the magnet placement such as substantially shown in FIG. 7. FIG. 16C shows the magnet placement such as was substantially shown in FIGS. 11, 12 and 13. In another embodiment shown in FIG. 16D the magnets on the side walls of the ECR chamber are placed at an angle to the surface of the chamber. In another embodiment shown in FIG. 16E, circular magnets are used to create a pattern of magnets on the sides of the ECR chamber. It should be understood that the primary purpose of the magnets is twofold: 1) to create a high magnetic field close to the walls of the ECR chamber and low in its center, and 2) to create helical paths of charged particles to enhance their collision probability with the other particles in the plasma.

Figure 17B:
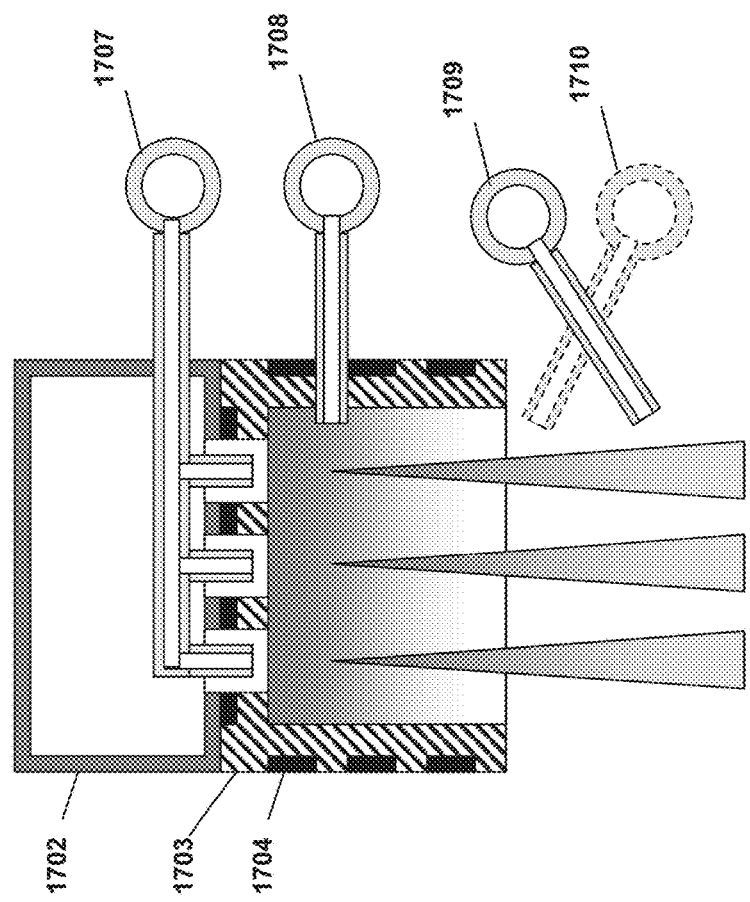
FIGS. 17A and 17B illustrate various possible implementations of material feed pipe systems into the plasma chamber assembly in accordance with one or more embodiments.
Figure 17A:
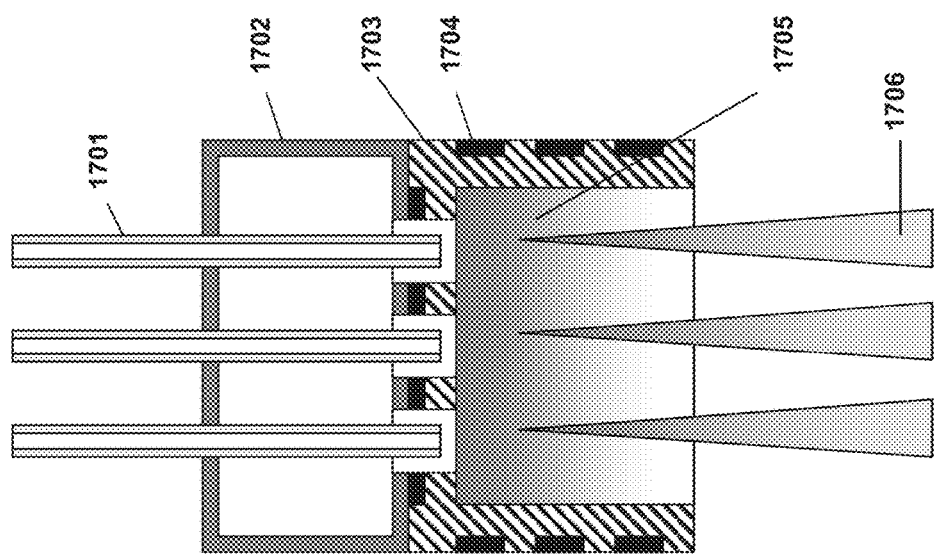

FIG. 17A shows a cross sectional view of the assembly of wave guide 1702 with the material feed pipes 1701 feeding material into the plasma region 1705 in accordance with one or more embodiments. The ECR chamber 1703 is properly covered with magnets 1704 intended to prevent the created plasma from coming in touch with the ECR chamber walls. The emitted plasma jets 1706 can be directed towards a substrate to be treated (not shown). FIG. 17B shows alternate embodiments of the material feed pipes 1707 entering from the sides of the wave guide or feed pipes 1708 coming in from the side through the ECR chamber walls. In addition, the feed pipes 1709 and 1710 can be moveably located to inject materials in various locations in the plasma chamber. It should be understood that various combinations and arrangements of feed pipes can be implemented to supply materials to the plasma region.

FIG. 18A shows a cross sectional view of the plasma chamber from FIG. 11 with the primary cover 1801 and optional magnets 1802 installed in the cover. The ejected beam 1803 can now enter a region 1804 wherein the pressure is substantially different than the pressure in the ECR chamber 1805 because of the flow restriction provided by the slot 1806. In the right hand of the FIG. 18B, a cross sectional view of the same system with an extraction plate 1808 is shown. The extraction plate 1808 is mounted on standoffs 1807 that are electrical insulators. The extraction plate 1808 can then be electrostatically charged to extract charged particles 1803 from the plasma region.

In FIG. 19A, a wave guide 1901 in accordance with one or more embodiments is shaped in a circular or semicircular shape in conformance to a cylindrical object 1904 that is to be coated. The ECR chamber 1902 in turn is also circular or semi-circular in shape. Plasma jets 1903 are emitted towards the center of the system to treat the cylindrical substrate 1904. In FIG. 19B a waveguide 1901 now has an ECR chamber 1906 on the outside of the waveguide and plasma jets 1907 are directed outwards from the center of the system. The jets are directed towards an internal cylindrical surface 1908 in order to treat or coat the inside surface of such cylindrical pipe. It will be clear to those skilled in the art that many other shapes of waveguide can be employed either with or without a correspondingly shaped ECR plasma chamber. In some embodiments, these systems can be employed to coat the inside surfaces of pipelines such as are commonly used for oil and gas transportation. In some embodiments, these systems can be used to create concentrates microwaves in parts of a human body. In some embodiments, such systems can be used to coat cylindrical objects such as drills.

Figure 20B:
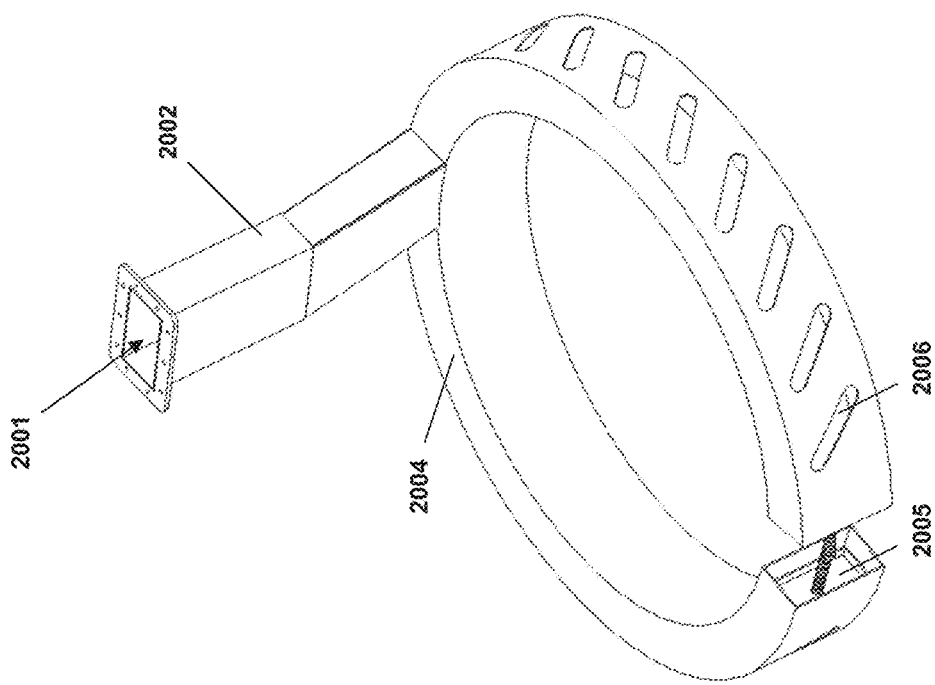
FIGS. 20A and 20B illustrate an alternative arrangement which allows for uniform emission of microwave radiation along the surface of an annular wave guide in accordance with one or more embodiments.
Figure 20A:
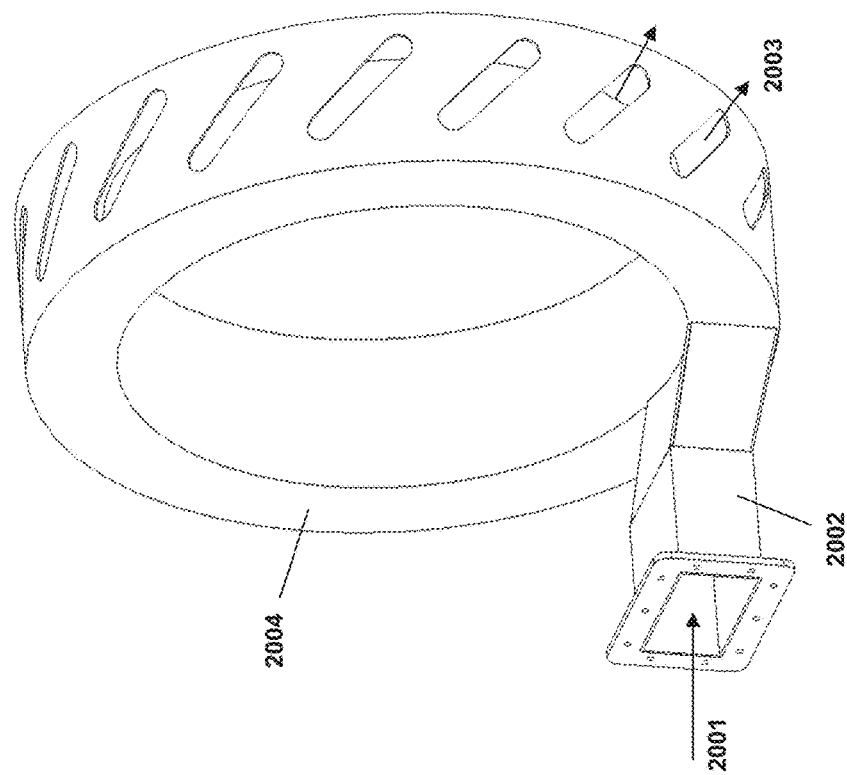

In FIG. 20A, a waveguide in accordance with one or more embodiments is shown that has a circular shape. Microwave radiation enters the system at 2001 and transmitted through a short section of waveguide 2002 to circularly shaped waveguide 2004. Slots 2003 cut in the side of the circular waveguide 2003 can be used to transmit microwave radiation into an optional ECR plasma chamber (not shown in the figure). On the right side of the figure an alternate configuration of the waveguide is shown where a short section of the waveguide is removed so that a plunger 2005 can be inserted at the end of the waveguide. The plunger allows for adjustment of the end of the waveguide in order to maximize the power transmitted through the slots 2006 cut in the sides of the waveguide. This is similar in function as the wave plunger discussed in FIG. 11.

Figure 21:
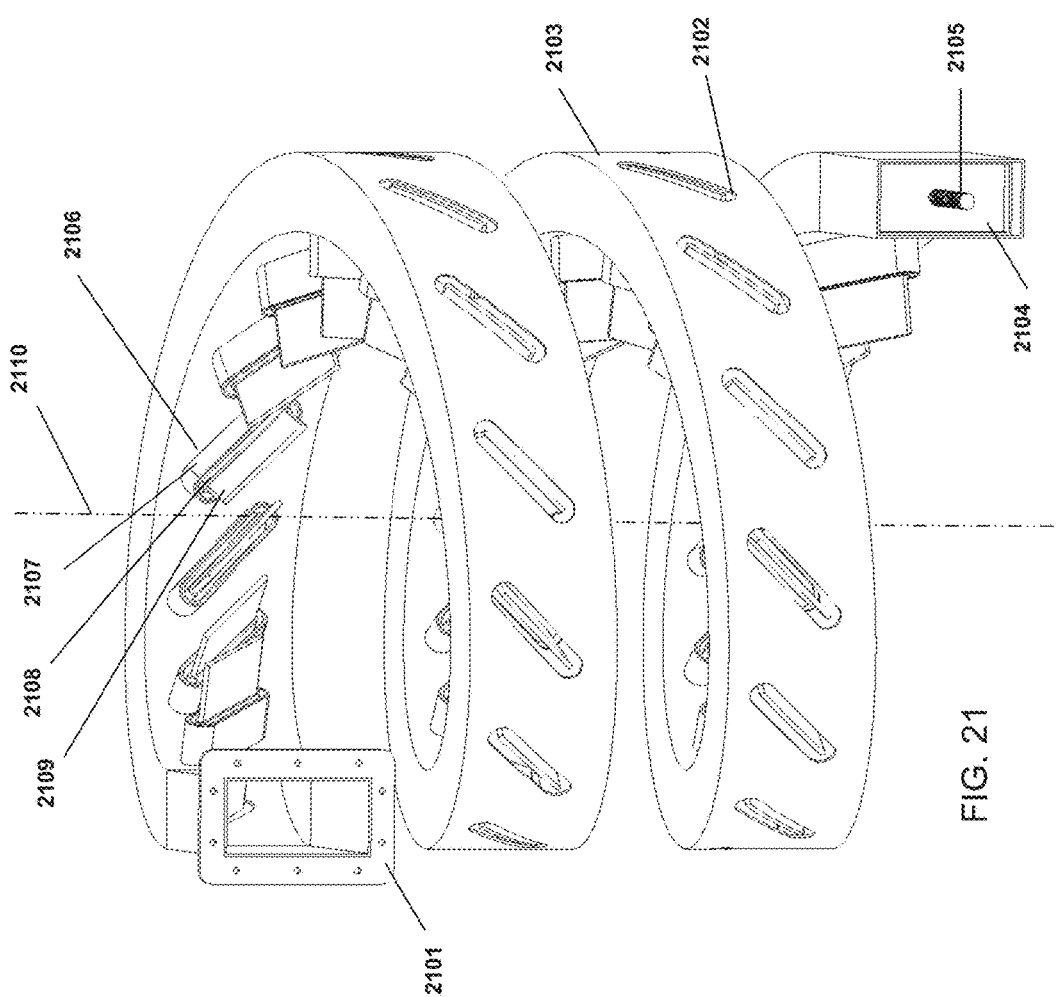
FIG. 21 illustrates an alternate arrangement of a wave guide allowing for a controllable uniform or directional emission of microwave radiation along a helical waveguide in accordance with one or more embodiments.

FIG. 21 shows another embodiment of a waveguide 2103 which has been shaped in a helical shape. Microwaves enter the waveguide at the flange 2101 and travel along the waveguide. The end of the waveguide is terminated again by a plunger 2104 that can be moved by an adjustment screw or mechanism 2105 in order to maximize the power emitted through the slots 2102. The waveguide shown in the figure could be used to emit microwaves into a helically shaped optional ECR chamber (not shown). In some embodiments that utilize such an ECR chamber, such an assembly can be used to create depositions on the inside of pipes as was shown, for example in FIG. 19. In some embodiments, the secondary sleeves 2109 are penetrated by one or more conduits to allow materials to pass thru to create a materials emission system (as, e.g., shown in FIG. 24) to allow material to be entered into an ECR chamber.

The waveguide could also be used to emit microwave radiation in an Omni-directional fashion such as used in (plasma) RADAR systems. It should be clear to those skilled in the art that the system of FIG. 21 could be used either with or without the secondary plunger assembly comprising the secondary plunger housing 2107, the secondary plunger 2108 and the secondary sleeve 2109. It should also be understood that the secondary plunger assembly can be adjusted to maximize or—if desired—minimize the power ejected through each slot. In some embodiments the secondary plungers are adjusted to create radially uniform emittance of radiation away from the central axis 2110. In other embodiments the secondary plungers are adjusted to create emittance in one particular direction and not in other directions. In some embodiments, the secondary plungers face towards the inside of the microwave tube (in the opposite direction as is shown in the figure). One advantage of such an arrangement is that microwave radiation can be highly concentrated along a primary axis of the system 2110. In another embodiment, such a concentration of microwaves can be used to generate a linear plasma region or to generate a deposition on a cylindrical object such as shown for example in FIG. 19.

Figure 22:
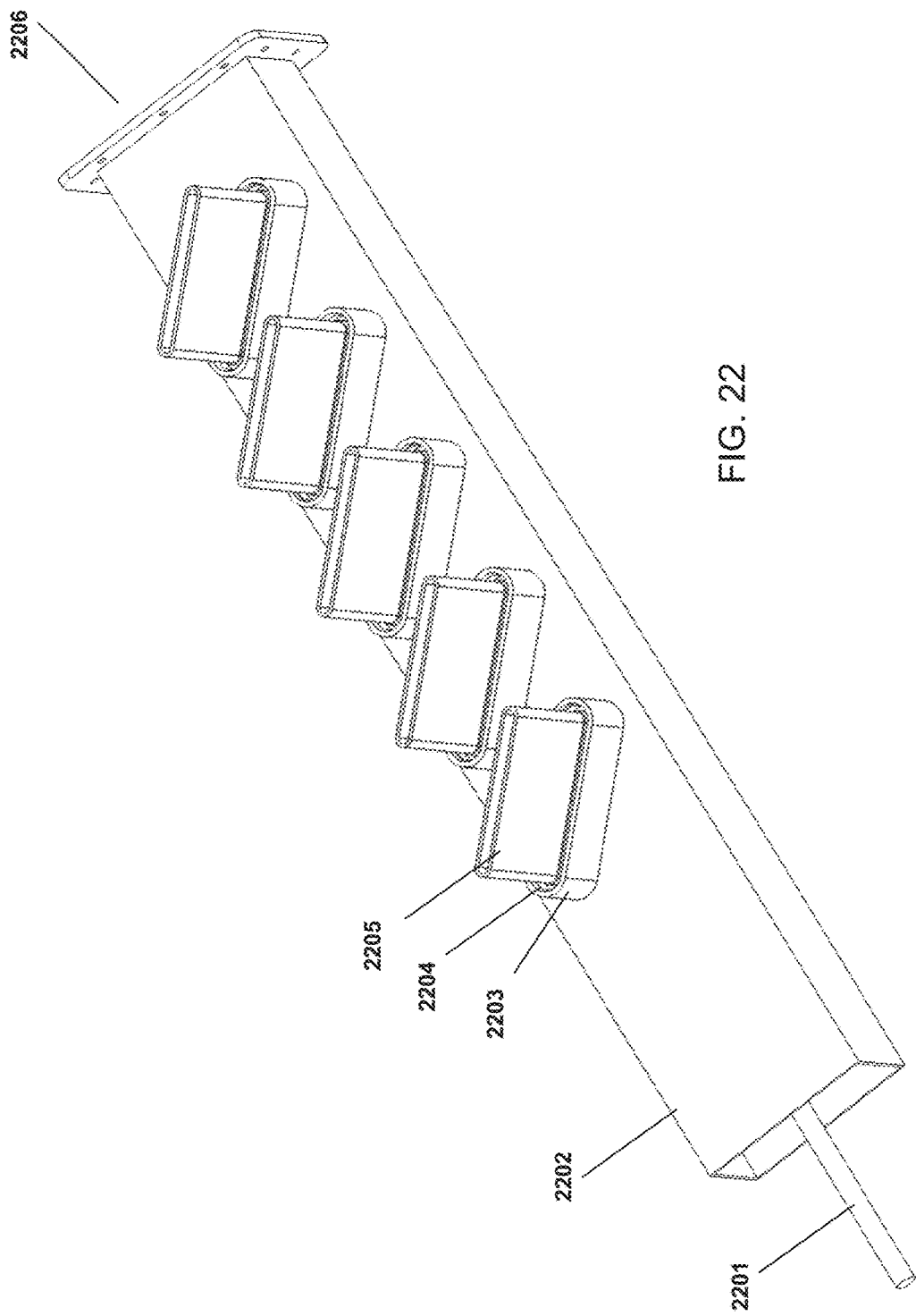
FIG. 22 illustrates a dual plunger waveguide system with material feed system in accordance with one or more embodiments.

In FIG. 22, microwaves are entered into a waveguide 2202. The microwaves enter the wave guide at 2206. The wave guide is terminated by a plunger (not shown) at the end of the waveguide. Adjusting the plunger through an adjustment mechanism 2201 allows the creation of wave maxima at or near a set of primary slots that are cut into the bottom of the waveguide (not shown). Opposite these slots a secondary plunger assembly is present. The secondary plunger assembly (the "ejector" assembly) includes a housing 2203, a secondary plunger 2204 which is movably connected to the housing and a sleeve 2205. The sleeve 2205 can have one or more passages cut through its center to allow for the convenient transport of materials to an optional plasma chamber (not shown in the figure). The sleeve 2205 can also be coated by a metal jacket or similar shield.

The first plunger is able to create a first standing wave inside the microwave guide along the primary axis of the microwave guide. Adjusting the first plunger allows tuning of the microwave guide to emit maximum through the slots. The secondary plunger 2204 is able to create a second standing wave in the chamber in a direction perpendicular to the primary axis of the wave guide and in the direction of the primary slots. The secondary plunger can be tuned to optimize a secondary standing wave to emit a maximum amount of power through a slot. The arrangement of a primary and a secondary plunger system can allow for the creation of a Surface Wave Plasma to exit around the exit of the primary slot.

Figure 23:
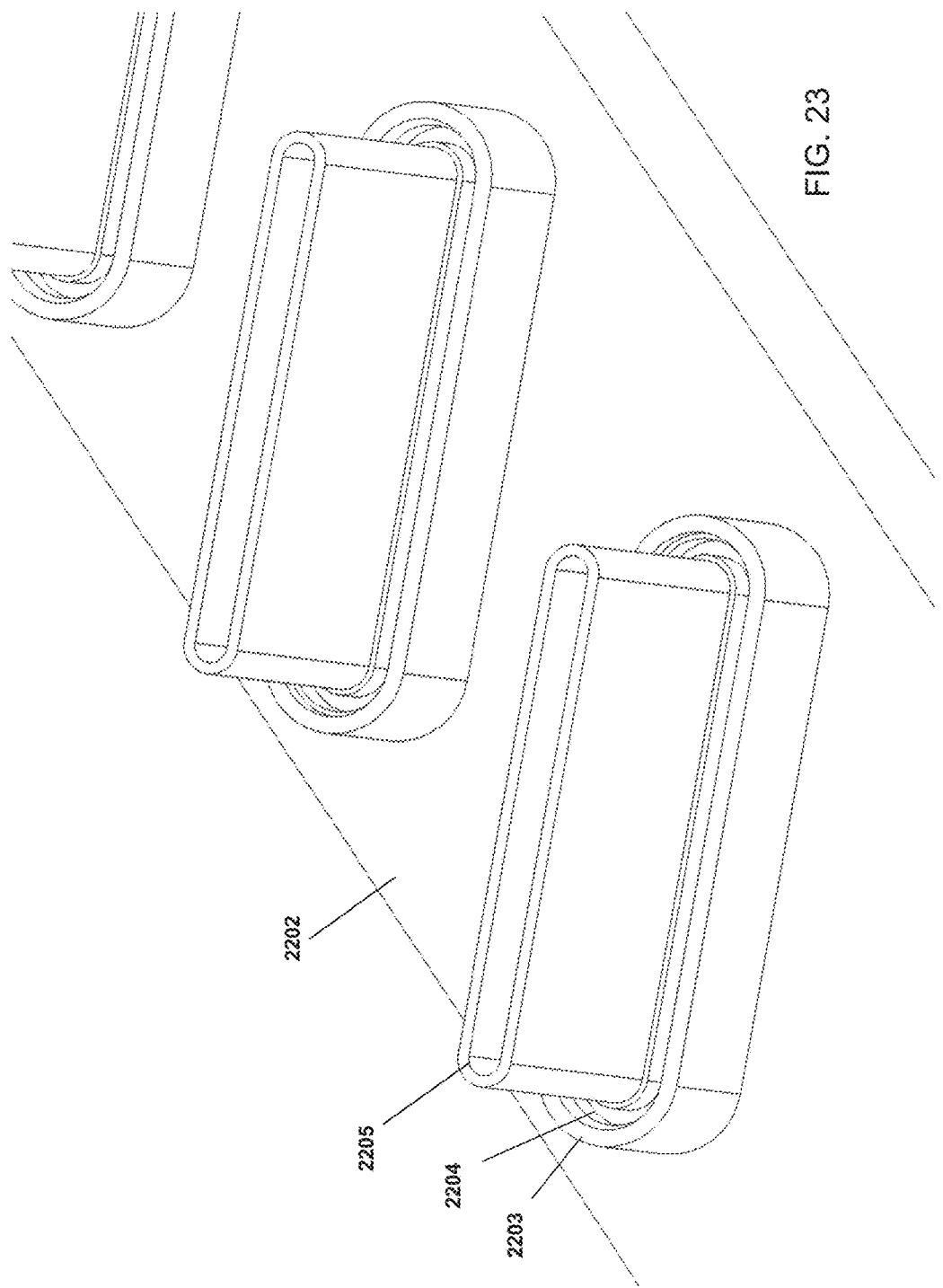
FIG. 23 shows a close-up view of a section of FIG. 22 illustrating the secondary plunger and material feed system in accordance with one or more embodiments.

FIG. 23 shows a close up view of the secondary ejector system from FIG. 22. In the figure, the housing 2203 is mounted to the wave guide housing 2202. The secondary plunger 2204 is movable mounted with respect to the housing 2204. A sleeve 2205 is mounted in a fixed orientation with respect to the housing 2203. The movable plunger 2204 can be adjusted in a direction perpendicular to the central axis of the wave guide 2202 in such a way that a secondary standing wave is create that is emitted on the side of the waveguide opposite the ejector assembly.

Figure 24:
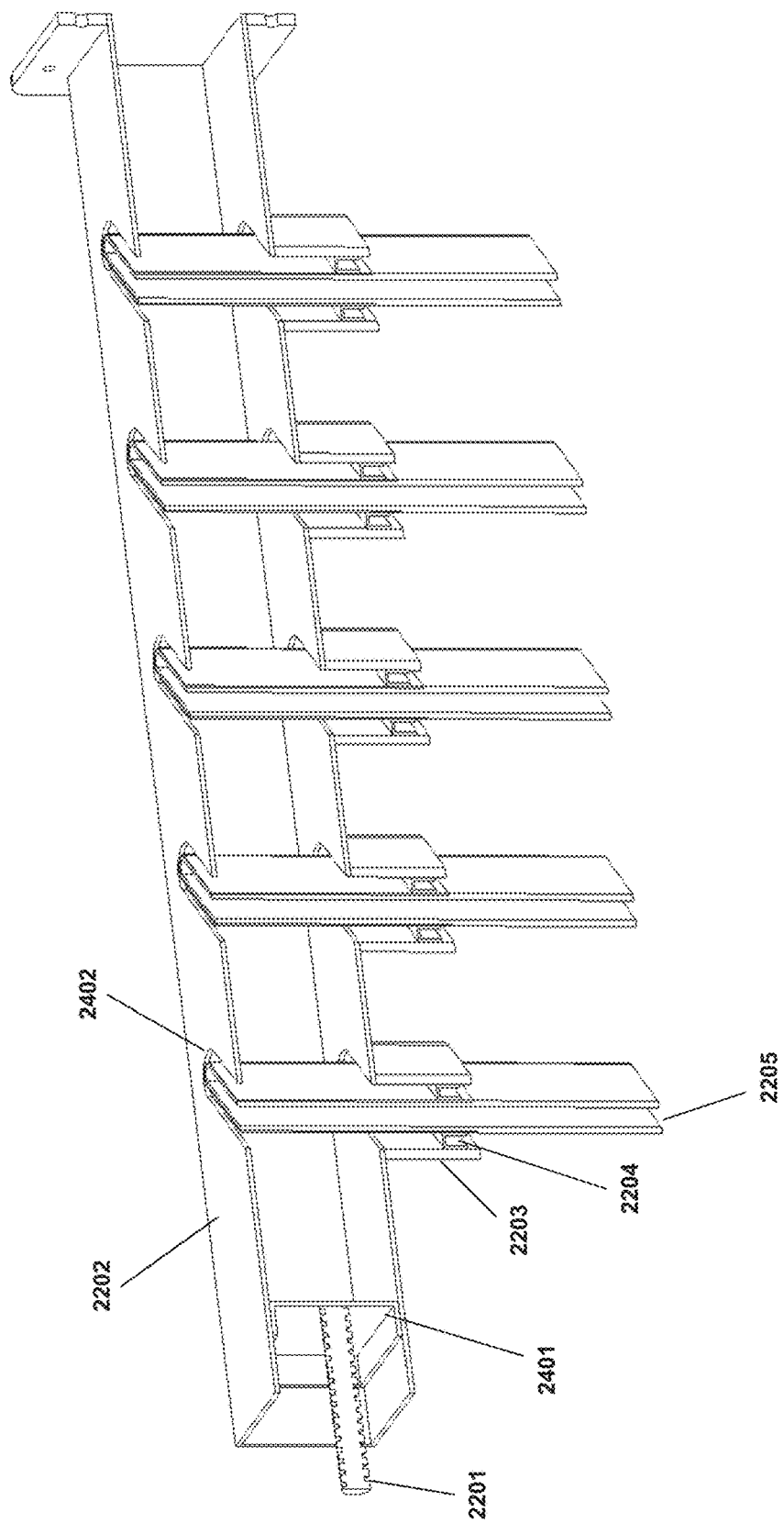
FIG. 24 illustrates a cross sectional view of the system of FIG. 22 allowing a view into the interior arrangement of the major components of a dual plunger microwave generator system.

FIG. 24 shows a cross sectional view of the system from FIGS. 22 and 23. As can be seen from the figure, the primary plunger 2401 can be moveable adjusted by the mechanism 2201. The primary slots 2402 are cut in the side of the waveguide. On the opposite side of the slots 2402, a secondary plunger assembly (the "ejector" assembly) is located that comprises the housing 2203, a secondary plunger 2204 and a sleeve 2205. The sleeve 2205 is sized so that a small gap exists between it and the cut in the wave guide. The small opening sets up strong electromagnetic fields between the sleeve and the edge of the slots 2402. Such an arrangement can lead to the ejection or launching of standing plasma waves also known as Surface Wave Plasma (SWP) waves.

Figure 25:
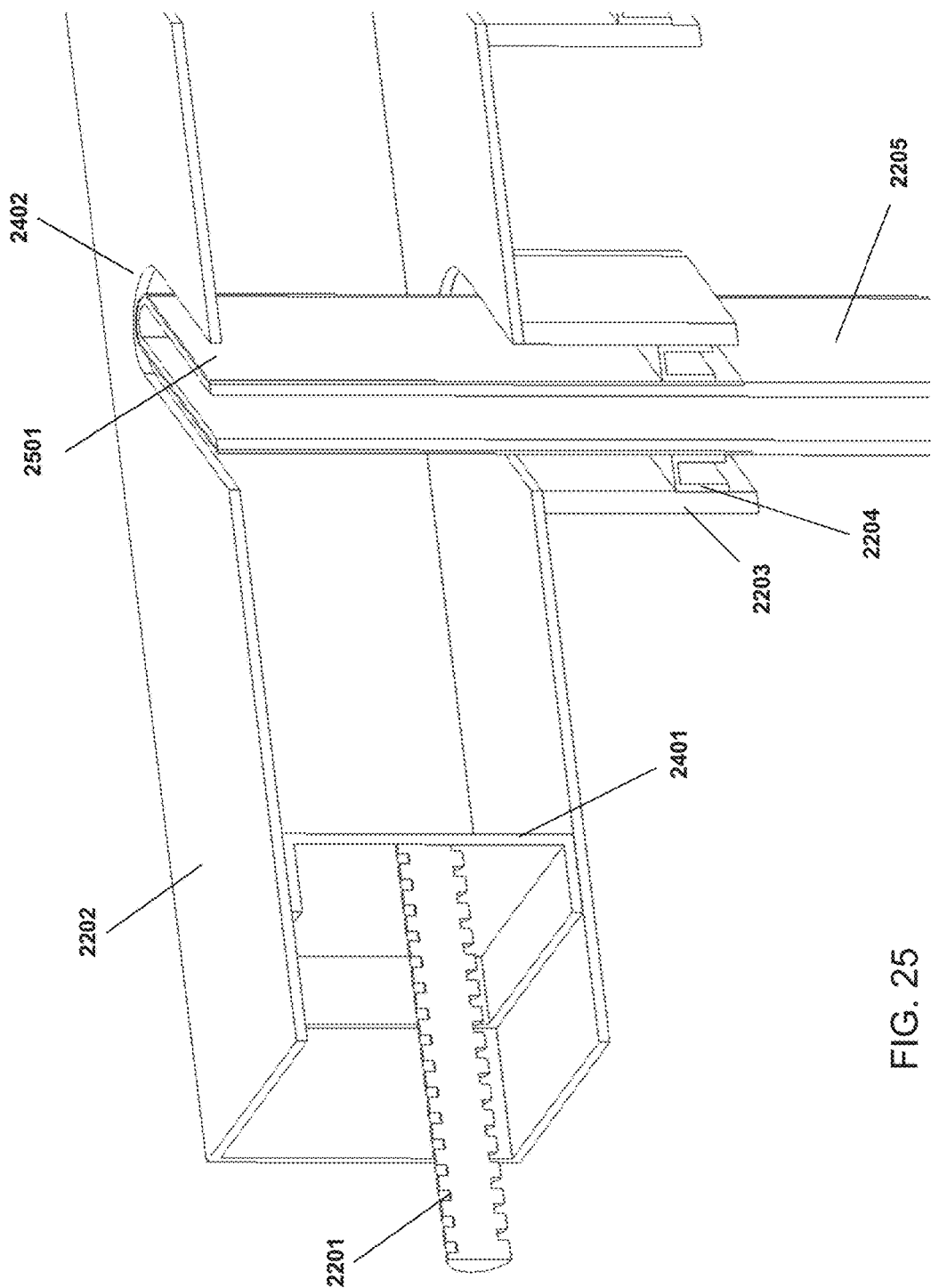
FIG. 25 illustrates a close-up cross-sectional view of the primary and secondary microwave plungers of FIG. 24.

FIG. 25 shows the cross sectional view of FIG. 24 in a close up so that the gap 2501 between the sleeve 2205 and the slot 2402 is more easily visible. It should be understood that multiple slots can be created in various shapes and sizes. It will also be clear that the sleeve 2205 can have one or several openings cut into it for the transportation of materials.

Figure 26:
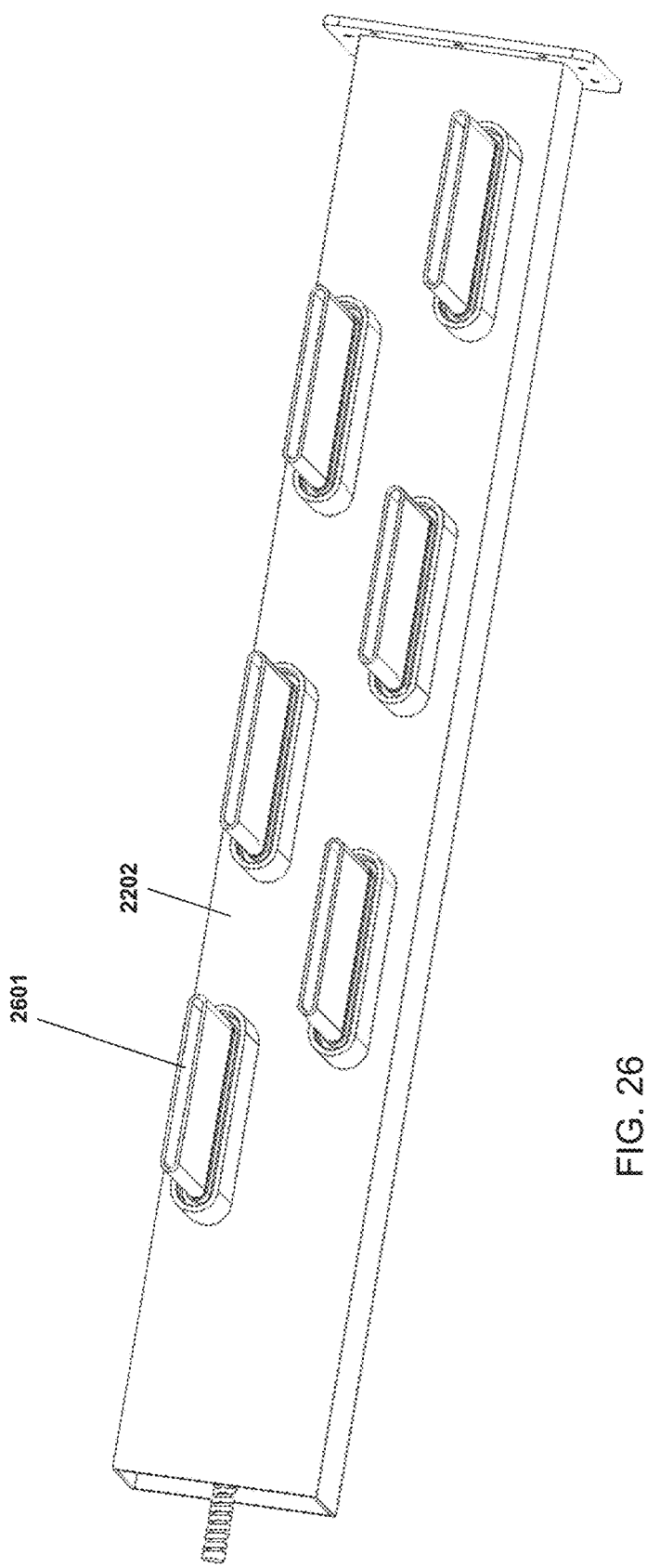
FIG. 26 illustrates an alternative embodiment of the present invention with the orientation of the secondary plunger and material injection systems along a primary axis of the waveguide.

FIG. 26 shows an arrangement of ejector assemblies 2601 that are arranged in two rows along the major axis of the wave guide 2202. In this arrangement the ejectors will each eject a Surface Wave Plasma jet on the opposite side of the surface that the ejectors are mounted to.

Figure 27:
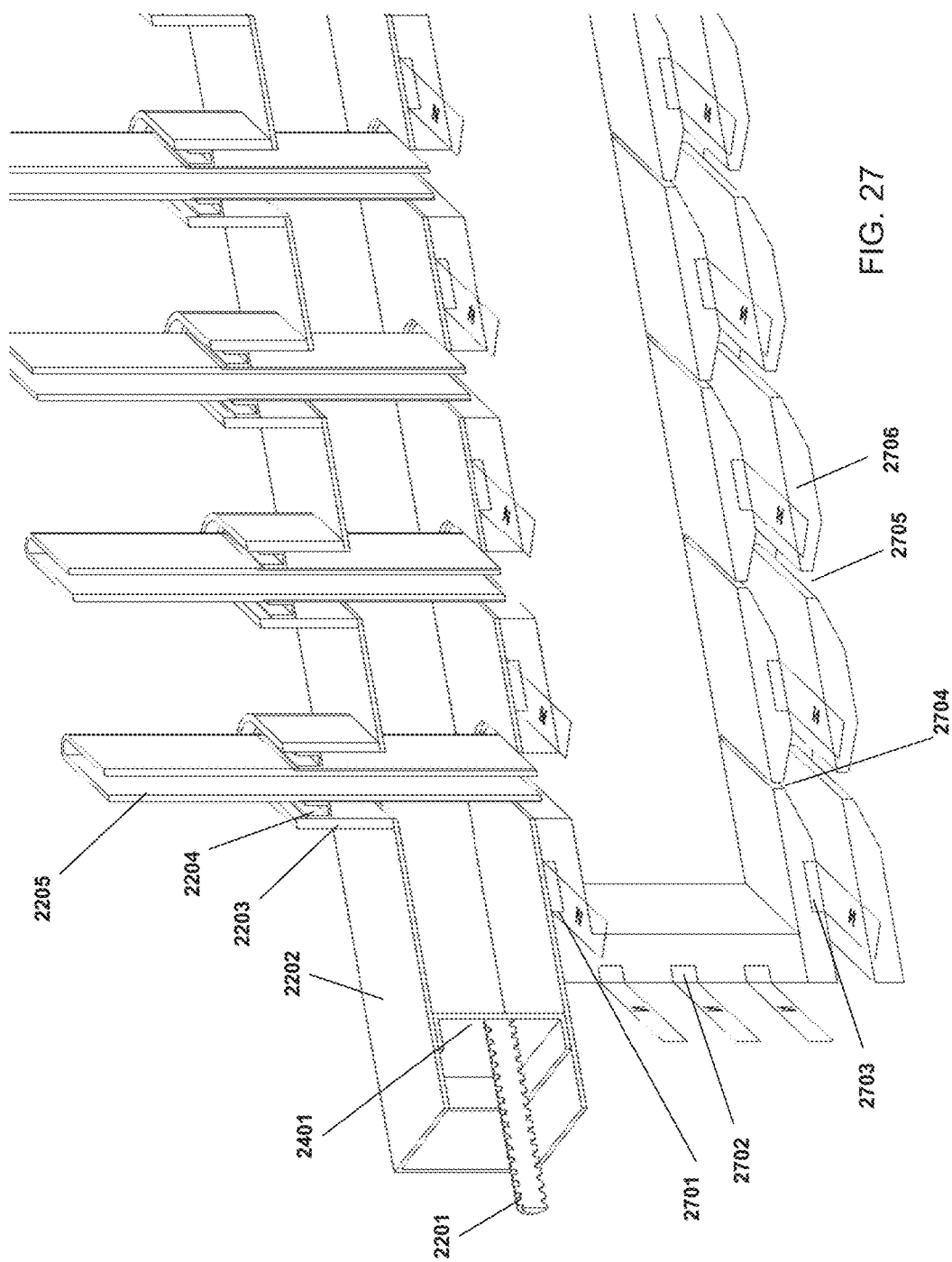
FIG. 27 illustrates a cross sectional view through an assembly of the dual plunger microwave system and an ECR plasma chamber in accordance with one or more embodiments.

FIG. 27 shows a cross sectional view of the wave guide and plunger assembly of FIG. 22 combined with an ECR plasma chamber. The wave guide plunger 2401 and adjuster 2201 set up a primary standing wave inside the wave guide 2202. The ejectors (2203, 2204 and 2205) set up a secondary standing surface wave plasma that is augmented by the ECR function of the plasma chamber. The combination of the two effects allows for a much stronger mixing and emission of higher radiation from the plasma chamber as well as an easier ignition of the initial plasma discharge, however it should be understood that the optional magnets 2701, 2702, and 2703 are not required to create a plasma, rather, the Surface Wave Plasma (SWP) effect is adequate to ignite and maintain a plasma discharge in the chamber. The magnets 2701, 2702, and 2703 can be arranged in such a way that the magnetic field strength is high near the plasma chamber walls, and significantly lower near the plasma chamber's center. Optional extraction slots 2704 allow for the creation of well-defined beam profiles as well as for an increase in pressure inside the plasma chamber. An optional secondary extraction slot 2705 cut into a plate 2706 can be deployed with a proper electrostatic voltage applied to allow for the extraction of ions or electrons from the plasma region.

FIGS. 28A and 28B show another embodiment of a dual plunger system, wherein the primary plunger 2201 sets up a standing microwave along the primary axis of a microwave guide 2202. The secondary ejector assemblies 2801 are arranged in such a way as to generally maximize the microwave emission from slots cut into the side of the waveguide. In such an arrangement microwaves have the potential to emit radiation much more strongly from the slots as compared to a system that does not employ the secondary ejector system.

Figure 29:
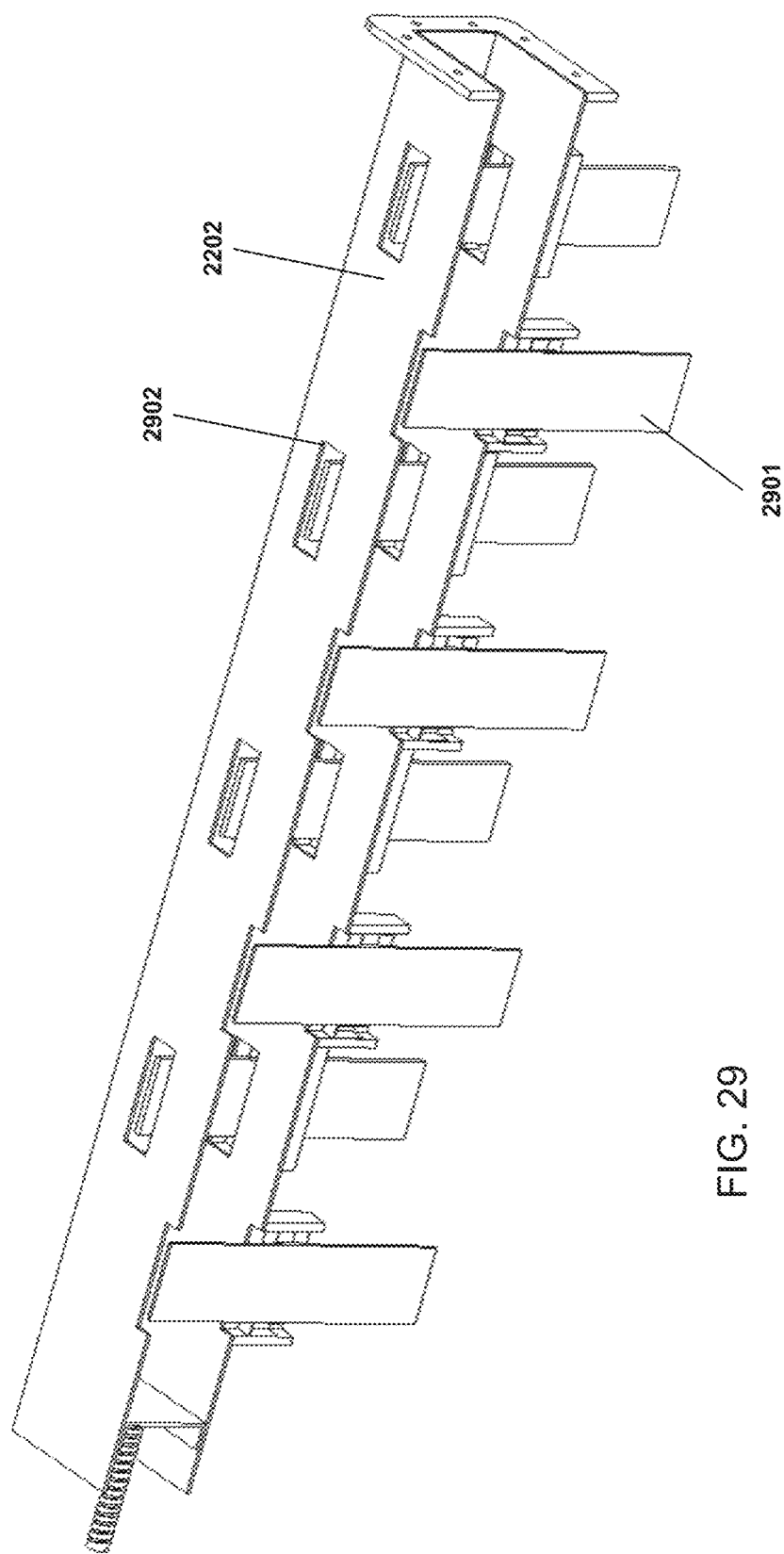
FIG. 29 is a cross-sectional view of the microwave system of FIG. 28.

FIG. 29 shows a cross sectional view of the arrangement of FIG. 28. The sleeves 2901 are functioning as secondary antennae to help increase the emission of microwaves from the slots 2902. Such an arrangement may be employed to increase the operating efficiency of microwave systems such as used for RADAR.

Figure 30:
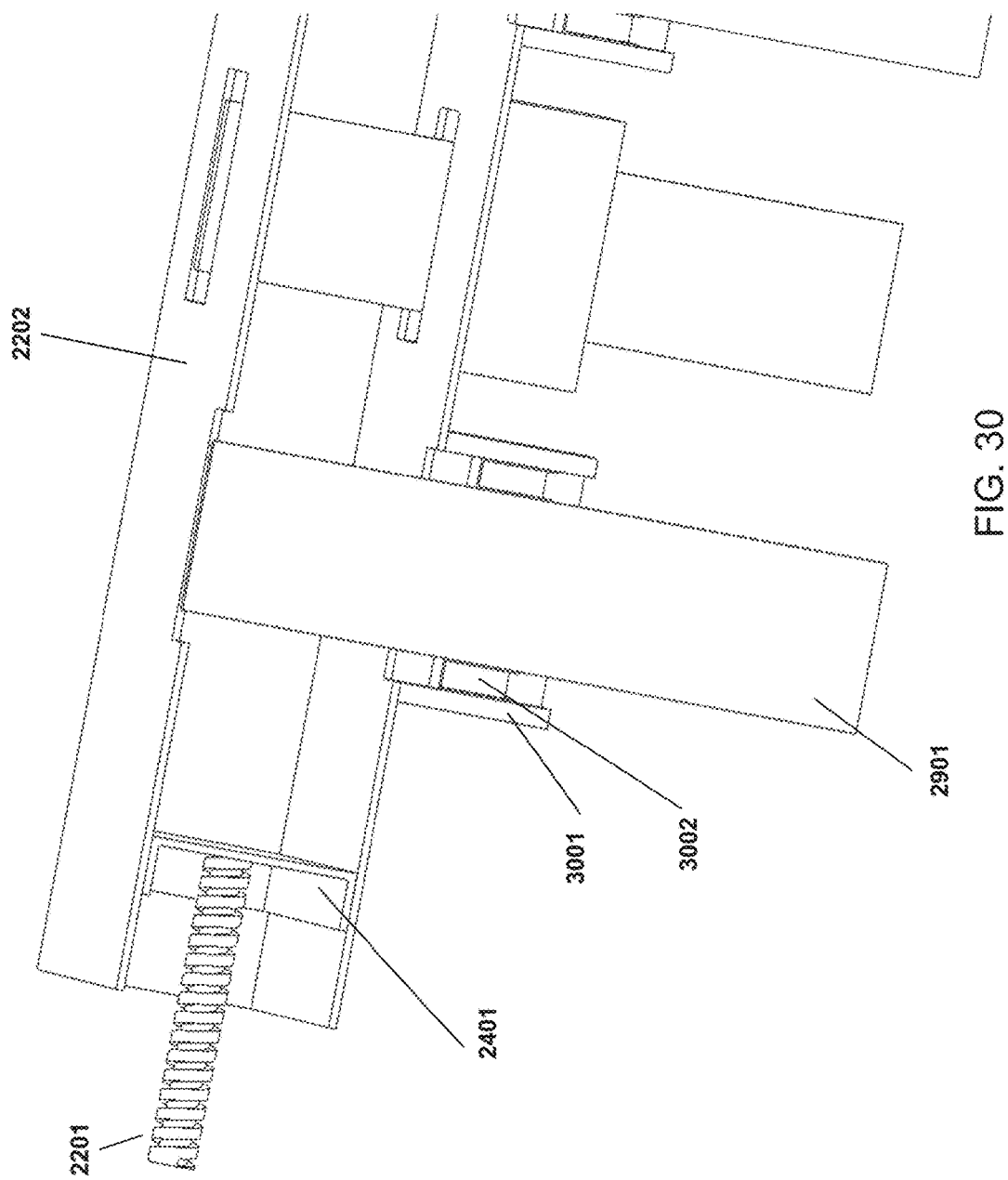
FIG. 30 is a close up view of the dual plunger system of FIG. 28.

FIG. 30 shows a close up of the cross sectional view of FIG. 29. The secondary ejector assembly comprises a housing 3001, a secondary plunger 3002 as well as the sleeve 2901. Sleeve 2901 can also be moveably located to help optimize the emission of microwave radiation from the microwave waveguide 2202.

Figure 31:
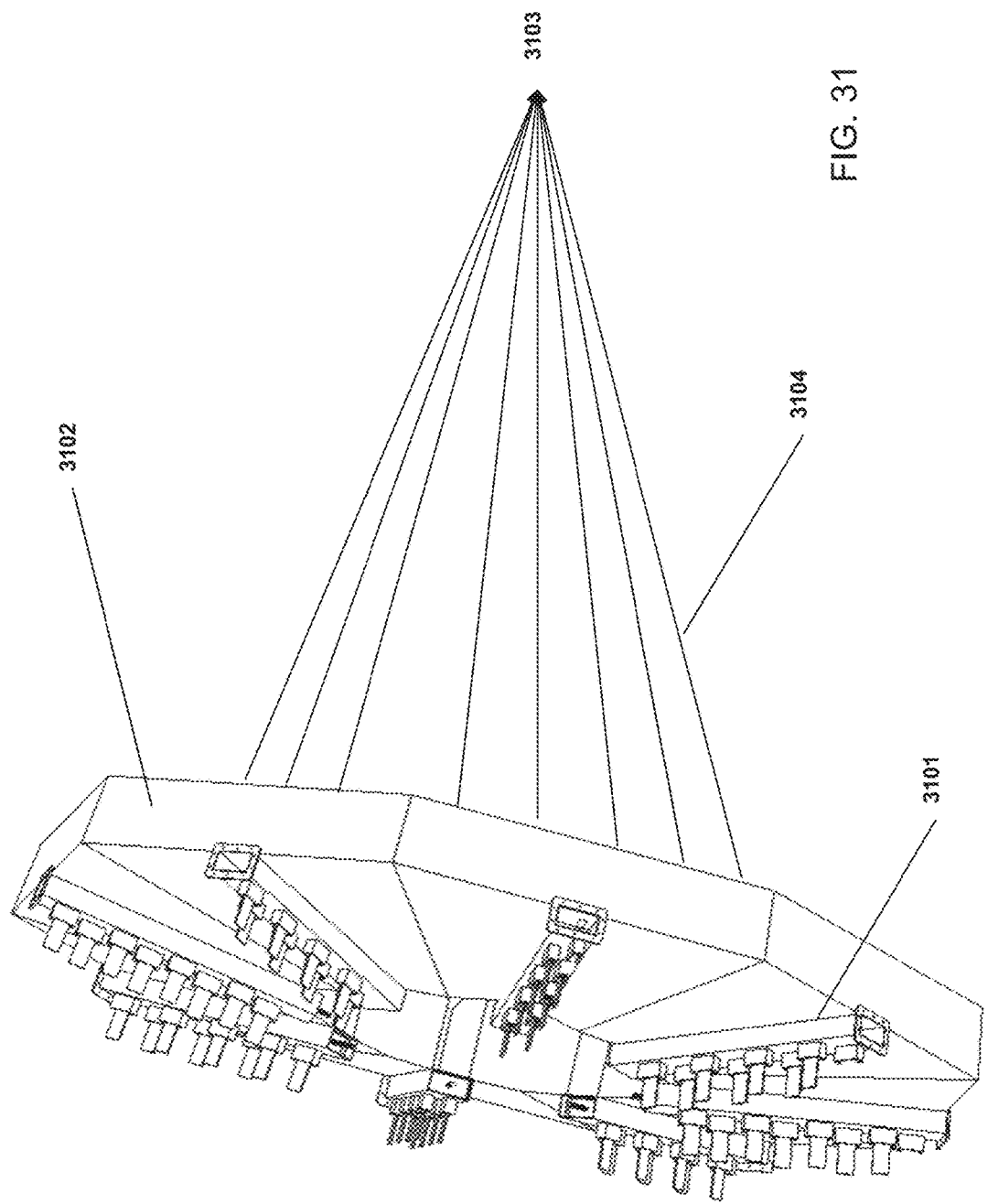
FIG. 31 illustrates a system combining multiple microwave or plasma sources arranged so as to provide a concentrated beam location in accordance with one or more embodiments.

FIG. 31 shows a set of microwave guides 3101 positioned on a mounting mechanism or frame 3102. The mounting mechanism or frame is positioned in such a way that the exit slots of the microwave guides face towards a common focal area 3103. Microwave or plasma beams 3104 emitted from the microwave guides 3101 all converge on one or more focal areas. It should be understood that many arrangements or patterns can be conceived each with particular advantages for aiming radiation at a target area or target object.

Figures 32A, 32B:
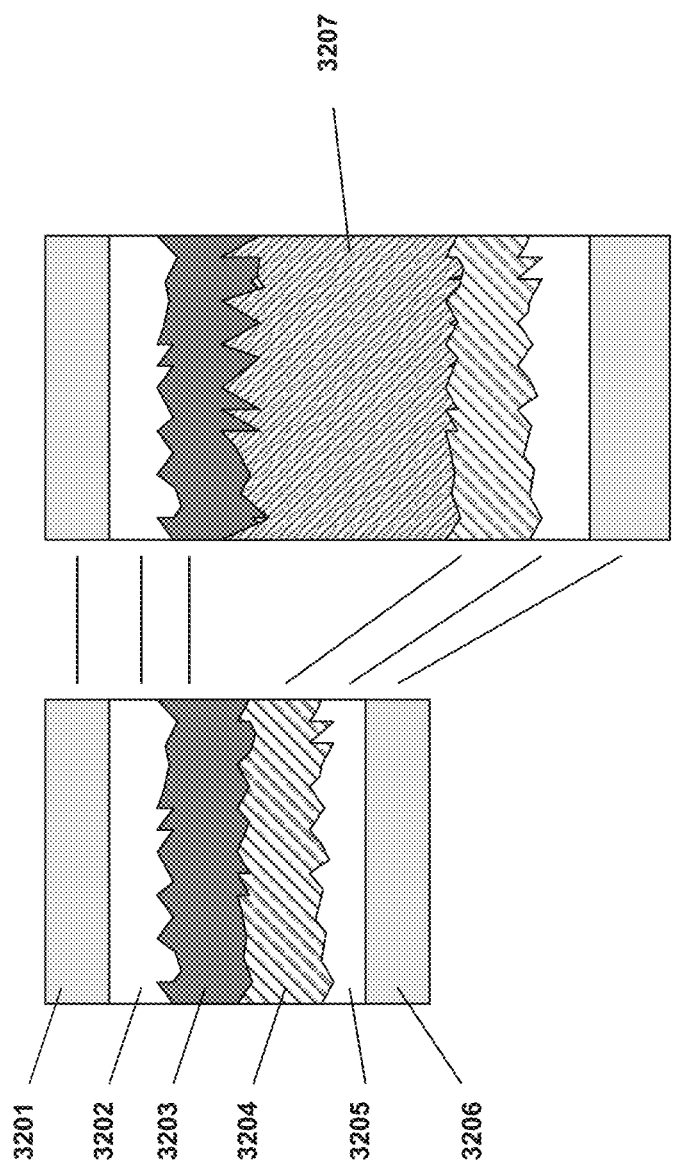
FIGS. 32A and 32B show a layered structure of a thin-film photovoltaic system in accordance with the prior art.

FIGS. 32A and 32B depict the common layers used in a thin film photovoltaic structures as are known in the art. In the figure labeled 32A, the layer 3201 is typically a transparent glass cover layer. Layer 3202 is commonly a Transparent Conductive Oxide or TCO layer used to create a conductive film on the back of the glass. Layer 3203 is an amorphous Silicon (a-Si) layer, usually deposited with a high concentration of Hydrogen. A back-side contact 3204 provides a metallic, electrically conductive layer. An encapsulation layer 3205 is usually a polymeric film that provides adhesion and environmental sealing to the back glass 3206. Incident photons pass through the front glass and TCO layer and can be absorbed by the silicon layer wherein the photon may create an electron hole pair. The structure of layers is such that these charges can be collected on the front and rear contact layers, where they create a voltage that can be used to power devices.

As shown in FIG. 32B, the layers are augmented by an additional layer 3207 also known as a Micromorph layer. A Micromorph layer usually comprises micro-crystalline silicon, which is formed using a CVD processes. A Micromorph layer allows photons of longer wavelengths that are not captured in the amorphous silicon layer, to potentially still be captured, thereby increasing the overall efficiency of photon-energy conversion. It is well known in the art that additional layers can be designed and integrated, each with the objective of converting a different section of the solar energy spectrum to electricity.

Such thin film structures however, still mostly require vacuum processing, which as discussed before uses expensive equipment, and has usually the disadvantage of slow growth rates, particularly for thick layers such as the Micromorph layer.

Figure 33:
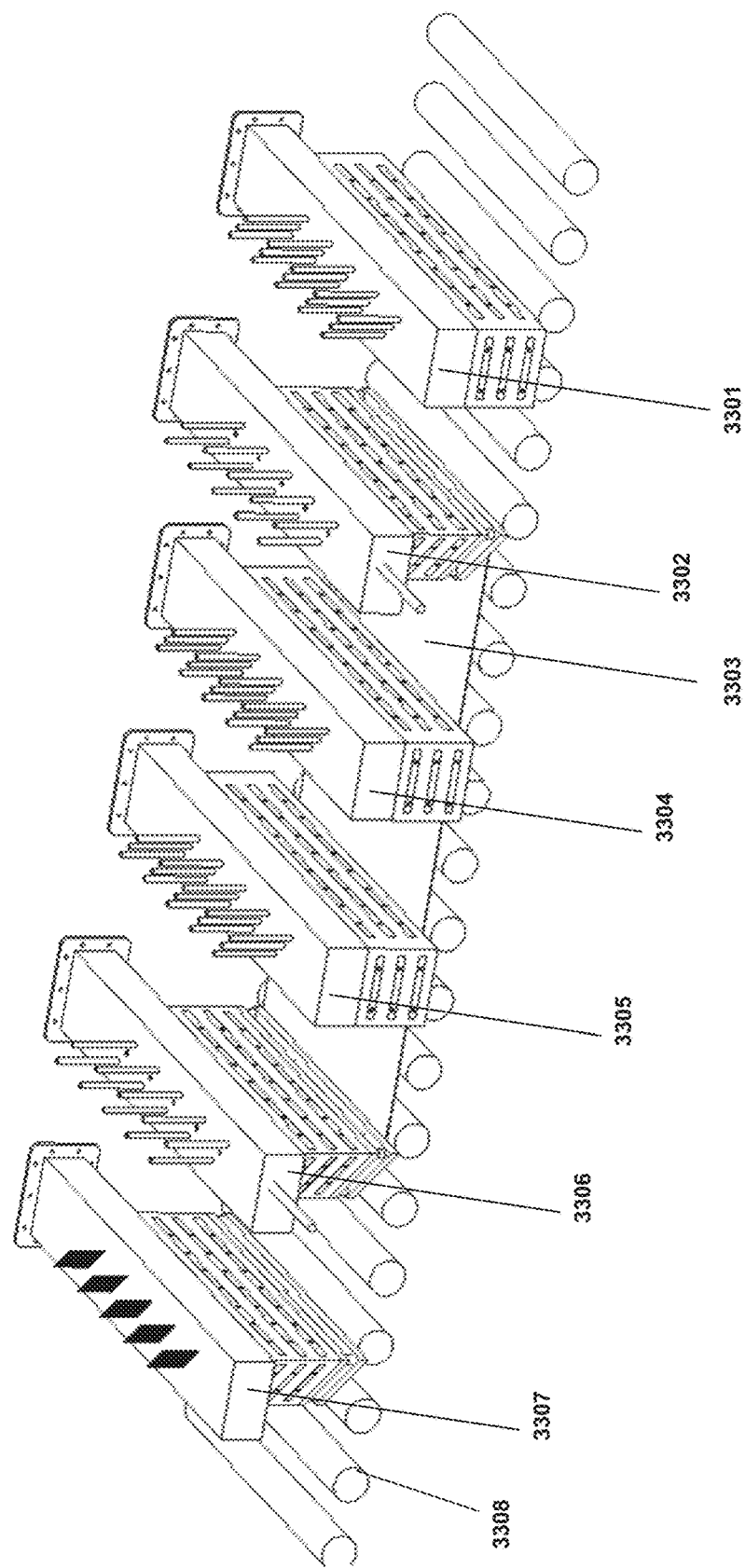
FIG. 33 illustrates a multistep deposition system using multiple configurations to create a multilayer deposition structure in accordance with one or more embodiments.

FIG. 33 illustrates a series of plasma sources in a variety of configurations set up to construct a photovoltaic structure in a very simple and continuous process flow in accordance with one or more embodiments. The source 3301 could be set up as a source for the deposition of a TCO layer on a substrate 3303. Source 3302 could be set up to deliver a doped silicon deposition to the substrate, whereas source 3304 may provide an intrinsic silicon layer. Subsequently source 3305 may provide another silicon layer that is later doped by a different material in source 3306. Finally source 3307 may provide small printed contact lines or some other metallic contact layer to complete the structure. It should be understood that different sequences or variations of sources can be conceived, and it should also be clear that such sources can provide a partial set of process steps where other steps may be performed in traditional deposition equipment or process equipment.

In some embodiments, such sequence of sources deposits the layers in a similar order and thickness as provided in FIG. 32.

In another embodiment, a set of sources is set up by way of example to deposit layers of iron-oxide powder, which can be subsequently heated to form small droplets on the surface of a material. Another second source can provide a flow of heated hydrocarbons for the creation of what is commonly known in the art as carbon-nanotubes. Such manufacturing processes can be very useful in the creation of high quality capacitors and batteries.

It should be understood that numerous films can be created in an appropriate sequence to coat a variety of substrates.

Referring again to the figure, substrates 3303 can be transported underneath the series of sources by convenient means such as rollers 3308 or other methods of material transport. It should be understood that continuous films or webs can also be a potential substrate for deposition by such deposition and treatment sources.

Figure 34:
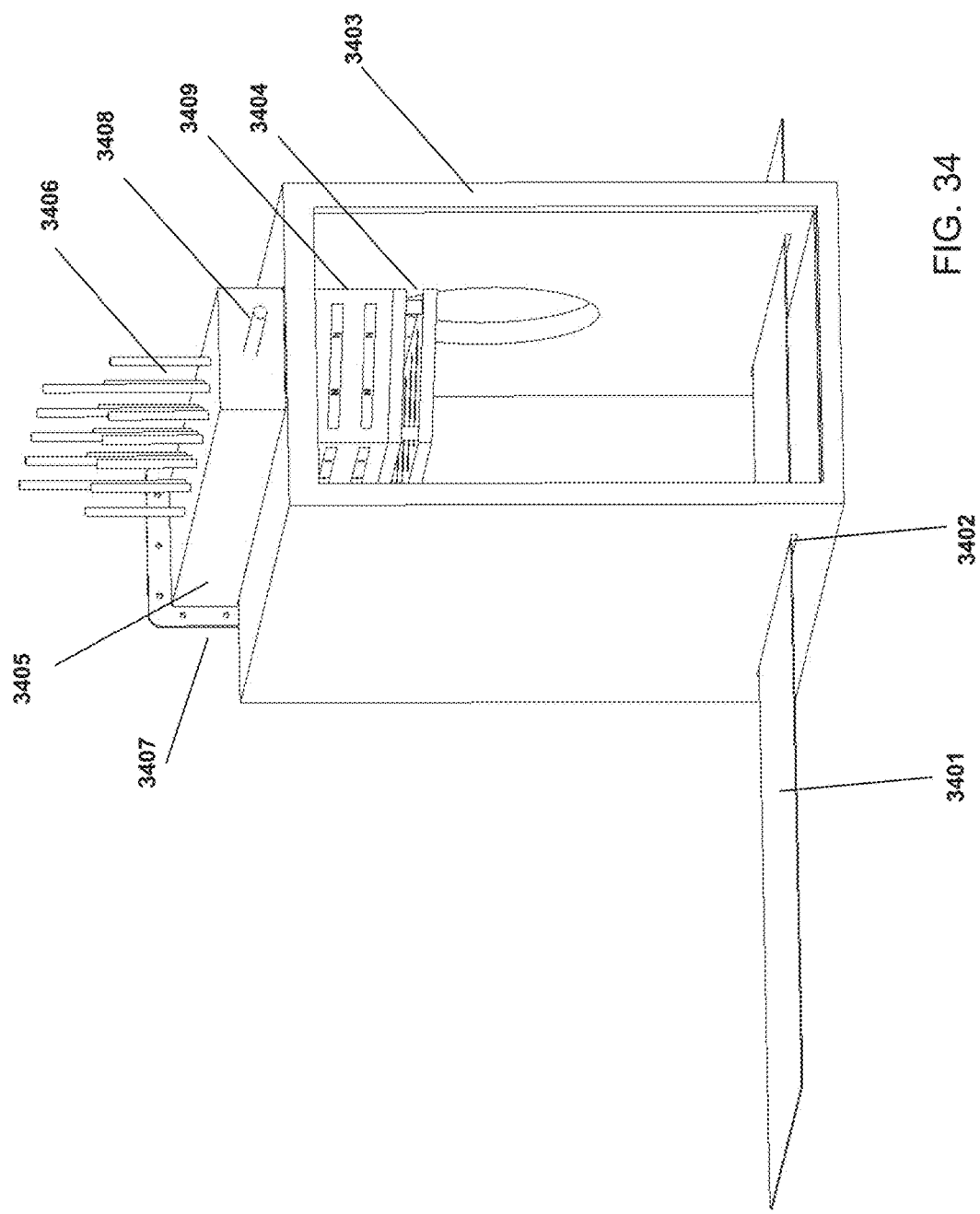
FIG. 34 demonstrates the deployment of a plasma system in accordance with one or more embodiments in a vacuum chamber for treatment of materials.

In FIG. 34 a plasma source in accordance with one or more embodiments is mounted in a portion of a vacuum chamber 3403. Microwaves enter a micro wave guide at a flange 3407 and are ejected through openings in the wave guide 3405 into a plasma chamber 3409. As described before, the microwave can be tuned for maximum power output by a plunger assembly 3408, and materials can be injected by an injection system 3406. An optional set of extraction plates 3404 allows for the creation of an ion or electron curtain such as is commonly used in applications for ion treatment or ion implantation of substrates. Materials such as sheets of glass 3401 or films or other suitable substrates can be moved into the treatment region for processing through the openings 3402.

Figure 35:
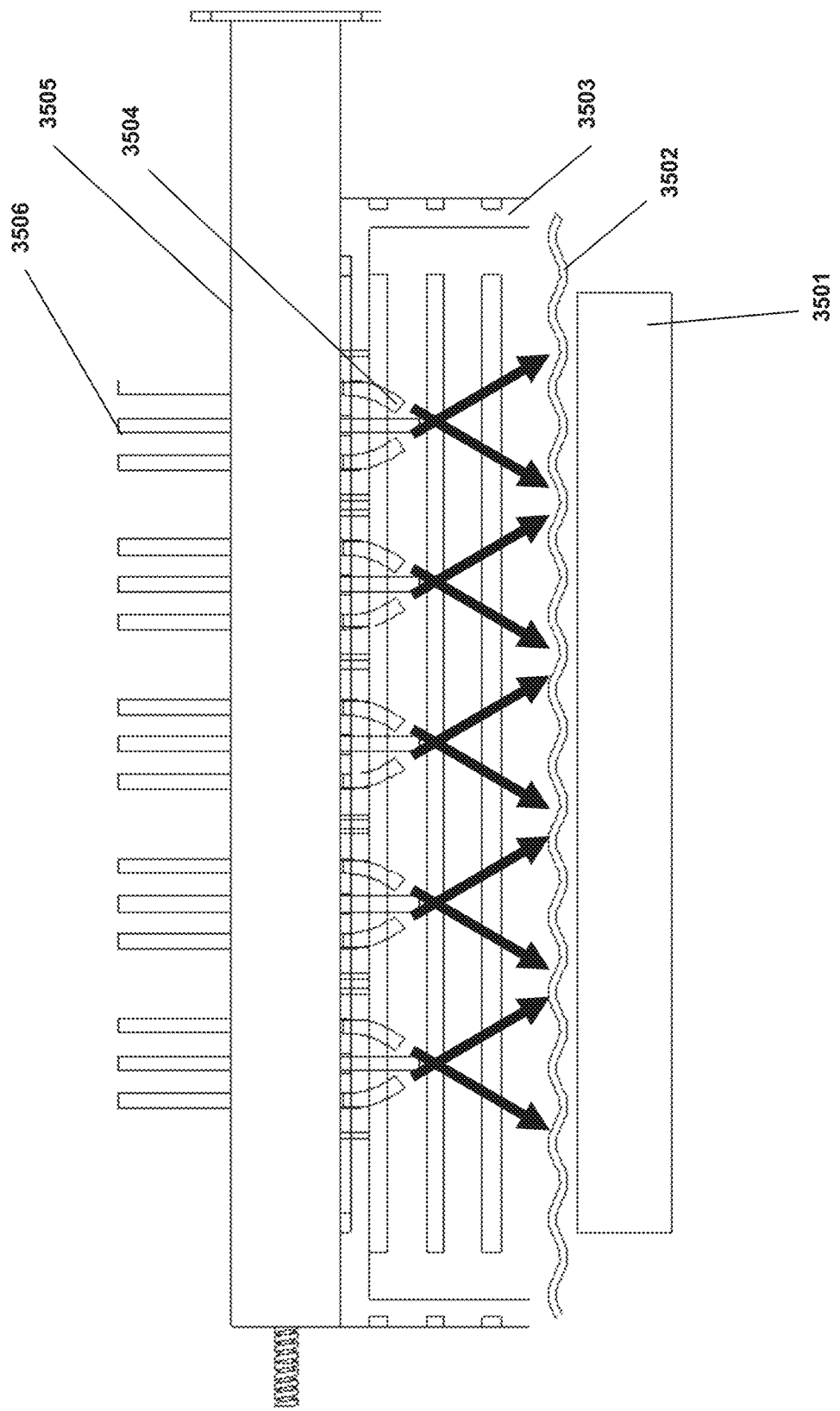
FIG. 35 illustrates a "see through" image showing a variation of the plasma system in accordance with one or more embodiments using pre-bend exit elements of the material feed system to allow for deposition on uneven surfaces.

In FIG. 35, a cross sectional view is shown wherein the material transport pipes 3506 are going through a microwave guide 3505 into a plasma chamber 3503. The ends of (some of) the pipes 3504 are mechanically bent to direct streams of material into the plasma at a suitable angle. A substrate 3502 is transported underneath the plasma treatment source by rollers 3501 or any other suitable transport system. The angle of the bent pipes 3504 is designed such that the materials deposit uniformly across a wavy surface of the substrate 3502. In traditional coating systems it is sometimes hard to get uniform coating coverage across a non-planar surface, resulting in different and oftentimes undesirable characteristics of the deposited film. The present system is able to shape the direction of the deposition to conform to surface contours such as shown in the figure. The use of bent pipes allows for a more uniform deposition without the need for complex movement of the source or the substrate.

Figure 36:
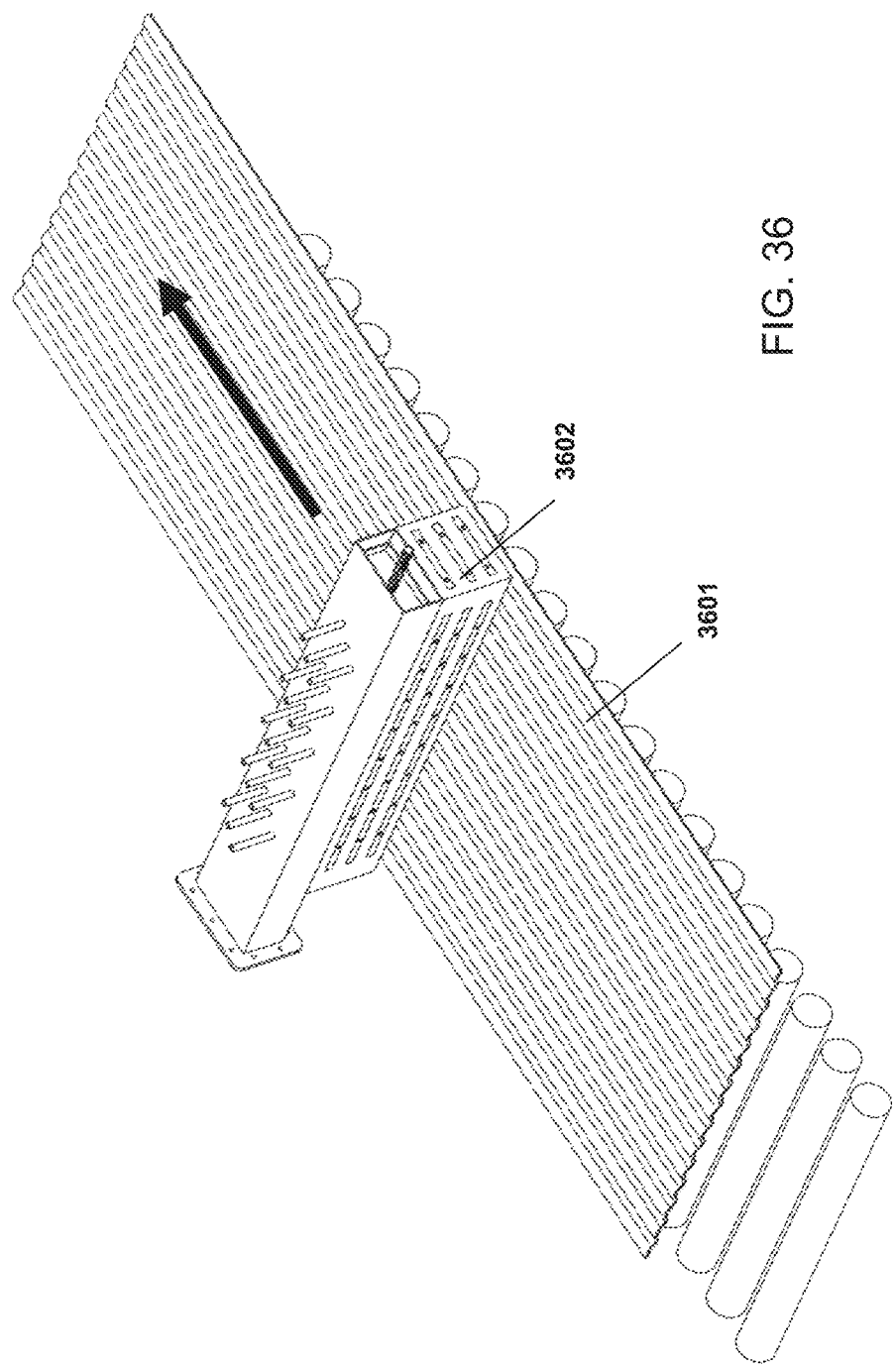
FIG. 36 shows an implementation of FIG. 35 into a system for coating wavy or corrugated surfaces in accordance with one or more embodiments.

FIG. 36 illustrates how a plasma source 3602 can be used to treat a large wavy surface such as a wavy glass plate 3601 in accordance with one or more embodiments. It should be understood that multiple sources and various geometries of surfaces can be employed to coat multiple layers on non-planar surfaces. It should furthermore be understood that the combination of a shapeable wave guide base plasma source that can be combined with a deposition system that is shapeable as well will allow for low cost, high throughput uniform coatings with a much better control over both uniformity and deposition contamination as compared to systems that are currently in use today.

Figure 37:
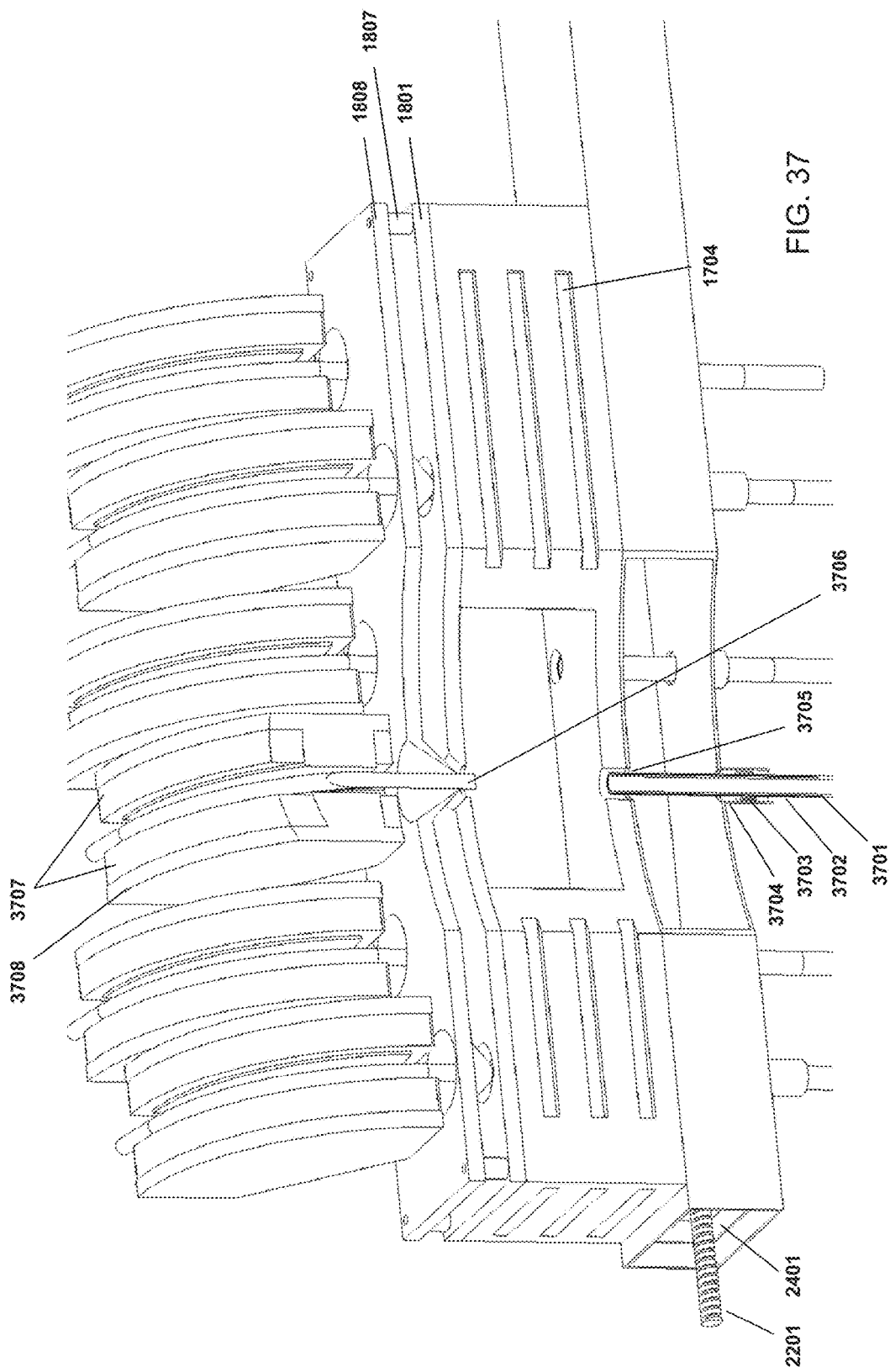
FIG. 37 illustrates an embodiment in which the ejected ions are deflected using a number of magnets in order to separate out various differences in ion mass and charge.

FIG. 37 illustrates a plasma source in accordance with some embodiments further equipped with mass/charge separation system using magnets. As is commonly known, ions can be mass separated using magnetic fields perpendicular to the ion's trajectory. Ions with different masses and/or different charge (single, double or multiple charged ions) will follow different trajectories in such a magnetic field. In the figure, each of the extraction holes in the extraction plate 1808 line up to holes in the ECR source cover plate 1801. The extraction plate 1808 is held at an appropriate voltage to extract ion beams 3706 through the holes in the plates. The injector assembly in this case can comprise a cylindrical pipe 3701 that is lined with a sleeve 3705. The secondary plunger 3703 is movably connected between the sleeve 2205 and the housing 3704. The plasma beam exiting from the ejector is aimed directly at the openings in the extractor plates. As illustrated, the ion beam is diverted by electromagnets (or permanent magnets in some embodiments) comprising pole piece 3708 and coils 3707. The thus created electromagnetic field bends the ion beam that was extracted from the plasma.

Figure 38:
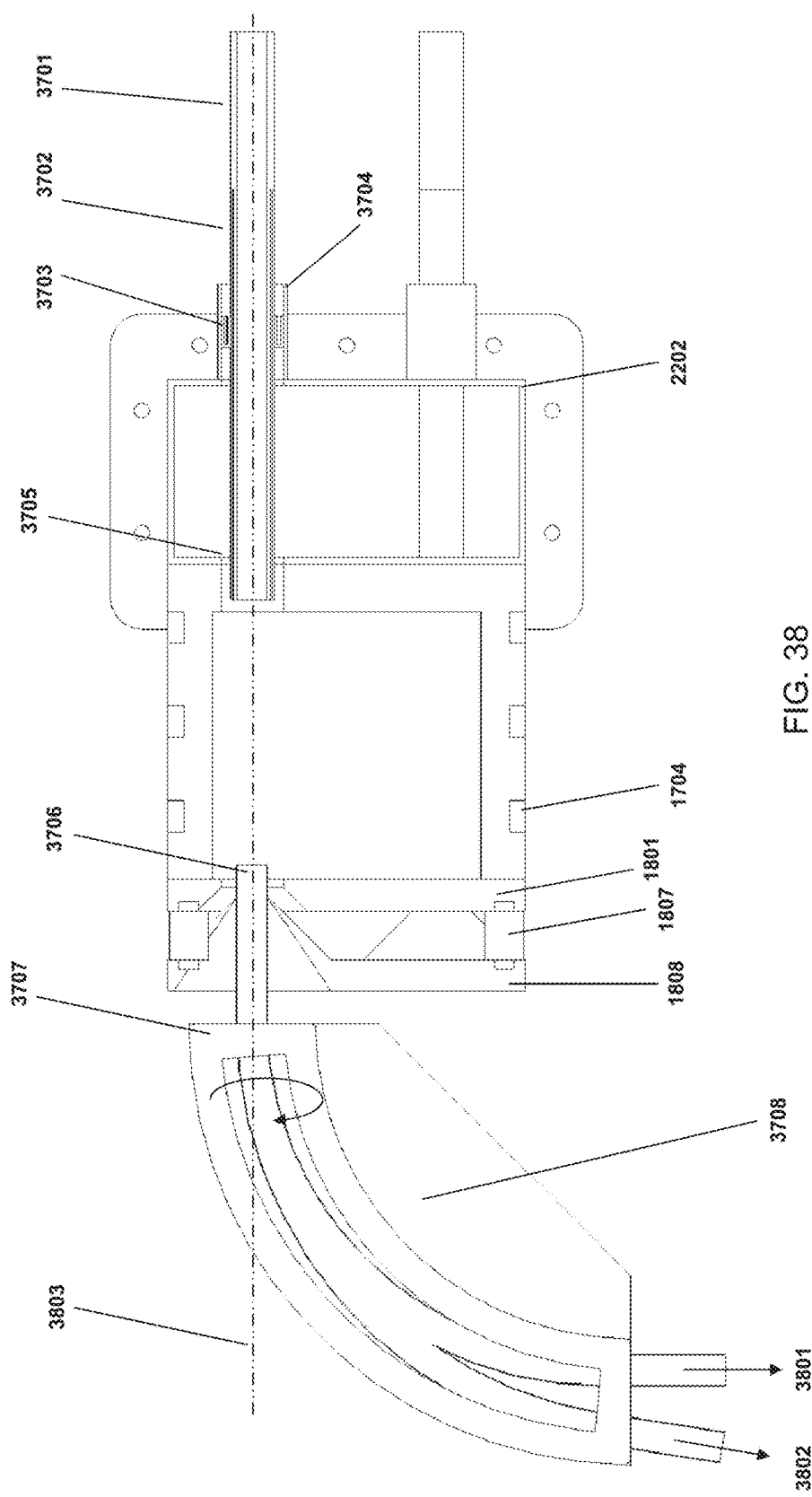
FIG. 38 is a cross-sectional view of the drawing in FIG. 37, wherein the injector and the exiting ion beam can be seen going through the deflector magnet.

FIG. 38 shows a cross sectional view through the extraction plane of FIG. 37. As can be seen in the figure, the magnet assembly is made of pole piece 3708 and coils 3707 and can be rotationally mounted around the centerline 3803. The ion beam 3706 that is extracted enters the magnetic field created by the coils 3807. Because the extracted beam will contain ions of different masses, such an arrangement causes the lighter ions to follow a tighter trajectory and exit the magnet as indicated in 3801, whereas heavier ions will follow a larger radius and exit the system around 3802. It will be clear to those skilled in the art that such an arrangement can be used to perform isotope isolation such as is needed for the purification of Uranium for fuel enrichment. One advantage of the embodiment of FIG. 38 over other methods currently in use is that the plasma density and separation will result in much larger material flows and hence in a faster system for isotope isolation.

It should also be clear to those skilled in the art that the above arrangement could be used to create propellant beams comprising ionized matter such as can be used to direct space craft. The magnets could be rotationally mounted around the apertures in the extraction plate such that the ion beams can be set to point in any direction necessary to drive the space craft. The force exerted on the space craft will be in the opposite direction of the exiting ion beams 3801 and 3802.

Figure 39:
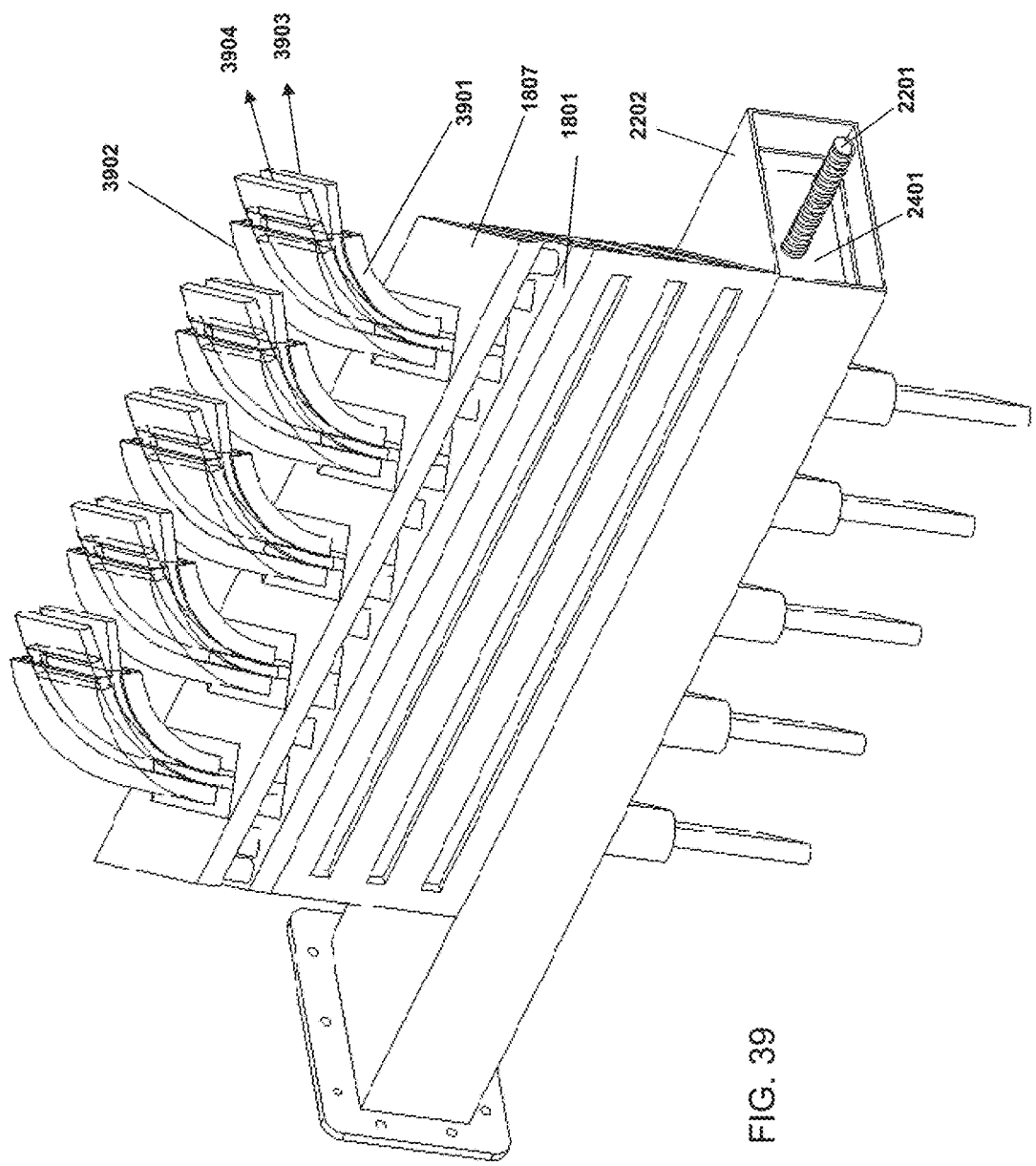
FIG. 39 illustrates an alternative technique for ion deflection wherein the ions are deflected and separated by mass and charge using electrostatic deflection.

In FIG. 39 a different method for deflection of the extracted ions is shown. In the figure a set of electrostatic deflectors is employed that comprises oppositely charged plates 3901 and 3902. As is commonly known, an electrostatic deflector also will result in the separation of ions by mass and ion charge. As a result, the exiting ion beams 3903 and 3904 will contain different ion masses, where the beam 3904 will contain the heavier ions and the beam 3903 will contain the lighter ions. It should be clear to those skilled in the art that any convenient arrangement of slot shapes and extractor shapes could be conceived. The slots could be parallel to the main axis of the system, perpendicular or at an angle such as is shown in the figure.

Figure 40:
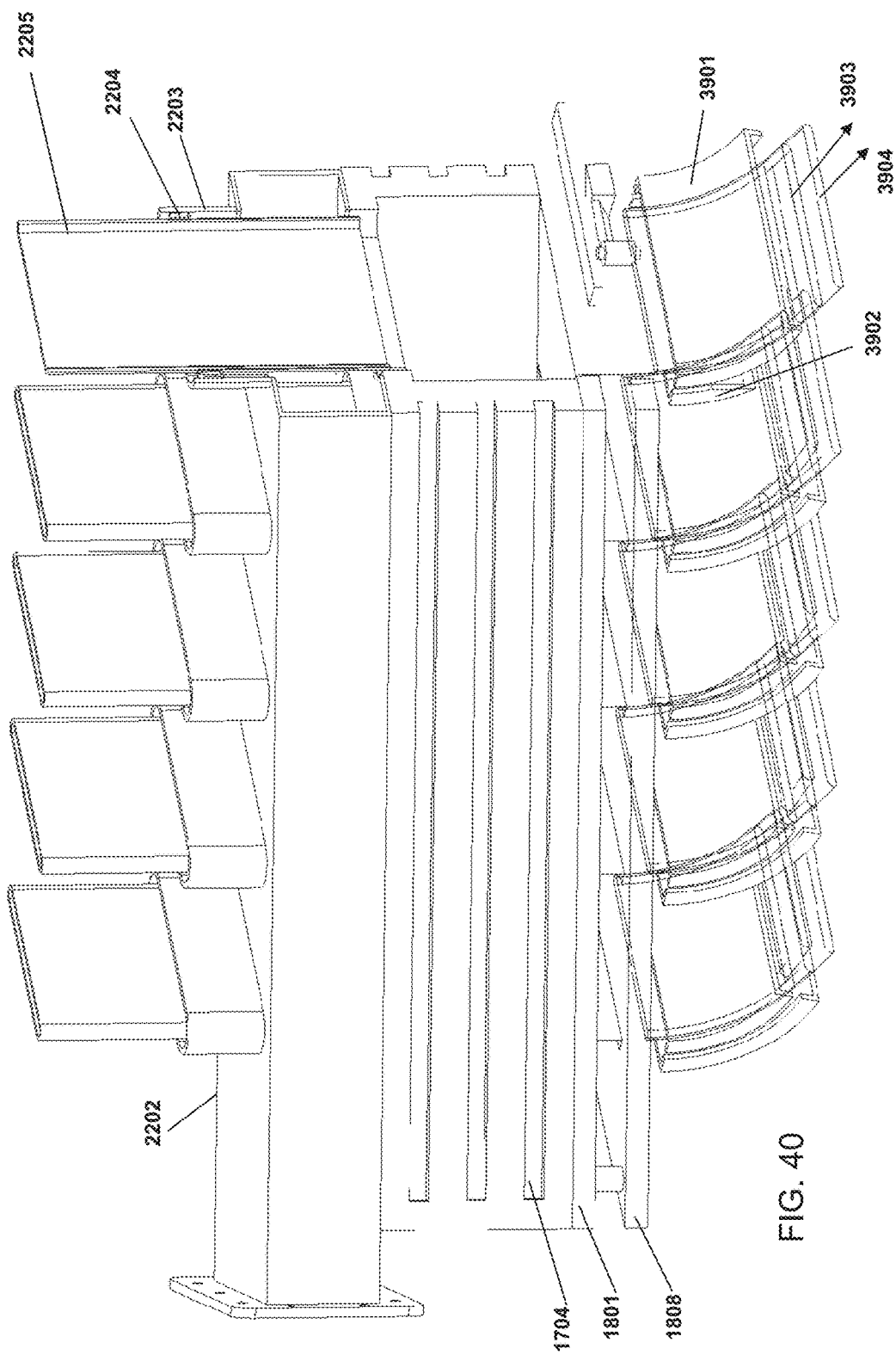
FIG. 40 is a cross sectional view of the deflector of FIG. 39.

FIG. 40 shows a cross sectional view of FIG. 39 wherein the cross section is taken through the injector and extraction slots. One advantage over a slotted extractor such as shown in FIGS. 39 and 40 is that a wider beam can be accommodated as compared to the magnetic separator in FIGS. 37 and 38, resulting potentially larger material transport capabilities. Potential disadvantages of this approach are that rotation of the exiting beams becomes more challenging and the use of electrostatic deflectors is known to cause "space-charge" blow-up of positively charged ion beams. The space-charge blow-up is caused because electrons in the positively charged beam (which are normally present and prevent the beam from expanding under its own ion charges) are deflected to the opposite side of the deflectors 3901 and 3902. As a result, the beam passing through the deflector is no longer space-charge neutral and rapid beam expansion occurs, which makes mass separation more difficult. In practice mass separation through magnetic separation such as illustrated in FIGS. 37 and 38 is more favorable since space-charge problems do not typically occur in magnetic fields.

Figure 41:
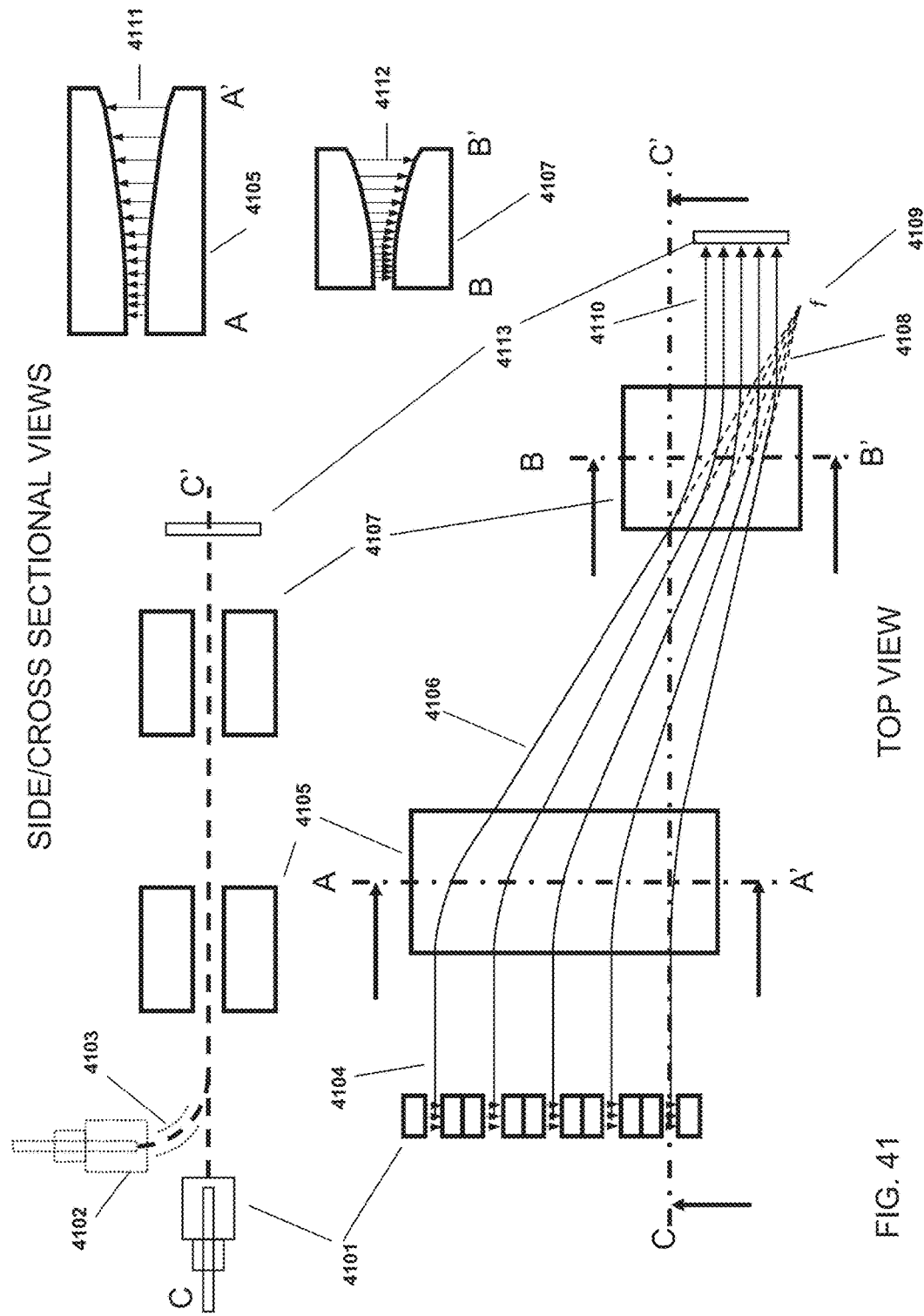
FIG. 41 shows a top view and two side view cross sections of an exemplary ion beam implantation treatment system using two magnetic lenses to create a parallel beam implant field in accordance with one or more embodiments.

FIG. 41 illustrates a top view and three cross sectional views of an ion beam treatment or implantation system in accordance with one or more embodiments comprising an ion source 4101, which can be, e.g., the ion source of FIG. 12, FIG. 22, FIG. 26, FIG. 27, FIG. 37, and FIGS. 41-50, or a variation thereof. As is shown in those figures, ions can be extracted in a single plane (such as, e.g., in FIG. 44 and FIG. 46) or in two or more parallel planes (such as, e.g., in FIG. 26 and FIG. 43) or diagonally (such as, e.g., in FIG. 12, FIG. 22, FIG. 27, and FIG. 37). Furthermore, each individual beam source can be point shaped (such as, e.g., in FIG. 37, or FIG. 46) or ribbon shaped (such as, e.g., in FIG. 12, FIG. 22, FIG. 26, FIG. 27, or FIG. 43). Referring to the top view, a multipoint ion source 4101 emits a series of beams 4104. Alternatively, as is shown in the cross section C-C', the ion source 4102 can be located at an angle to the main path of the ion beams and can be fitted with a deflector 4103 for ion energy and mass separation. This was also shown in FIG. 37, FIG. 38 and FIG. 39. One problem arises in that the extraction holes or slots are generally either spaced by ¼ or ½ of a wavelength of the microwave source (6.1 cm or 3.05 cm, respectively for a 2.45 GHz microwave source), so the spacing of the slots or holes can lead to a non-uniform implant. One solution is to focus the extracted beams closer together. For example, ion beams 4104 subsequently enter an optional first lens magnet 4105, which contains a non-uniform magnetic field 4111 as is shown in the cross section A-A'. Such a lens magnet is described in more detail in U.S. Pat. No. 4,922,106 by Donald W. Berrian et. al. The first magnet 4105 poles are designed to impart a curvature to the ion beams 4104 in such a way as to steer all ion beams 4106 past the first lens magnet 4105 towards a single focal point "f" labeled 4109 in the figure. At some distance past the first magnet, an optional second lens magnet 4107 can be located which can be designed to impart a second curvature to the ion beams 4106, essentially bending the beams 4106 back to a series of parallel beams 4110 and directed towards a substrate 4113. The second lens magnet 4107 has a magnetic field 4112 in the opposite direction as the first lens magnet resulting in the ion beams being bend back to a set of closely spaced beams 4110 that again are parallel to each other. Having parallel ion beams is desirable in applications such as the implantation of semiconductor wafers where channeling of ions through the silicon crystal lattice can result in non-uniform depth of implantation. In other applications where channeling is not much of a concern, such as for implantation into a polycrystalline solar cell for example, the second lens magnet or even both lens magnets could be omitted and the beams 4104 or 4106 could be directed directly onto the substrate 4113. In order to fully cover the substrate 4113 in a uniform way, the ion beams 4104, 4106 or 4110 are sized in such a way that they allow overlap between them so as to create a ribbon beam. Oftentimes the substrate 4113 will be moved mechanically in the vertical direction (in and out of the plane of the "TOP VIEW" drawing) in order to cover the substrate in a uniform fashion.

FIG. 42A through FIG. 42D illustrate several possible arrangements of an extraction plate that can serve as a cover 1110 and slots 1111 for the ion source of FIG. 11. If the slots are circular in nature and placed along a line in the middle of the extraction plate (FIG. 42A), the resulting ion beams will be placed at a distance apart ½ of the wavelength of the microwave frequency, and the lens magnet system from FIG. 41 will compress the ion beams close together forming an approximately ribbon shaped beam. Such a ribbon ion beam can cover a substrate in primarily one dimension entirely. By moving the substrate in the other dimension, a complete uniform treatment of the substrate can be obtained. Alternatively, in FIG. 42B, short linear lines are cut in the extraction plate resulting in a staggered pattern that when compressed by the lens magnet system results in tightly overlapping ribbons. Likewise, the angled slots in FIG. 42C result in a dense packaged ribbon pattern. The perpendicular beams in FIG. 42D also can be packaged much tighter again resulting in a ribbon beam with high intensity, suitable for uniform, high dose implantation.

Figure 43:
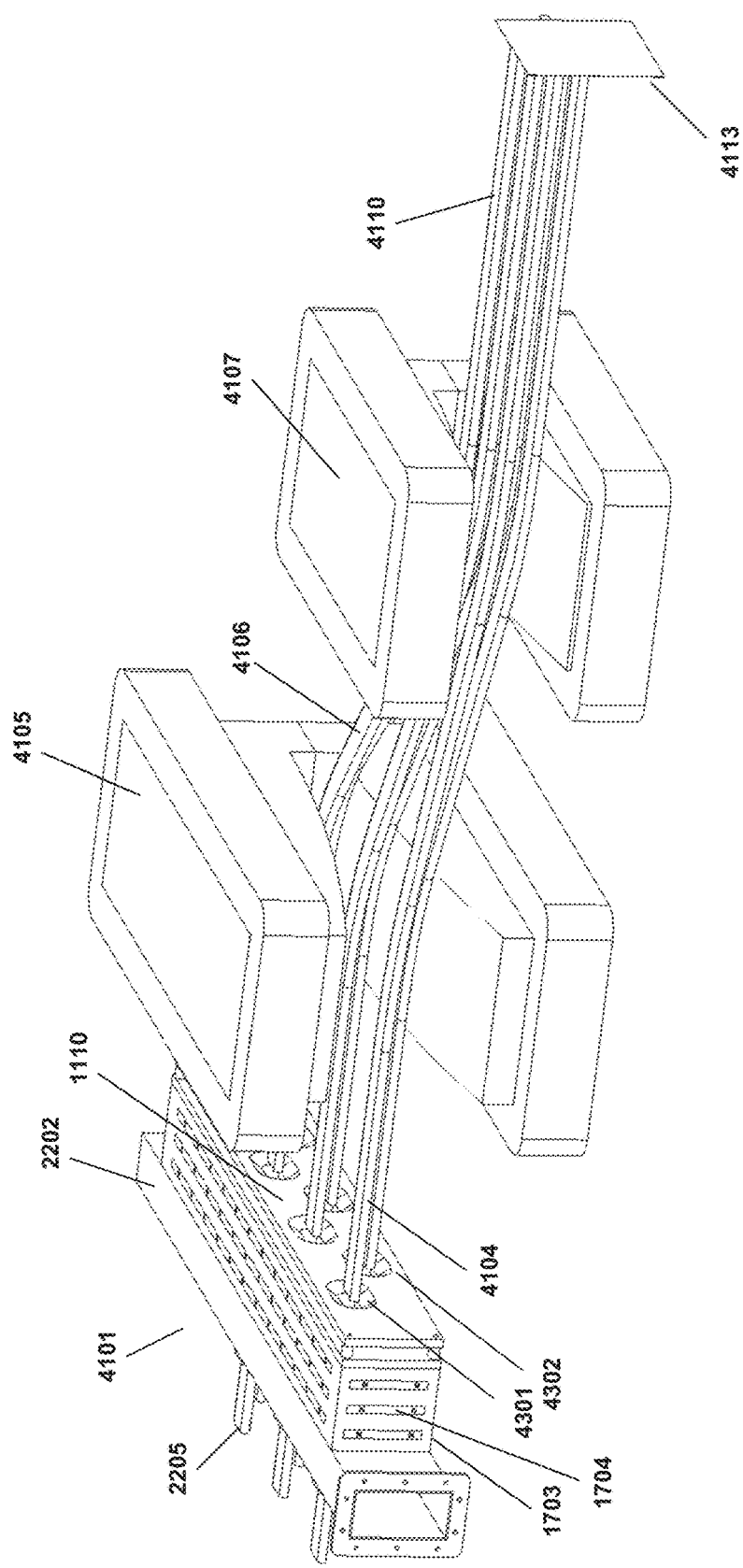
FIG. 43 illustrates a perspective view of the system of FIG. 41.

As mentioned earlier, the extracted beams can be located in two parallel planes. FIG. 43 illustrates one example of such an arrangement. A primary microwave tube 2202 is coupled with multiple secondary plunger devices 2205 in a staggered arrangement (as shown, e.g., in FIG. 26). The secondary plasma chamber 1703 and ECR magnets 1704 were shown in FIG. 17. An extraction plate 1110 with slots 4301 and 4302 on a staggered offset pattern across the extraction plate 1110 matching the secondary plungers 2205 results in a series of staggered ion beams 4104 as shown in FIG. 41. These staggered beams can also be transported to a lens magnet 4105 where they are bent into a convergent beam set 4106 which is then again turned into a parallel set of staggered beams 4110 by a second lens magnet 4107 after which they are directed to a substrate 4113. In such a system a large area (if not all) of the substrate can be covered uniformly at the same time, resulting in very short processing times.

Figure 44:
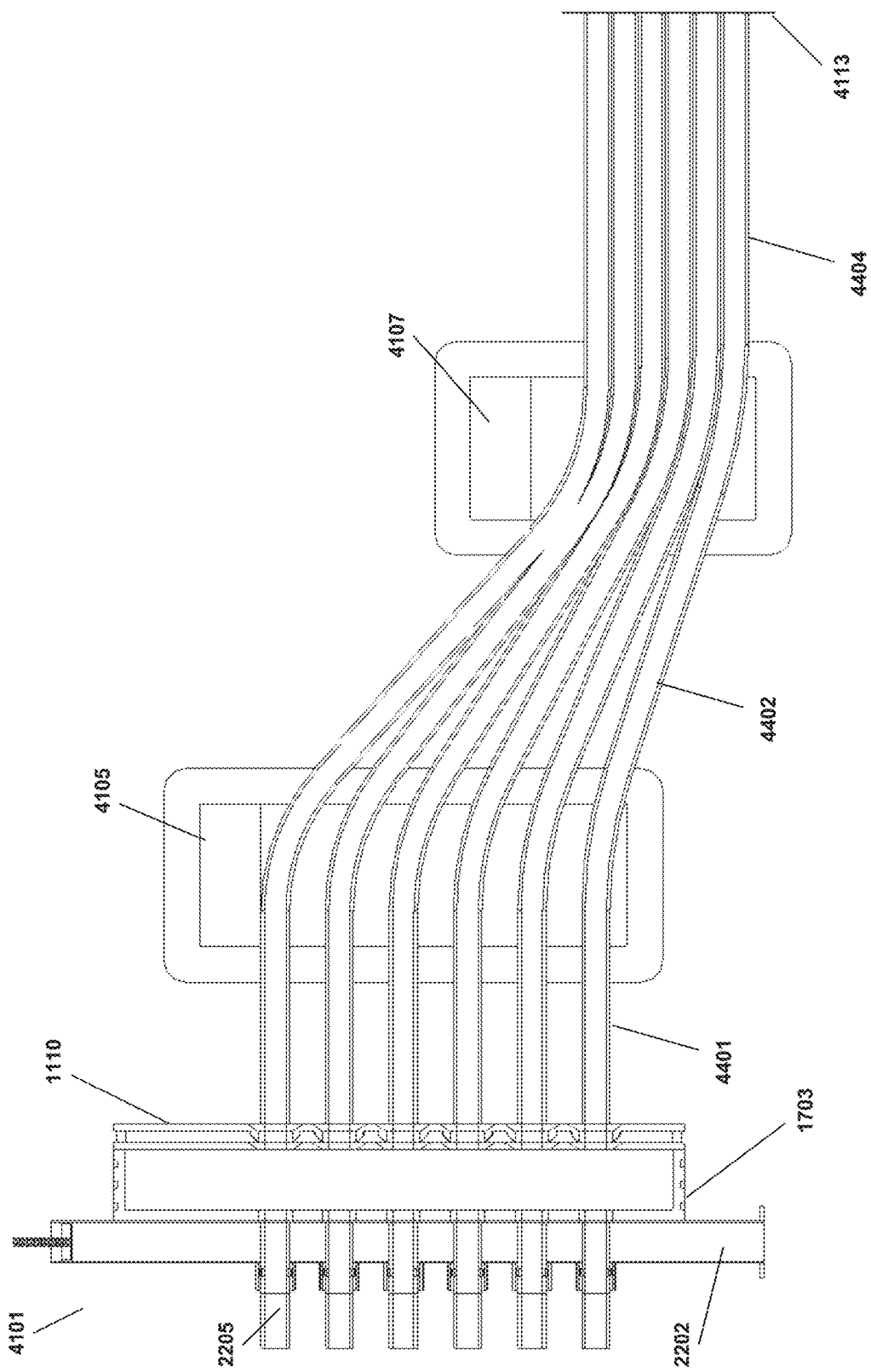
FIG. 44 illustrates another aspect of the system of FIG. 41 using a number of ribbon beams to create a continuous ion beam implant field.

FIG. 44 illustrates a similar arrangement to FIG. 43, but in the present example the ribbon beams are all extracted in the same plane. As before the ion source 4101 is outfitted with a number of secondary plungers 2205 on the microwave guide 2202. The secondary ECR chamber 1703 and extraction cover 1110 result in a number of parallel beams 4401, which can again be deflected by the first magnet 4105 and the second magnet 4107. By getting all ribbons close together a very long, tight and uniform ribbon beam can be constructed.

Figure 45:
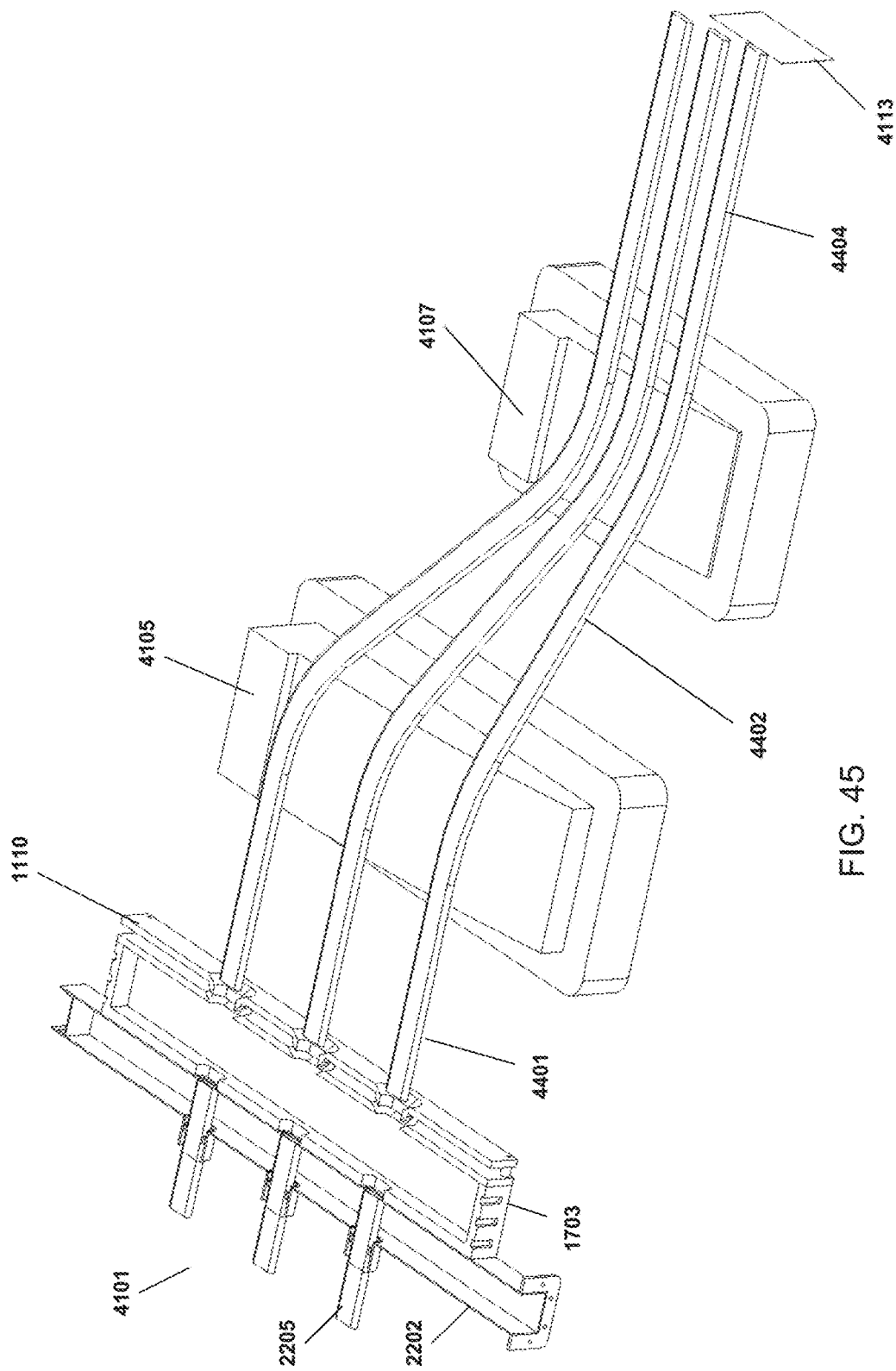
FIG. 45 shows that the individual ribbon beams from FIG. 44 can be located in different planes according to the differing slots in the waveguide.

FIG. 45 shows a cross sectional view of the bottom half of the ion beam system of FIG. 43. As can be seen in the figure, the non-uniformly shaped magnet pole pieces are bending the ion beams one way with the first magnet and the other way with the second magnet. This is not mandatory: since magnets could bend in the same direction depending on the desire for how the full system is laid out, but one particular advantage of this concept is that the two magnets result in an automatic mass separation negating the need for a separate analyzer magnet. This works even if the ion beams are on two different planes as shown (as long as the pole gap does not become too large which would jeopardize uniformity of the magnetic field).

Figure 46:
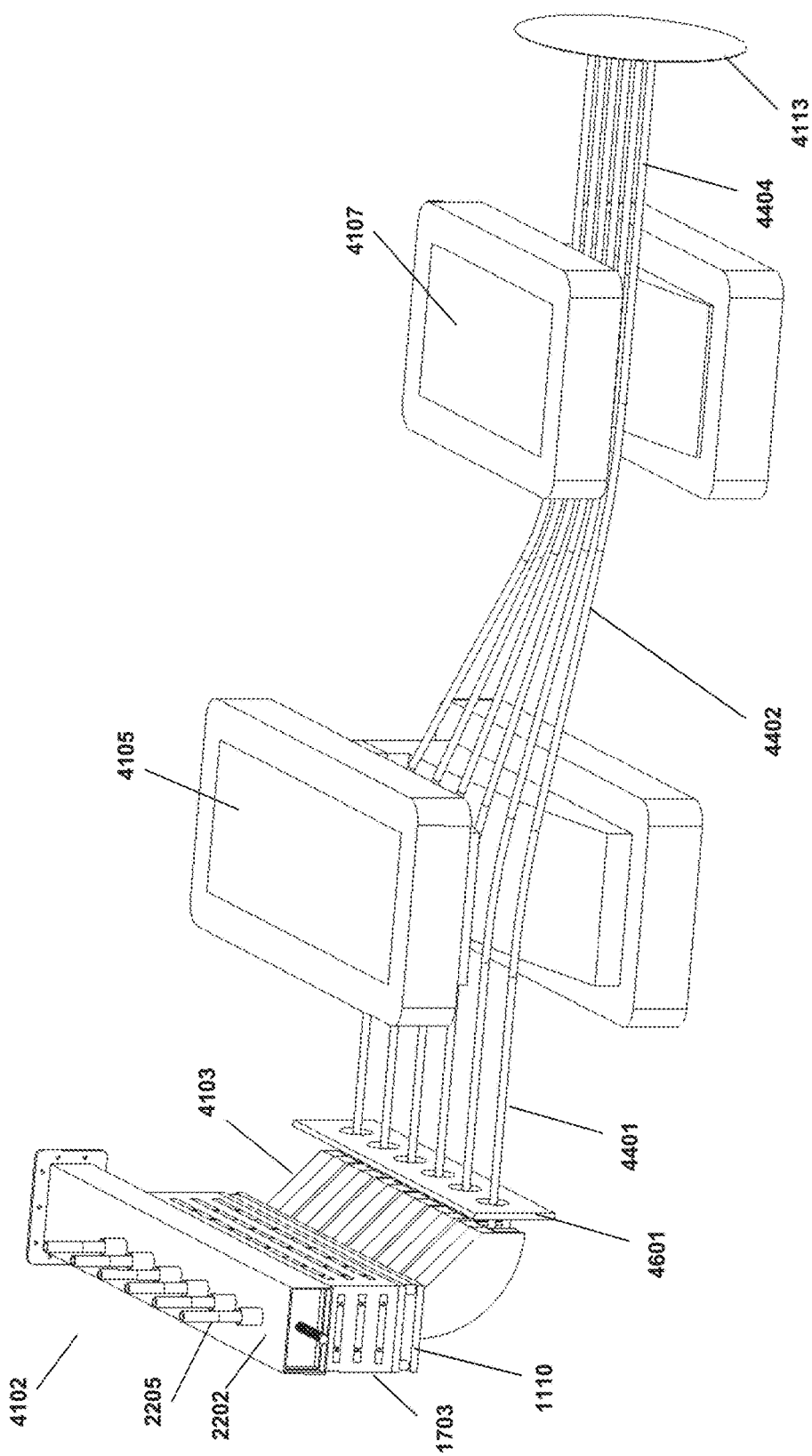
FIG. 46 illustrates a parallel arrangement of ion beams using a combination of analyzer magnets and lens magnets in accordance with one or more embodiments.

FIG. 46 illustrates a different arrangement, where the ion source 4102 is outfitted with a set of magnetic deflectors 4103 and a resolving plate 4601. The resolving plate 4601 is a simple plate outfitted with a series of holes approximately the size of the extracted ion beams. Any ions that are also extracted but that do not have the same mass to energy ratio will traverse the deflectors 4103 at a different path and are thereby not able to pass through the resolving plate 4601. In this case the lens magnets 4105 and 4107 may not function as mass analyzers, although any ions that become neutralized by the vacuum environment will still be directed away from the substrate.

Figure 47:
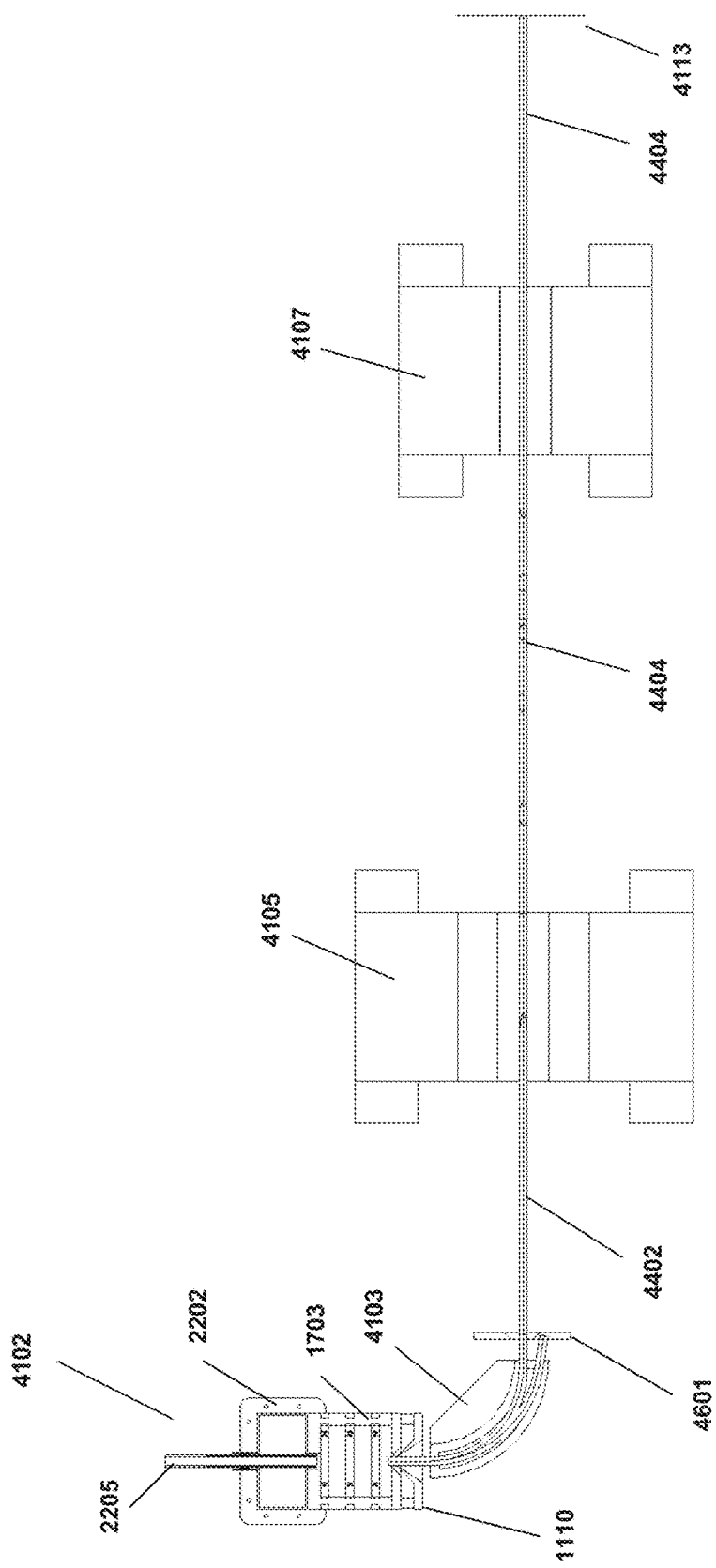
FIG. 47 shows a vertical cross section view of the ion beam system of FIG. 46.

FIG. 47 illustrates a cross sectional view of FIG. 46 in a vertical plane through the source 4102 and magnets 4105 and 4107.

Figure 48:
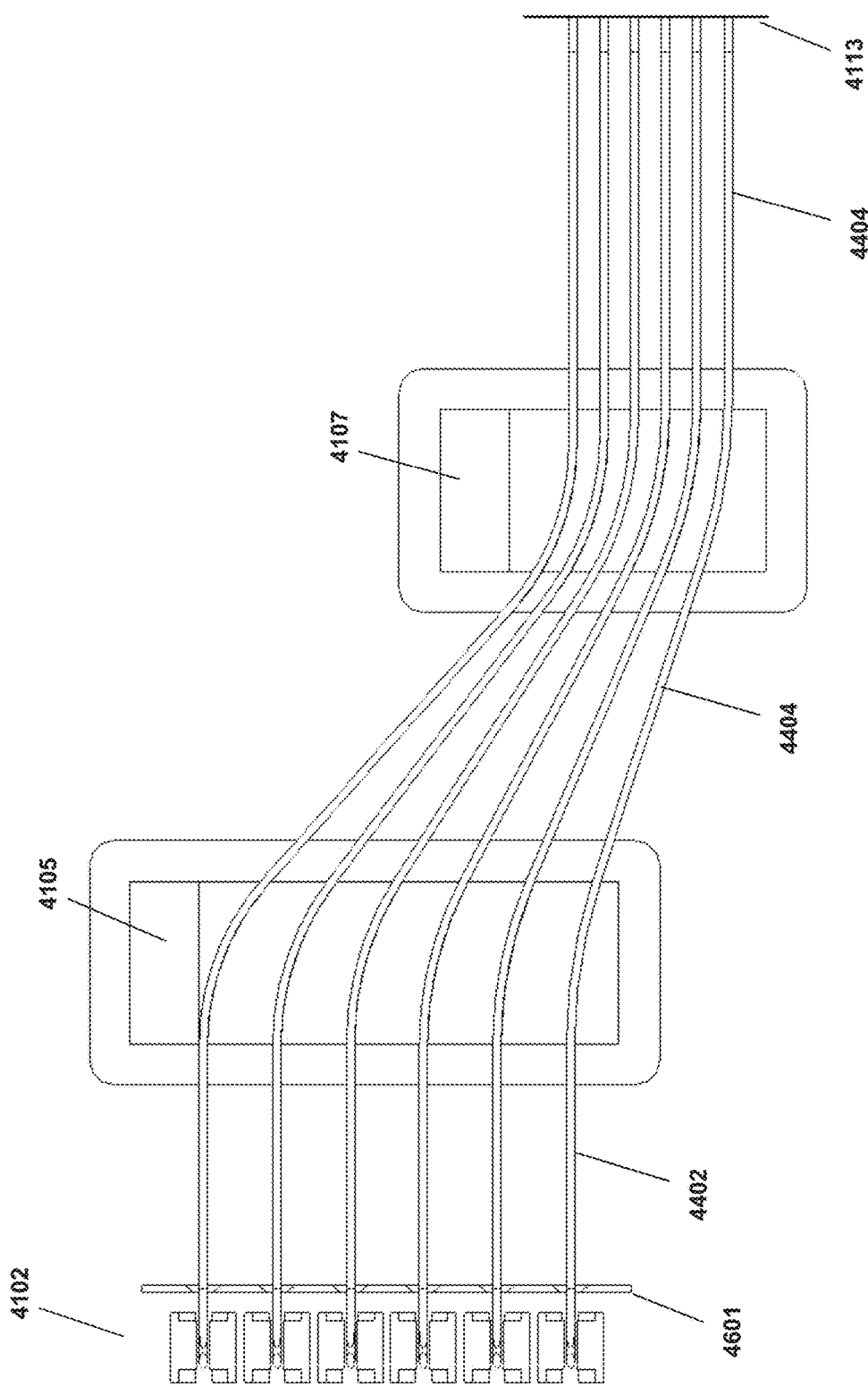
FIG. 48 shows a horizontal cross section of the ion beam system of FIG. 46.

FIG. 48 illustrates a cross sectional view of FIG. 46 in a horizontal plane through the extraction plate 4601 and lens magnets 4105 and 4107.

Figure 49:
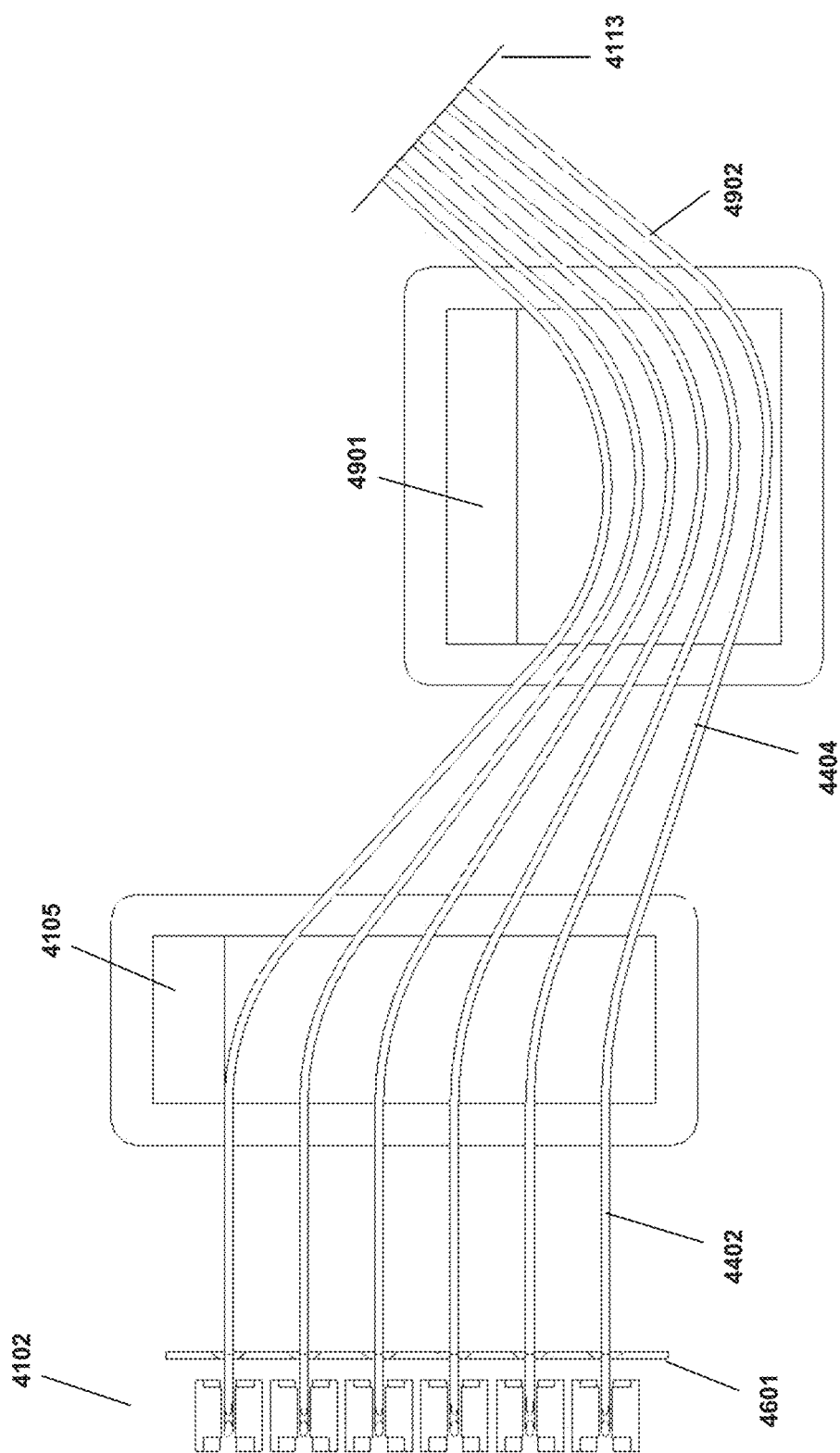
FIG. 49 illustrates how the lens magnet system can be used to both create a series of parallel ion beams as well as separate ions by mass and energy ratio in accordance with one or more embodiments.

FIG. 49 illustrates the same cross sectional view of FIG. 48 but the second lens magnet 4901 has been enlarged to overcorrect the ion beams 4902 in such a fashion that the second lens magnet partially acts like an analyzer magnet but also brings the beams back over to the center of the system, which can be desirable for the system layout. Such a larger second lens magnet 4902 will more easily resolve ions that are close together in mass to energy ratio.

Figure 50:
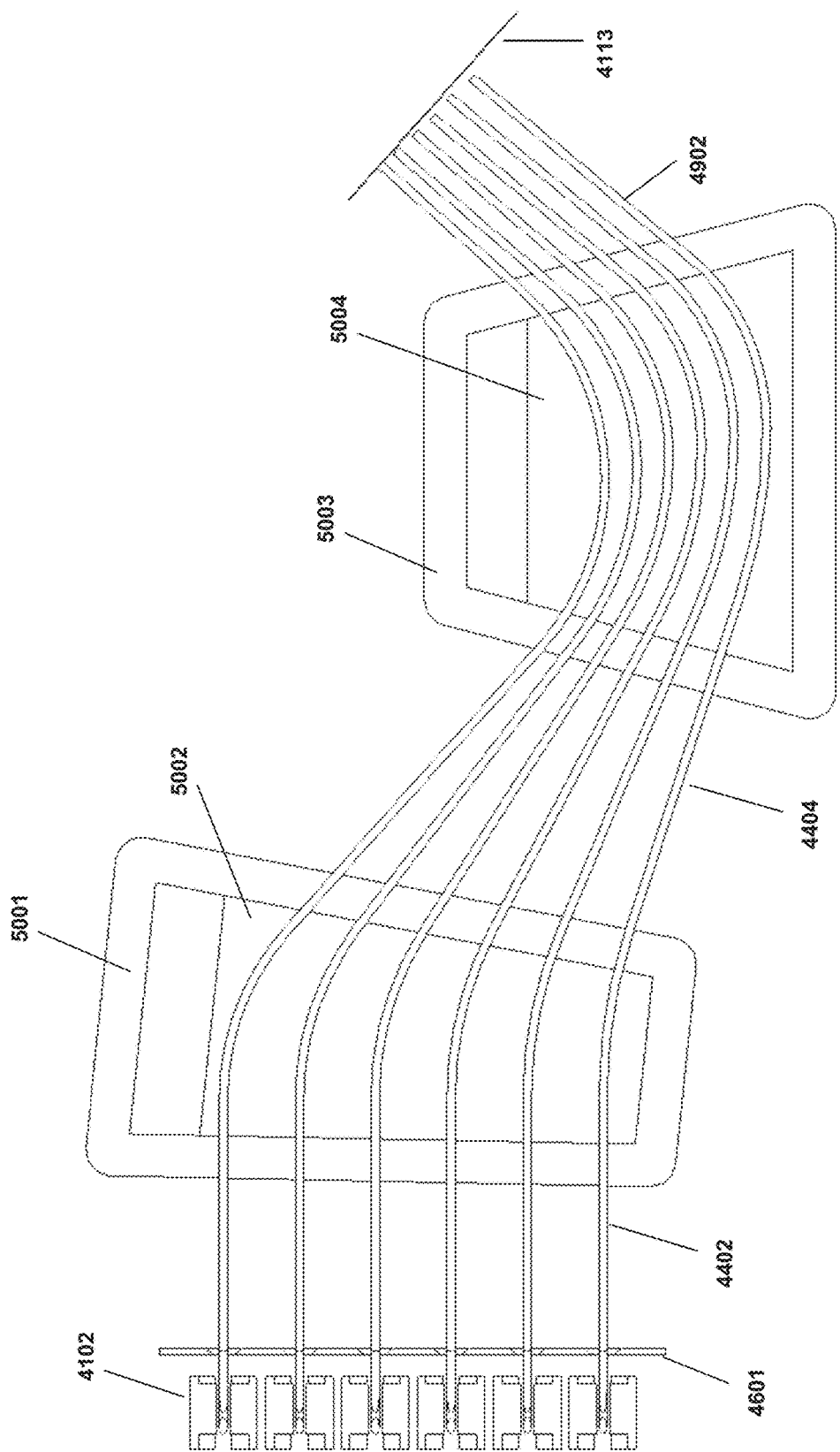
FIG. 50 illustrates a different embodiment of the system of FIG. 49 using wedge shaped lens magnets.

FIG. 50 illustrates the same cross sectional view of FIGS. 48 and 49, but the figure illustrates the use of lens magnets constructed in a wedge shaped cross section.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combina- tions of functions or structural elements, it should be understood that those functions and elements may be combined in other ways according to the present invention to accomplish the same or different objectives. In particular, acts, elements, and features discussed in connection with one embodiment are not intended to be excluded from similar or other roles in other embodiments. Accordingly, the foregoing description and attached drawings are by way of example only, and are not intended to be limiting.

The invention claimed is:

1. An ion beam treatment or implantation system, comprising:
an ion source emitting a plurality of parallel ion beams having a given spacing; and
a first lens magnet having a non-uniform magnetic field receiving the plurality of ion beams from the ion source and focusing the plurality of ion beams toward a common point, wherein the plurality of parallel ion beams are on multiple parallel planes, and wherein the beams on each plane have a staggered offset arrangement with respect to the beams on an adjacent plane.

2. The system of claim 1, wherein the first lens magnet includes poles configured to impart a curvature to the plurality of parallel ion beams to steer the ion beams toward the common point.

3. The system of claim 1, wherein each of the plurality of parallel ion beams is point-shaped or ribbon-shaped.

4. The system of claim 1, further comprising a deflector coupled to the ion source for deflecting the plurality of parallel ion beams for ion energy and mass separation.

5. The system of claim 1, wherein the ion source includes a plurality of ion extractor slots for forming the plurality of parallel ion beams, or wherein the ion source includes a plurality of magnetic deflectors and a resolving plate having a plurality of holes each associated with one of the magnetic deflectors, said resolving plate configured to only pass through ions having a select mass to energy ratio.

6. The system of claim 1, wherein the ion source comprises:
a microwave source;
a waveguide conduit having a plurality of openings therein, said waveguide conduit being coupled to the microwave source for transmitting microwaves from the microwave source through the plurality of openings; and
a plasma chamber in communication with the waveguide conduit through the plurality of openings, said plasma chamber receiving through said plurality of openings microwaves from the waveguide conduit, said plasma chamber including a plurality of magnets disposed in an outer wall of the plasma chamber for forming a magnetic field in the plasma chamber, said plasma chamber further comprising a charged cover at a side of the chamber opposite the side containing the plurality of openings, said cover including extraction holes through which the plurality of ion beams are extracted.

7. The system of claim 6, further comprising a plunger moveably mounted in the waveguide conduit allowing the waveguide conduit to be tuned to generally optimize the power of the microwaves exiting the plurality of openings.

8. The system of claim 7, further comprising secondary openings formed in the waveguide conduit opposite said plurality of openings and a secondary set of plungers fitted in said secondary slots to amplify radiation emitted through said plurality of openings.

9. The system of claim 1, further comprising a second lens magnet having a non-uniform magnetic field receiving the ion beams focused by the first lens magnet and redirecting the ion beams such that they have a parallel arrangement having a closer spacing than said given spacing in a direction toward a target substrate.

10. The system of claim 9, wherein the second lens magnet is configured to overcorrect the ion beams ion focused by the first lens magnet and thereby act as an analyzer magnet for resolving ions that have a similar mass to energy ratio.

11. The system of claim 9, wherein the first lens magnet and/or the second lens magnet is wedge shaped in cross-section.

12. The system of claim 1, further comprising a mechanism for moving the ion beam source or the substrate relative to one another to increase ion coverage of the substrate.

13. An ion beam treatment or implantation method, comprising:
emitting a plurality of parallel ion beams having a given spacing, wherein the plurality of parallel ion beams are on multiple parallel planes, and wherein the beams on each plane have a staggered offset arrangement with respect to the beams on an adjacent plane; and
receiving and focusing the plurality of ion beams toward a common point using a first lens magnet having a non-uniform magnetic field.

14. The method of claim 13, wherein each of the plurality of parallel ion beams is point-shaped or ribbon-shaped.

15. The method of claim 13, further comprising deflecting the plurality of parallel ion beams for ion energy and mass separation.

16. The method of claim 13, further comprising receiving the ion beams focused by the first lens magnet and redirecting the ion beams using a second lens magnet having a non-uniform magnetic field such that the ion beams have a parallel arrangement having a closer spacing than said given spacing in a direction toward a target substrate.

17. An ion beam treatment or implantation system, comprising:
an ion source emitting a plurality of parallel ion beams having a given spacing, wherein the ion source comprises:
a microwave source;
a waveguide conduit having a plurality of openings therein, said waveguide conduit being coupled to the microwave source for transmitting microwaves from the microwave source through the plurality of openings; and
a plasma chamber in communication with the waveguide conduit through the plurality of openings, said plasma chamber receiving through said plurality of openings microwaves from the waveguide conduit, said plasma chamber including a plurality of magnets disposed in an outer wall of the plasma chamber for forming a magnetic field in the plasma chamber, said plasma chamber further comprising a charged cover at a side of the chamber opposite the side containing the plurality of openings, said cover including extraction holes through which the plurality of ion beams are extracted; and
a first lens magnet having a non-uniform magnetic field receiving the plurality of ion beams from the ion source and focusing the plurality of ion beams toward a common point.

18. The system of claim 17, wherein the first lens magnet includes poles configured to impart a curvature to the plurality of parallel ion beams to steer the ion beams toward the common point.

19. The system of claim 17, wherein each of the plurality of parallel ion beams is point-shaped or ribbon-shaped.

20. The system of claim 17, wherein the plurality of parallel ion beams are on a single plane.

21. The system of claim 17, wherein the plurality of parallel ion beams are on multiple parallel planes.

22. The system of claim 17, wherein the plurality of parallel beams have a staggered offset arrangement.

23. The system of claim 17, further comprising a deflector coupled to the ion source for deflecting the plurality of parallel ion beams for ion energy and mass separation.

24. The system of claim 17, wherein the ion source includes a plurality of ion extractor slots for forming the plurality of parallel ion beams or wherein the ion source includes a plurality of magnetic deflectors and a resolving plate having a plurality of holes each associated with one of the magnetic deflectors, said resolving plate configured to only pass through ions having a select mass to energy ratio.

25. The system of claim 17, further comprising a plunger moveably mounted in the waveguide conduit allowing the waveguide conduit to be tuned to generally optimize the power of the microwaves exiting the plurality of openings.

26. The system of claim 25, further comprising secondary openings formed in the waveguide conduit opposite said plurality of openings and a secondary set of plungers fitted in said secondary slots to amplify radiation emitted through said plurality of openings.

27. The system of claim 17, further comprising a second lens magnet having a non-uniform magnetic field receiving the ion beams focused by the first lens magnet and redirecting the ion beams such that they have a parallel arrangement having a closer spacing than said given spacing in a direction toward a target substrate.

28. The system of claim 27, wherein the second lens magnet is configured to overcorrect the ion beams ion focused by the first lens magnet and thereby act as an analyzer magnet for resolving ions that have a similar mass to energy ratio.

29. The system of claim 27, wherein the first lens magnet and/or the second lens magnet is wedge shaped in cross-section.

30. The system of claim 17, further comprising a mechanism for moving the ion beam source or the substrate relative to one another to increase ion coverage of the substrate.

31. An ion beam treatment or implantation system, comprising:
an ion source emitting a plurality of parallel ion beams having a given spacing;
a first lens magnet having a non-uniform magnetic field receiving the plurality of ion beams from the ion source and focusing the plurality of ion beams toward a common point; and
a second lens magnet having a non-uniform magnetic field receiving the ion beams focused by the first lens magnet and redirecting the ion beams such that they have a parallel arrangement having a closer spacing than said given spacing in a direction toward a target substrate.

32. The system of claim 31, wherein the first lens magnet includes poles configured to impart a curvature to the plurality of parallel ion beams to steer the ion beams toward the common point.

33. The system of claim 31, wherein each of the plurality of parallel ion beams is point-shaped or ribbon-shaped.

34. The system of claim 31, wherein the plurality of parallel ion beams are on a single plane.

35. The system of claim 31, wherein the plurality of parallel ion beams are on multiple parallel planes.

36. The system of claim 31, wherein the plurality of parallel beams have a staggered offset arrangement.

37. The system of claim 31, further comprising a deflector coupled to the ion source for deflecting the plurality of parallel ion beams for ion energy and mass separation.

38. The system of claim 31, wherein the ion source includes a plurality of ion extractor slots for forming the plurality of parallel ion beams or wherein the ion source includes a plurality of magnetic deflectors and a resolving plate having a plurality of holes each associated with one of the magnetic deflectors, said resolving plate configured to only pass through ions having a select mass to energy ratio.

39. The system of claim 31, wherein the ion source comprises:
a microwave source;
a waveguide conduit having a plurality of openings therein, said waveguide conduit being coupled to the microwave source for transmitting microwaves from the microwave source through the plurality of openings; and
a plasma chamber in communication with the waveguide conduit through the plurality of openings, said plasma chamber receiving through said plurality of openings microwaves from the waveguide conduit, said plasma chamber including a plurality of magnets disposed in an outer wall of the plasma chamber for forming a magnetic field in the plasma chamber, said plasma chamber further comprising a charged cover at a side of the chamber opposite the side containing the plurality of openings, said cover including extraction holes through which the plurality of ion beams are extracted.

40. The system of claim 39, further comprising a plunger moveably mounted in the waveguide conduit allowing the waveguide conduit to be tuned to generally optimize the power of the microwaves exiting the plurality of openings.

41. The system of claim 39, further comprising secondary openings formed in the waveguide conduit opposite said plurality of openings and a secondary set of plungers fitted in said secondary slots to amplify radiation emitted through said plurality of openings.

42. The system of claim 31, wherein the second lens magnet is configured to overcorrect the ion beams ion focused by the first lens magnet and thereby act as an analyzer magnet for resolving ions that have a similar mass to energy ratio.

43. The system of claim 31, wherein the first lens magnet and/or the second lens magnet is wedge shaped in cross-section.

44. The system of claim 31, further comprising a mechanism for moving the ion beam source or the substrate relative to one another to increase ion coverage of the substrate.

45. An ion beam treatment or implantation method, comprising:
emitting a plurality of parallel ion beams having a given spacing;
receiving and focusing the plurality of ion beams toward a common point using a first lens magnet having a non-uniform magnetic field; and
receiving the ion beams focused by the first lens magnet and redirecting the ion beams using a second lens magnet having a non-uniform magnetic field such that the ion beams have a parallel arrangement having a closer spacing than said given spacing in a direction toward a target substrate.

46. The method of claim 45, wherein the plurality of parallel beams have a staggered offset arrangement.

47. The method of claim 45, wherein the plurality of parallel ion beams are on a single plane.

48. The method of claim 45, wherein the plurality of parallel ion beams are on multiple parallel planes.

49. The method of claim 46, wherein each of the plurality of parallel ion beams is point-shaped or ribbon-shaped.

50. The method of claim 45, further comprising deflecting the plurality of parallel ion beams for ion energy and mass separation.

* * * * *